(12) United States Patent
Wang et al.

(10) Patent No.: US 9,537,010 B2
(45) Date of Patent: Jan. 3, 2017

(54) SEMICONDUCTOR DEVICE STRUCTURE AND METHOD FOR FORMING THE SAME

(71) Applicant: Taiwan Semiconductor Manufacturing Co., Ltd, Hsin-Chu (TW)

(72) Inventors: Tsan-Chun Wang, Hsinchu (TW); Ziwei Fang, Baoshan Township, Hsinchu County (TW); Chien-Tai Chan, Hsinchu (TW); Da-Wen Lin, Hsinchu (TW); Huicheng Chang, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/613,663

(22) Filed: Feb. 4, 2015

(65) Prior Publication Data
US 2016/0225906 A1    Aug. 4, 2016

(51) Int. Cl.
| | |
|---|---|
| *H01L 21/336* | (2006.01) |
| *H01L 21/8234* | (2006.01) |
| *H01L 29/78* | (2006.01) |
| *H01L 29/66* | (2006.01) |
| *H01L 21/266* | (2006.01) |
| *H01L 21/324* | (2006.01) |

(52) U.S. Cl.
CPC ......... *H01L 29/7856* (2013.01); *H01L 21/266* (2013.01); *H01L 21/324* (2013.01); *H01L 29/66795* (2013.01)

(58) Field of Classification Search
CPC  H01L 27/0924; H01L 29/783; H01L 27/1104; H01L 29/435; H01L 51/0508; H01L 21/3141; H01L 21/3105; H01L 21/31683; H01L 21/67075; H01L 21/67069; H01L 21/762; H01L 21/28158; H01L 21/467; H01L 21/475; H01L 21/02579; H01L 21/02576; H01L 21/02255
USPC  438/197, 270, 104, 692, 680, 700; 257/288, 350, 396, E21.006, E21.014, 257/E21.023, E21.051, E21.077, E21.126, 257/E21.127, E21.147, E21.17, E21.231, 257/E21.247, E21.248, E21.253, E21.267, 257/E21.304, E21.229, E21.435
See application file for complete search history.

(56) References Cited

U.S. PATENT DOCUMENTS

| | | | | |
|---|---|---|---|---|
| 6,720,231 B2 * | 4/2004 | Fried | ............... | H01L 27/0802 438/382 |
| 7,064,413 B2 * | 6/2006 | Fried | ............... | H01L 27/0802 257/536 |
| 7,811,890 B2 * | 10/2010 | Hsu | ............... | H01L 27/115 438/270 |
| 8,264,032 B2 * | 9/2012 | Yeh | ............... | H01L 29/66795 257/327 |

(Continued)

*Primary Examiner* — David Nhu
(74) *Attorney, Agent, or Firm* — Birch, Stewart, Kolasch & Birch, LLP

(57) ABSTRACT

A semiconductor device structure is provided. The semiconductor device structure includes a substrate having a doped region in an upper portion of the substrate. The doped region is doped with first dopants of a first conduction type. The semiconductor device structure includes one fin structure over the substrate. A first dopant concentration of the doped region exposed by the fin structure is greater than a second dopant concentration of the doped region covered by the fin structure. The semiconductor device structure includes an isolation layer over the substrate and at two opposite sides of the fin structure. The semiconductor device structure includes a gate over the isolation layer and the fin structure.

18 Claims, 46 Drawing Sheets

(56) References Cited

U.S. PATENT DOCUMENTS

| | | | |
|---|---|---|---|
| 8,497,171 B1 * | 7/2013 | Wu | H01L 21/82382 |
| | | | 438/218 |
| 9,076,869 B1 * | 7/2015 | Hu | H01L 29/7848 |
| 2013/0161689 A1 | 6/2013 | Huo et al. | |

* cited by examiner

SEMICONDUCTOR DEVICE STRUCTURE AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
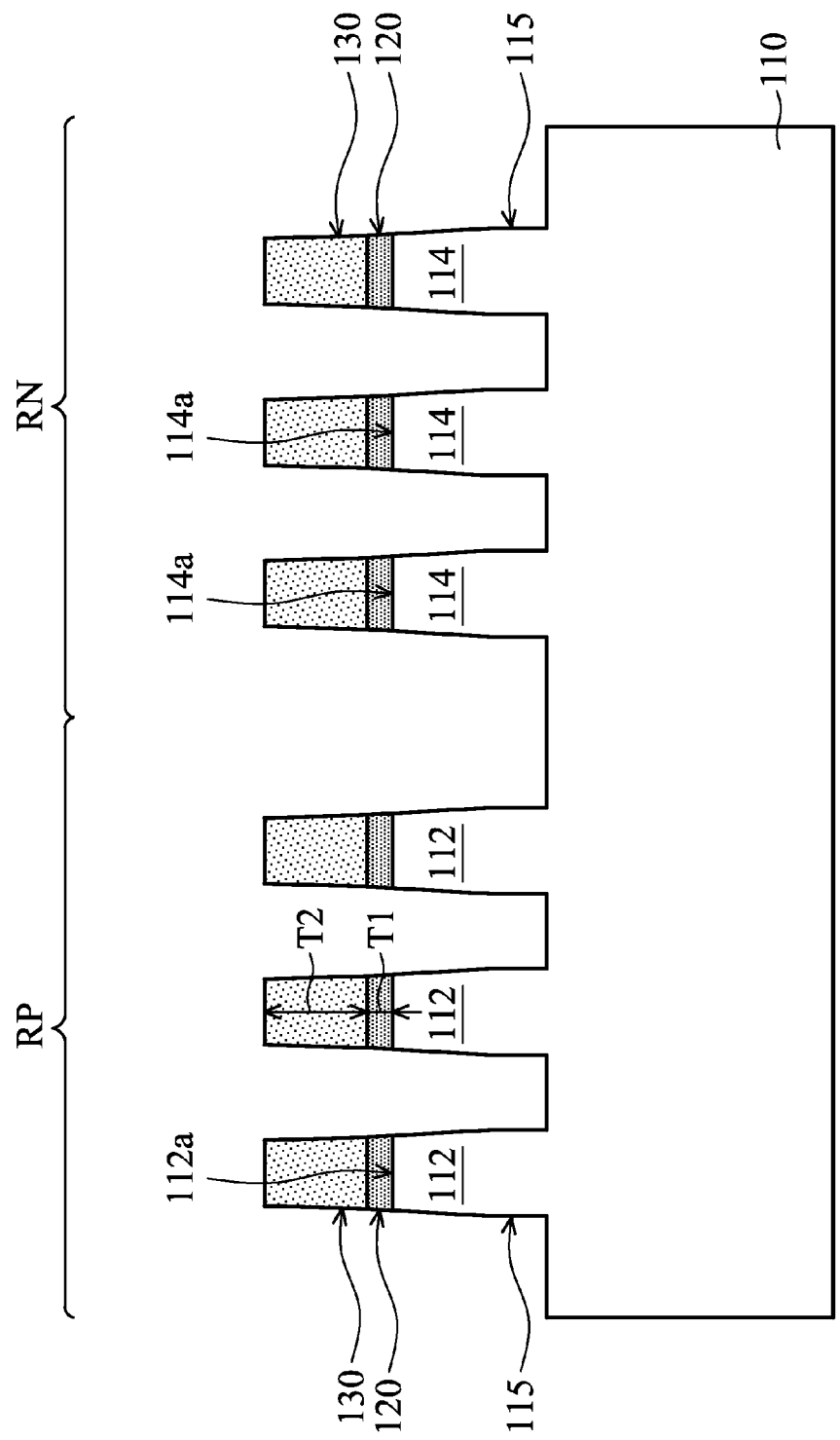
FIGS. 1A-1N are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Figure 1B:
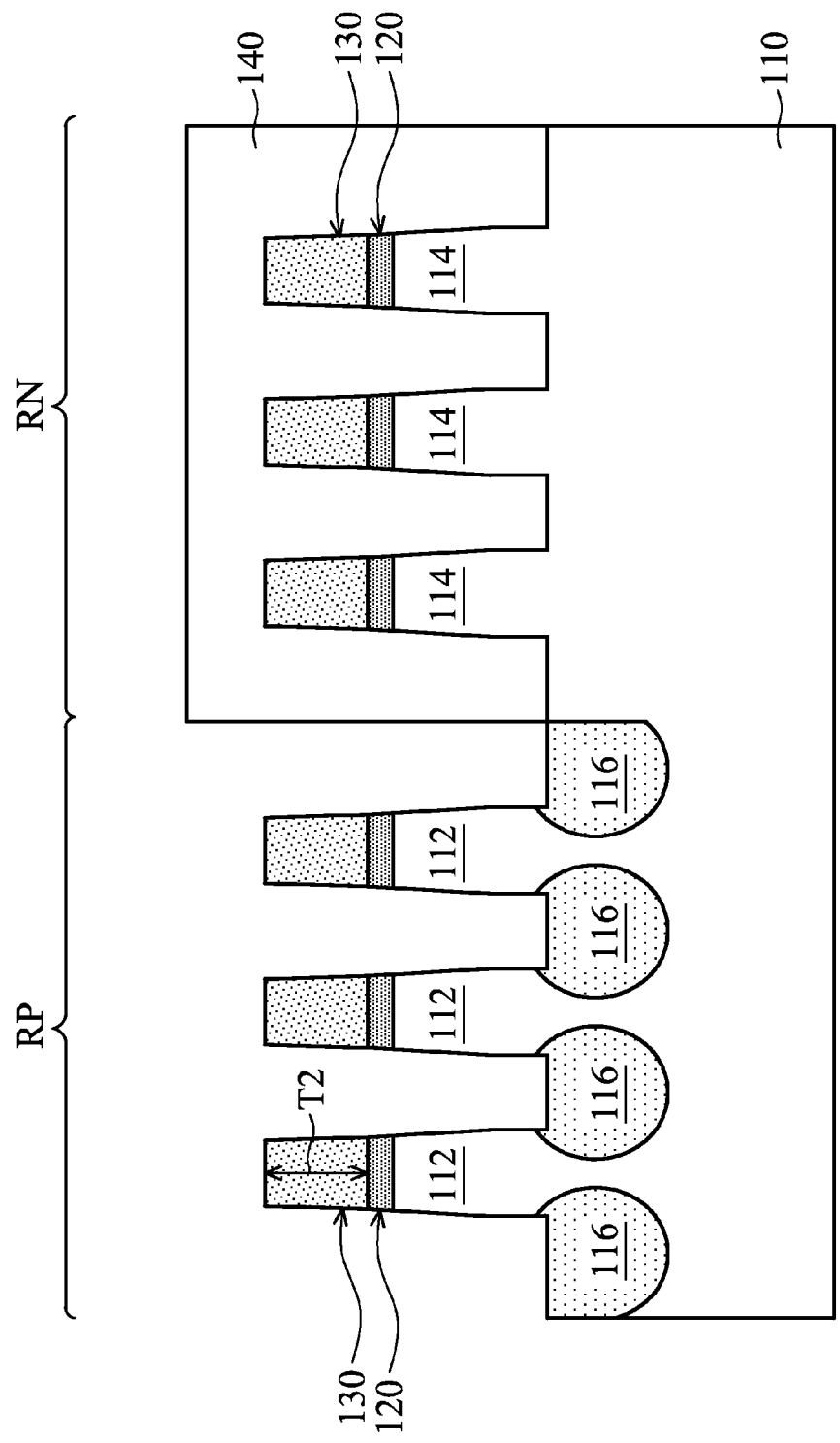
Figure 1C:
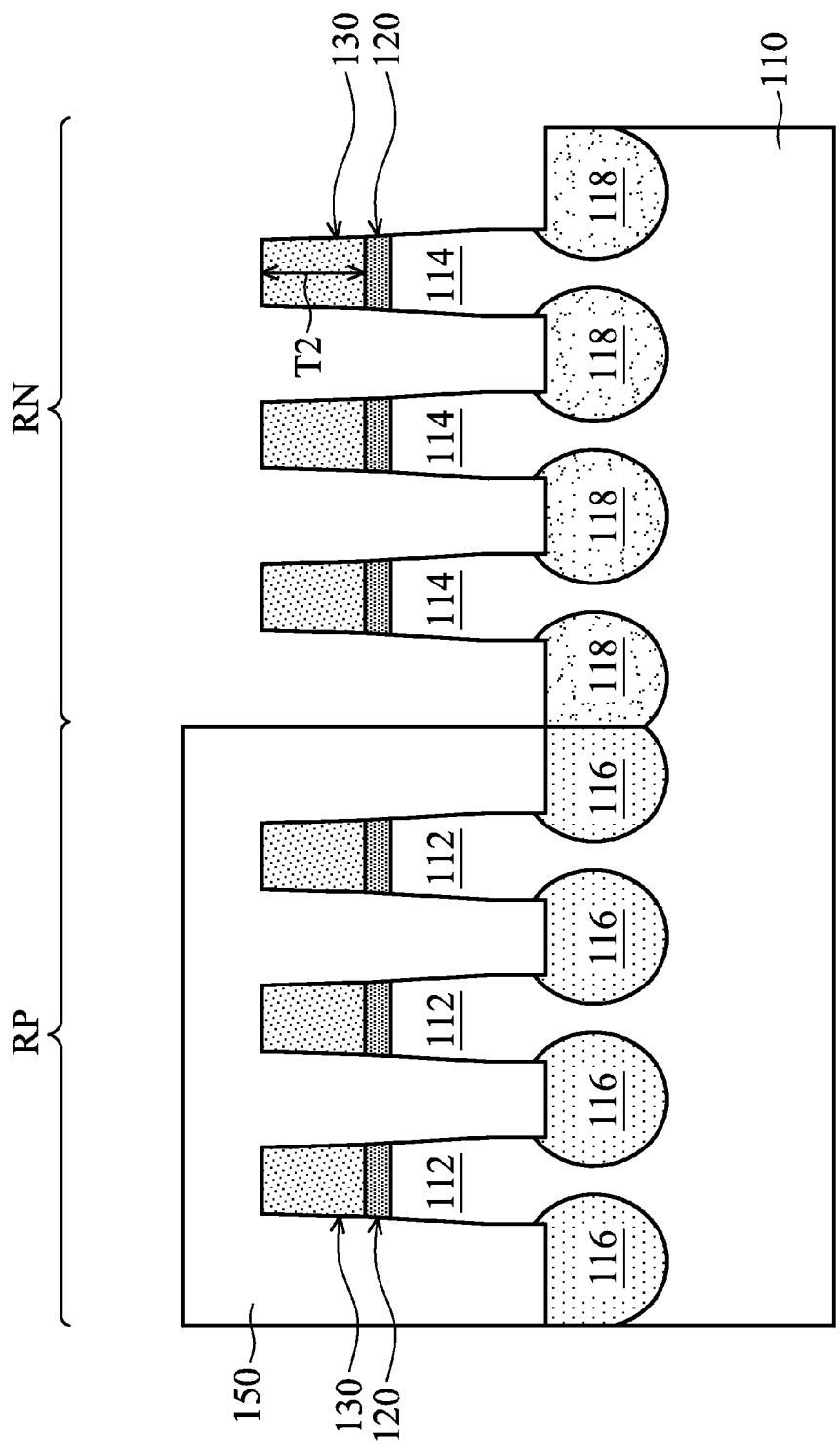
Figure 1D:
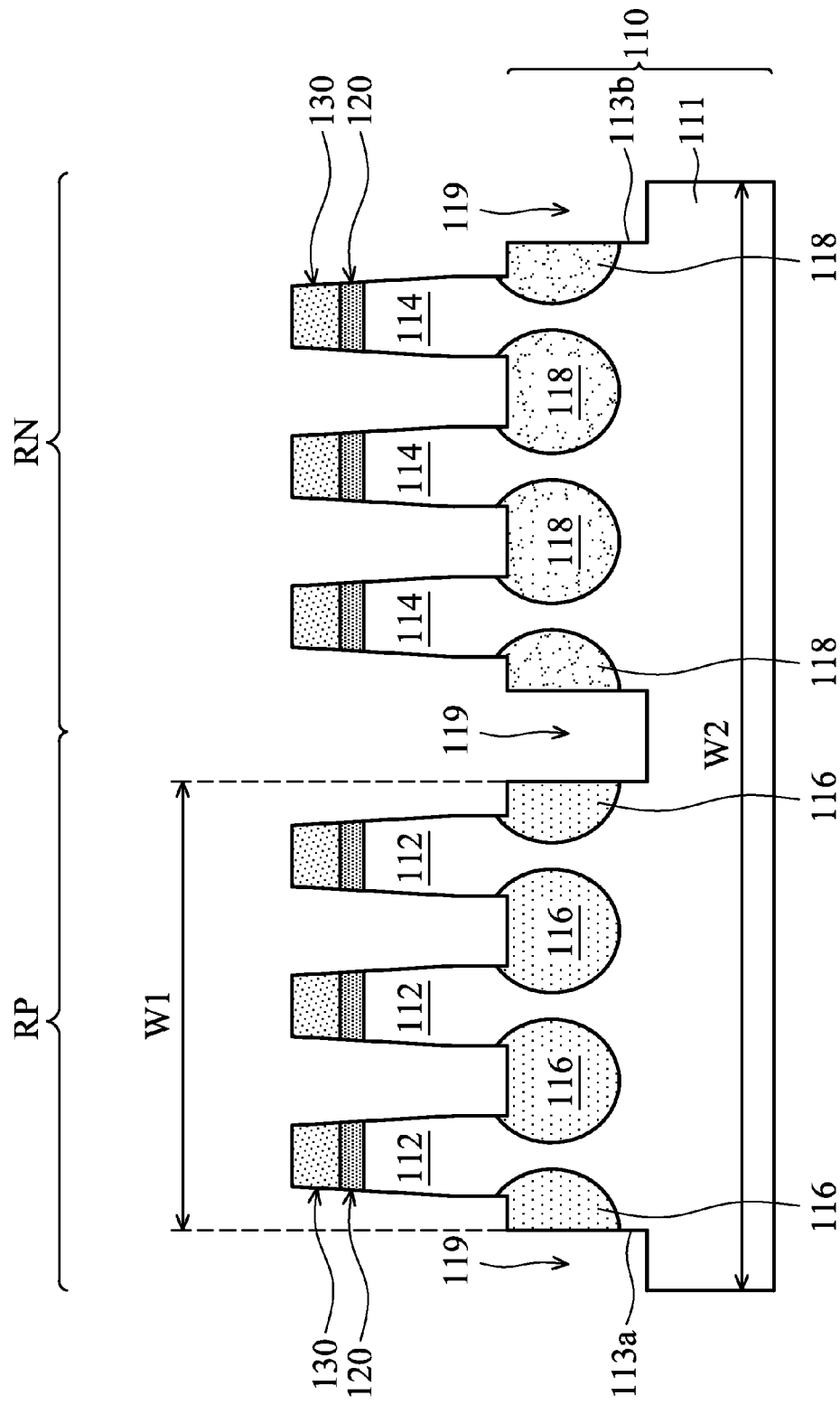
Figure 1E:
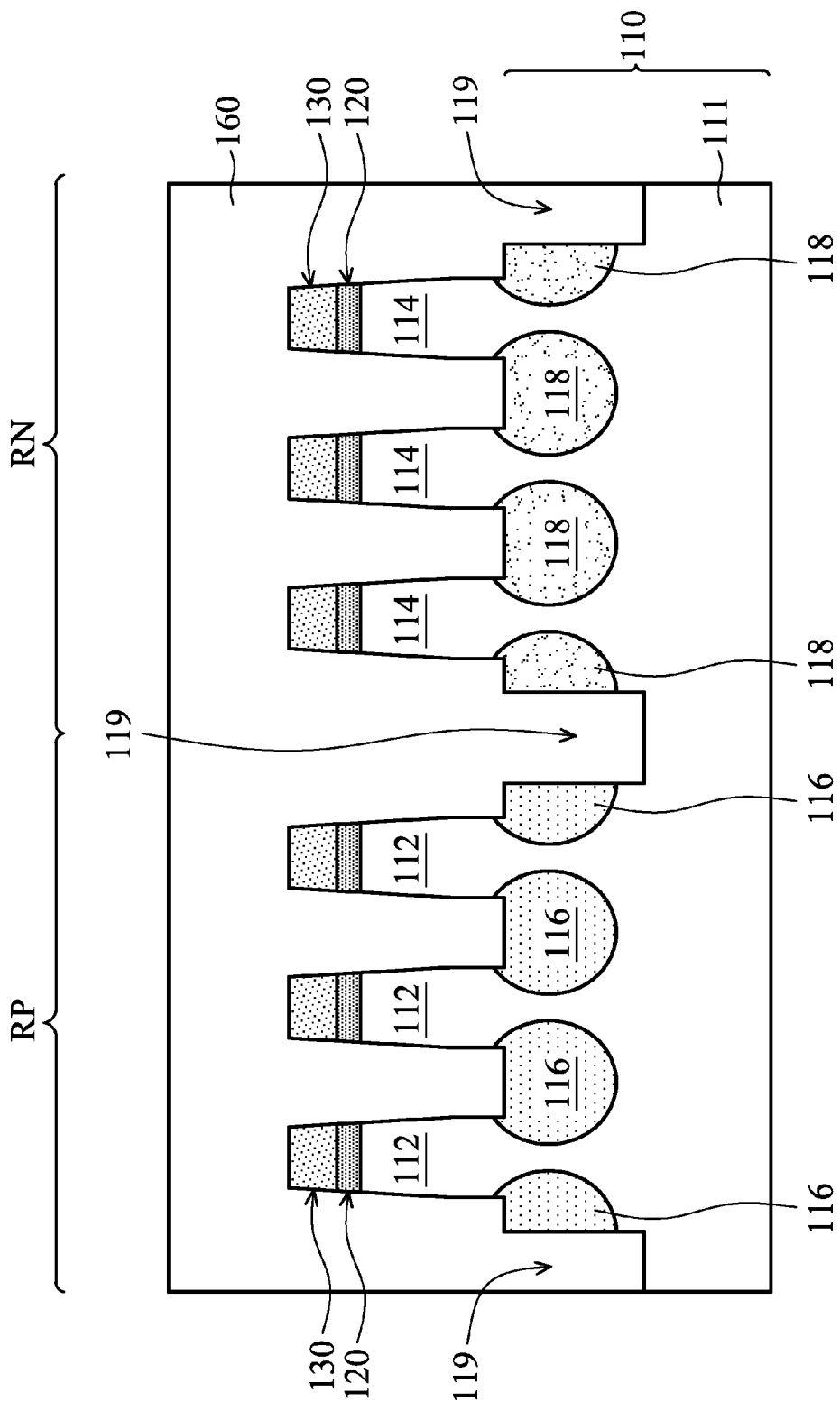
Figure 1F:
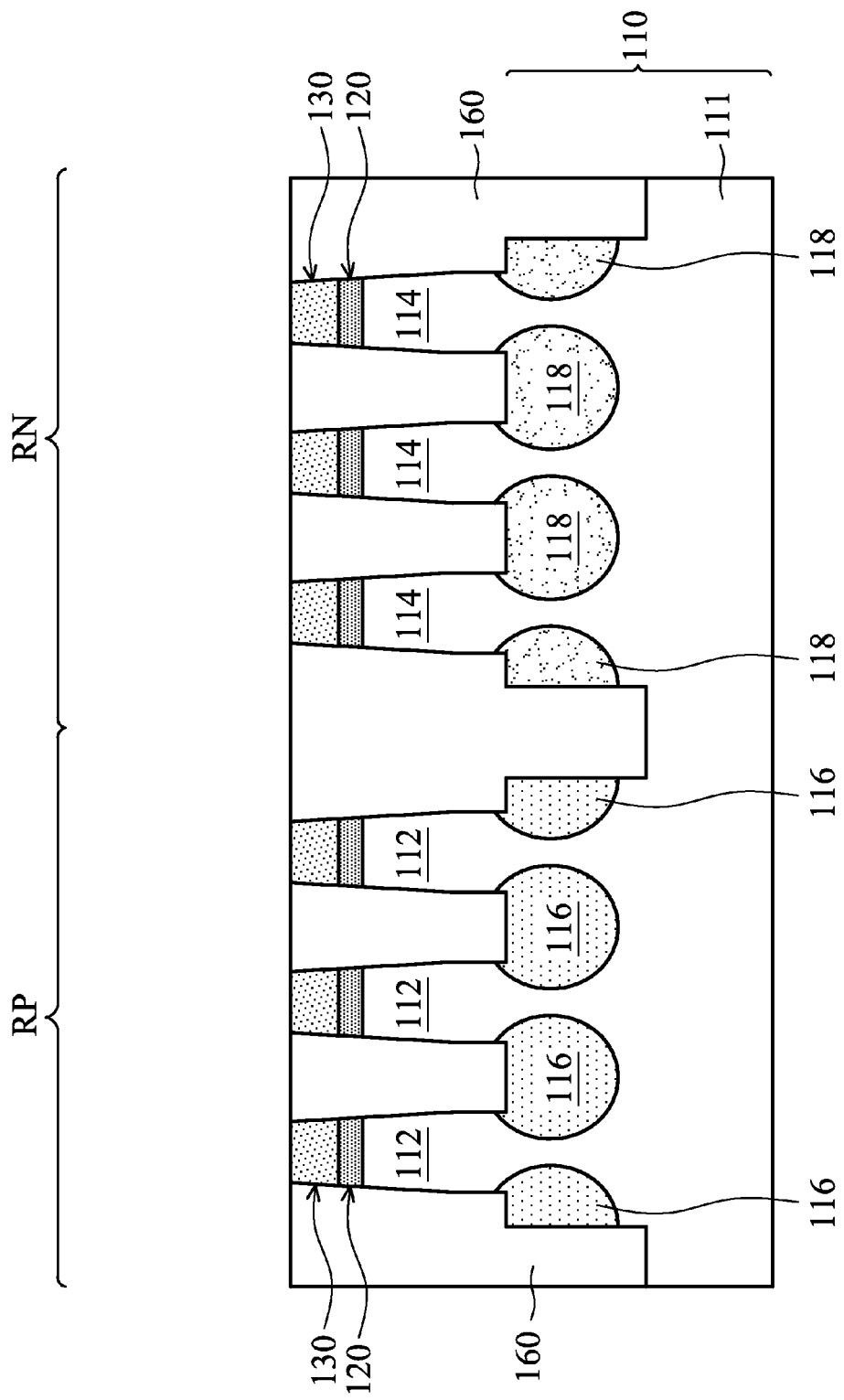
Figure 1G:
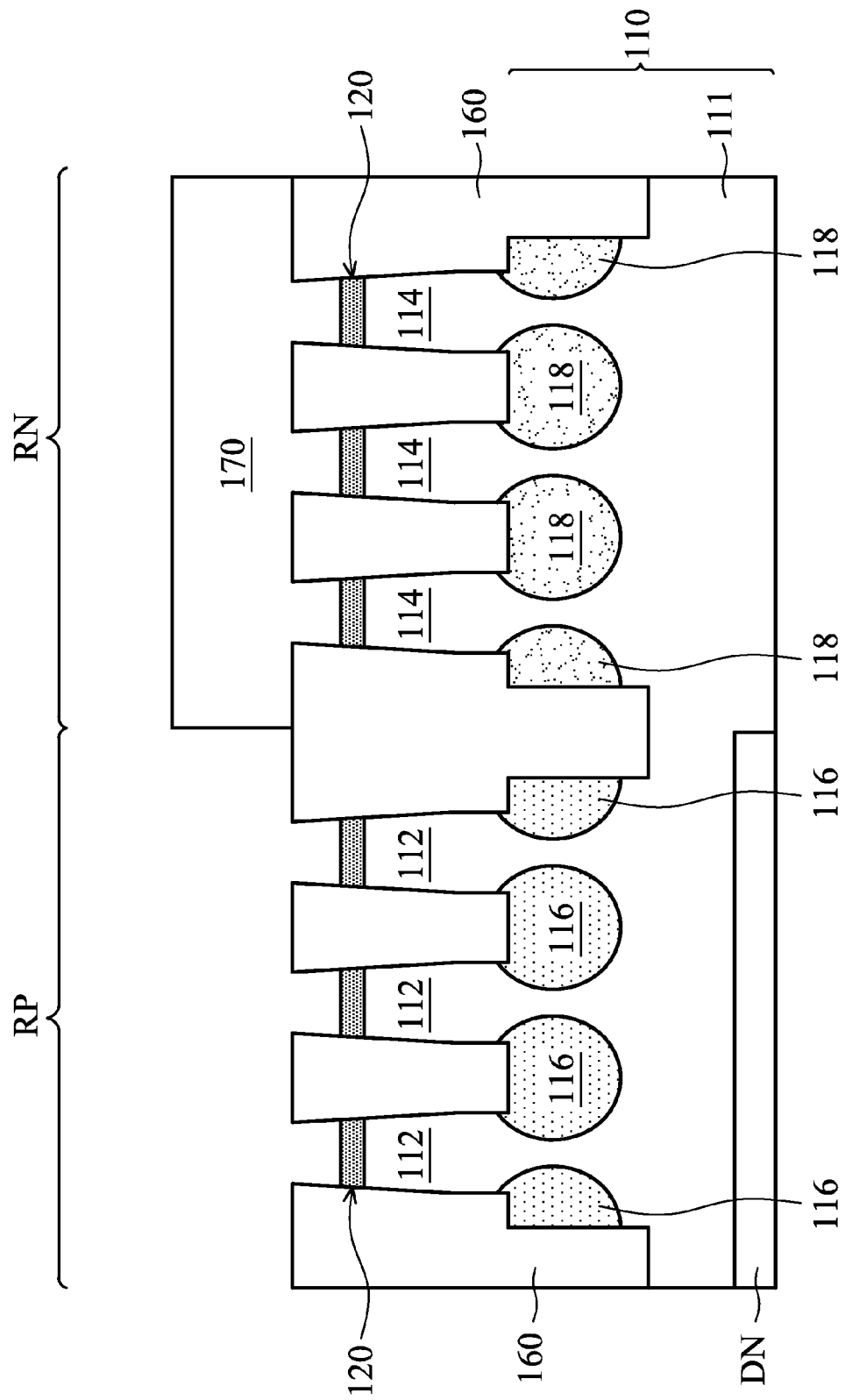
Figure 1H:
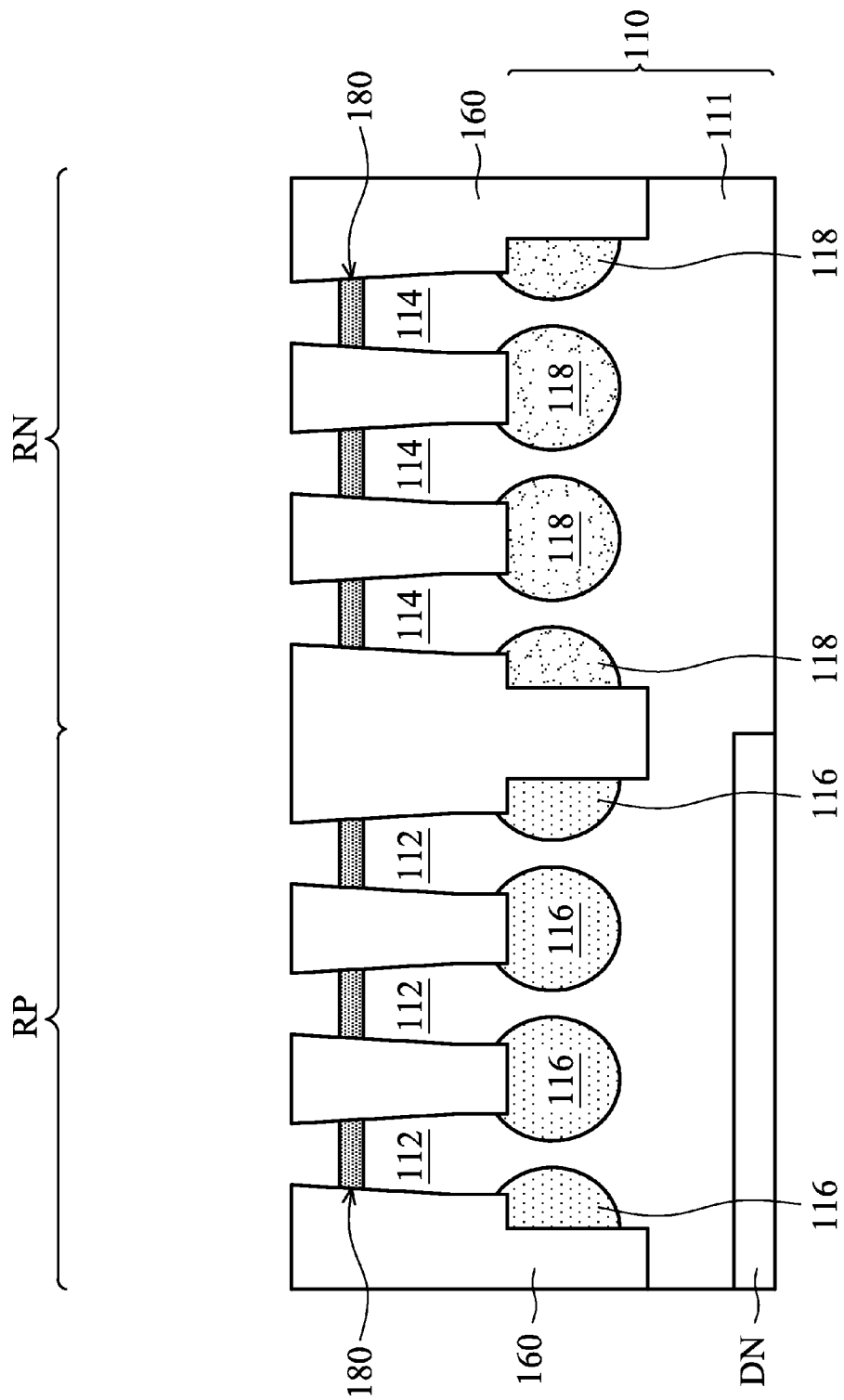
Figure 1I:
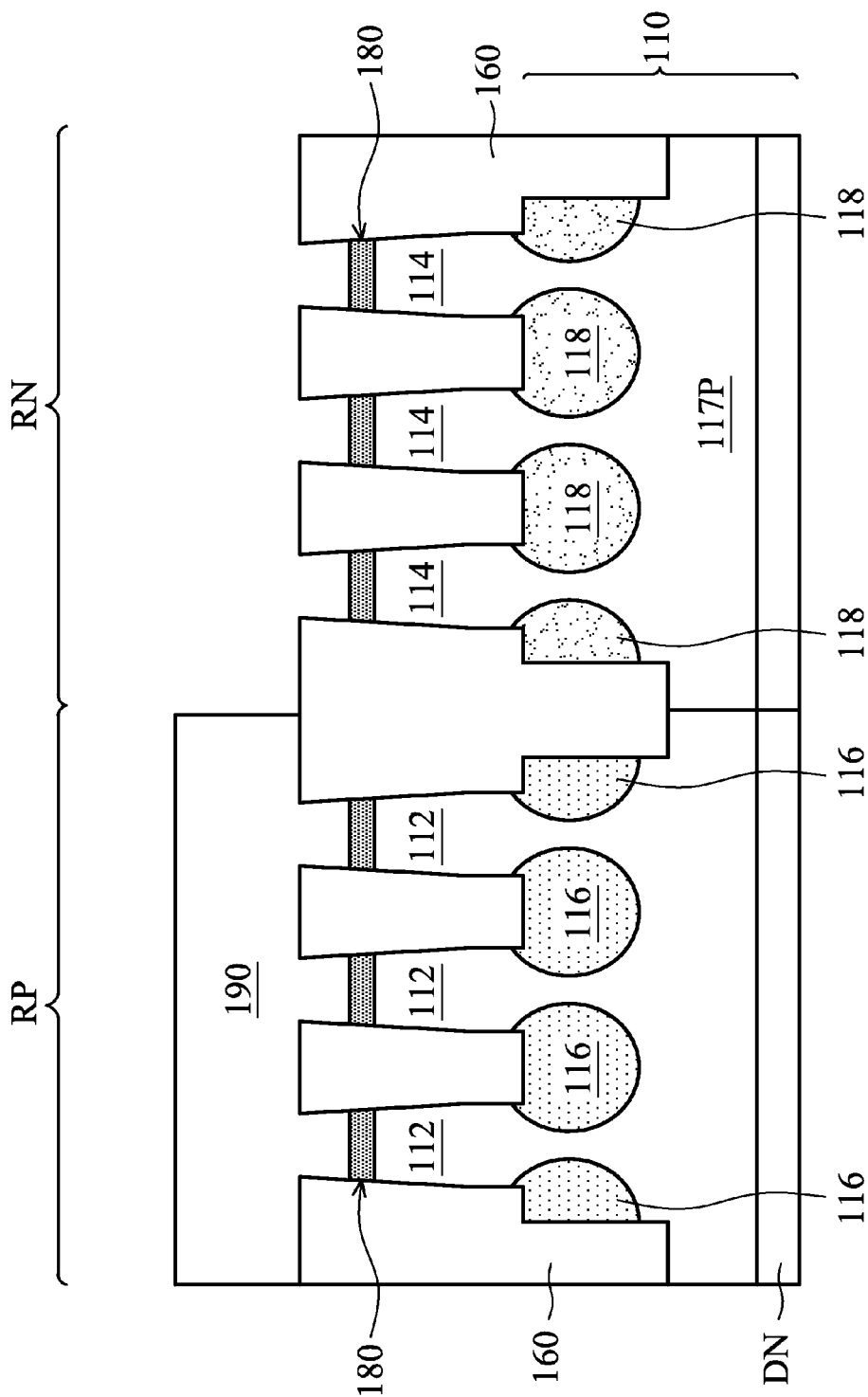
Figure 1J:
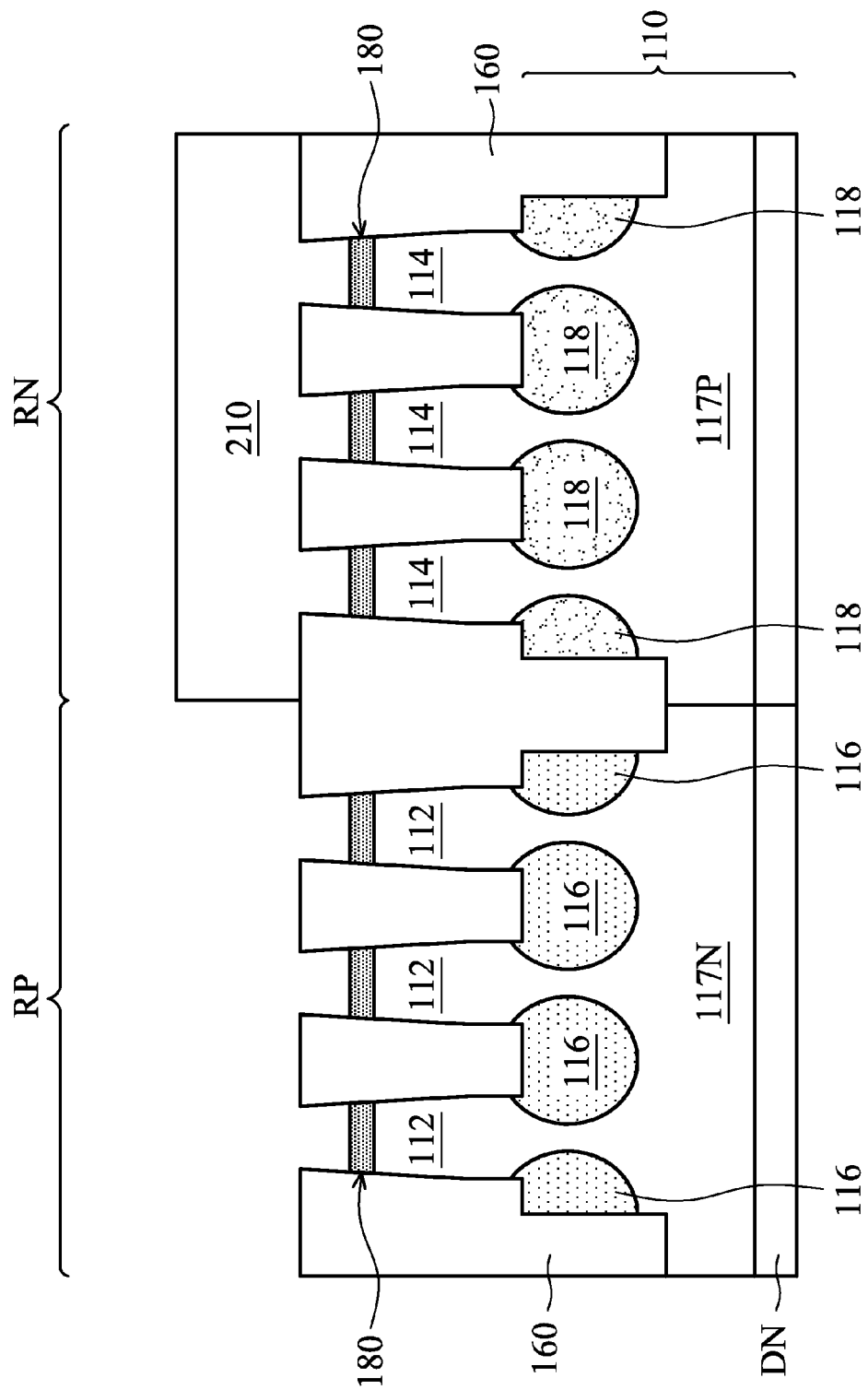
Figure 1K:
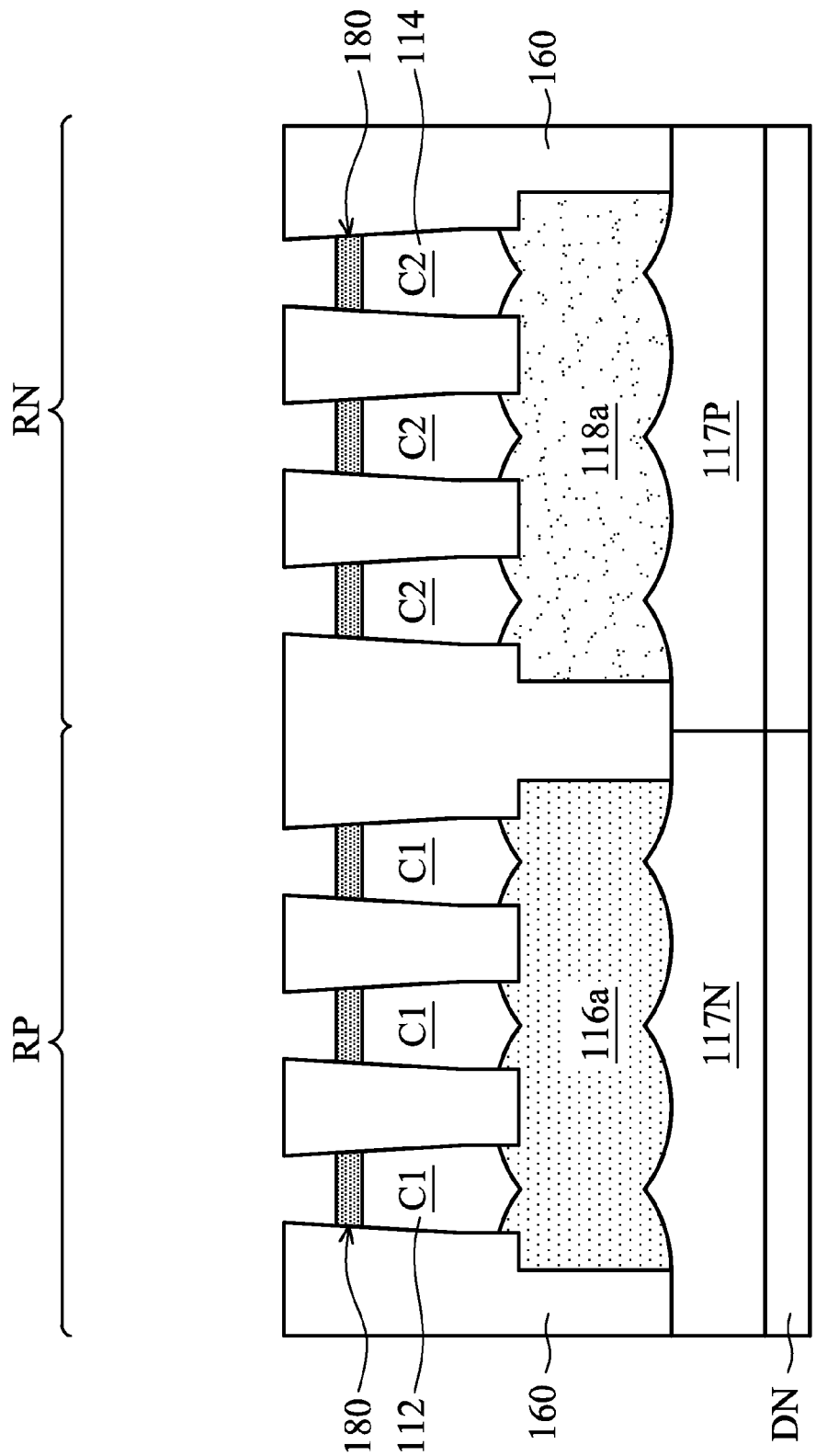
Figure 1L:
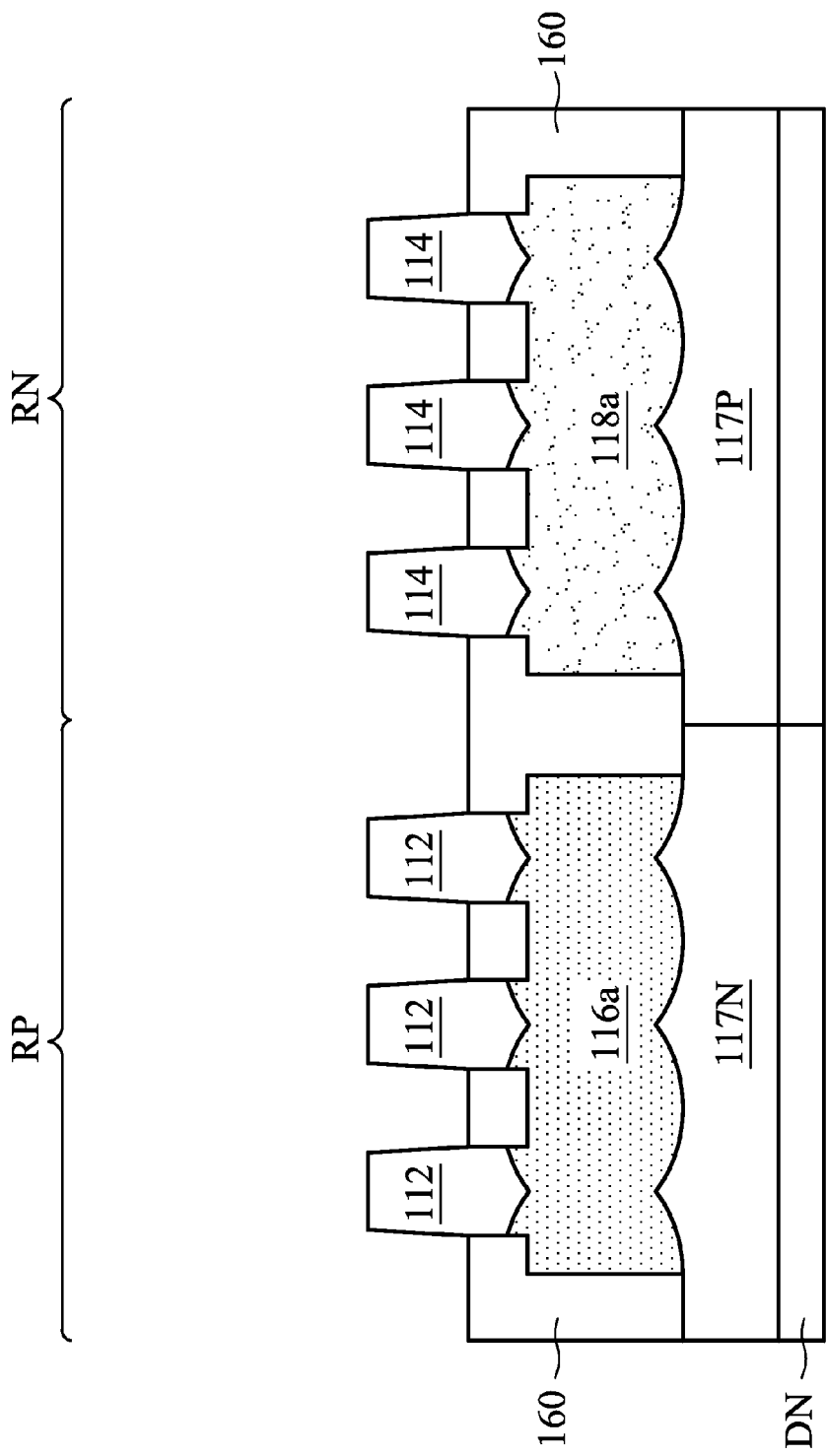
Figure 1M:
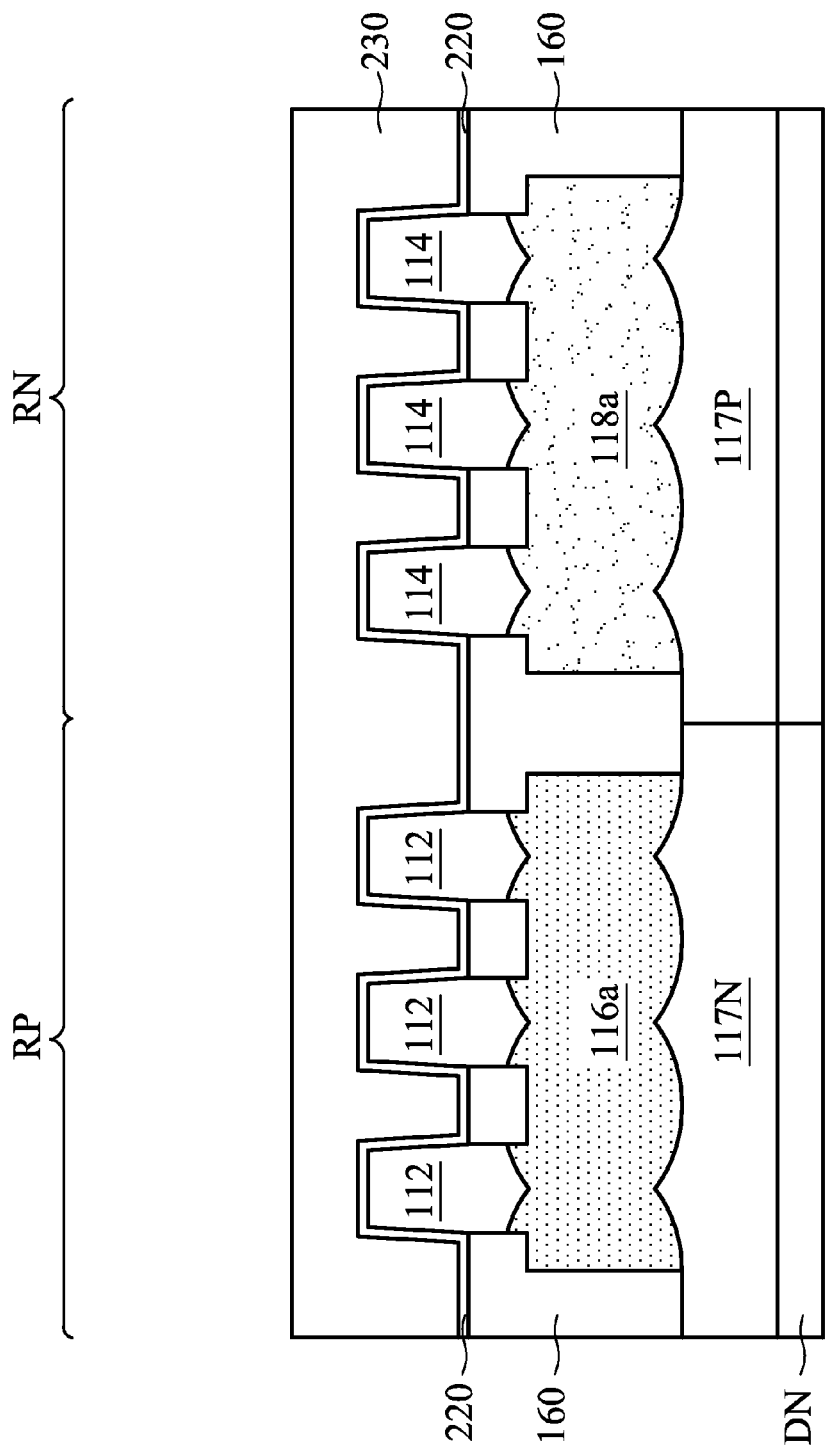
Figure 1N:
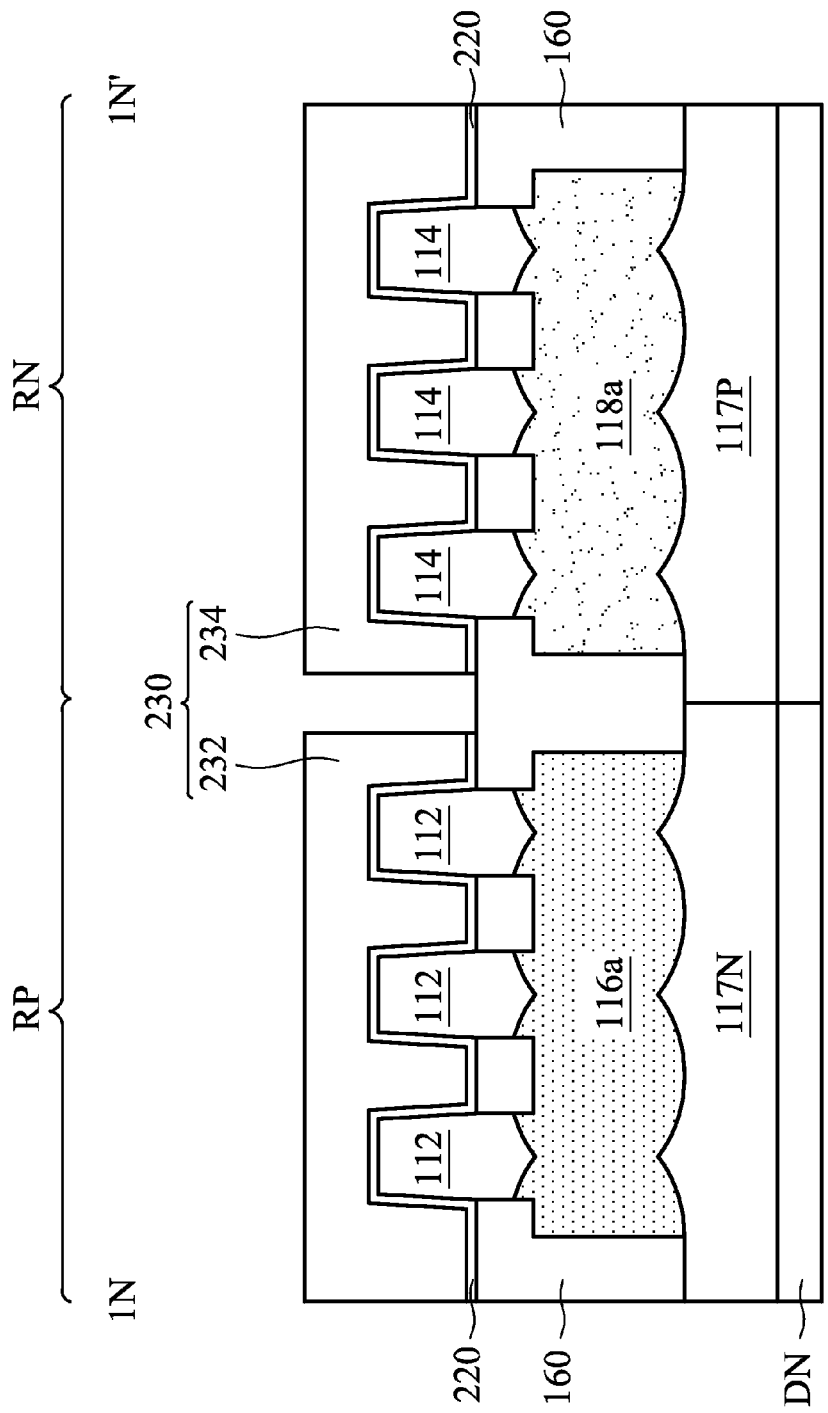

FIGS. 1A-1N are cross-sectional views of various stages of a process for forming a semiconductor device structure, in accordance with some embodiments. As shown in FIG. 1A, a substrate 110 is provided, in accordance with some embodiments. The substrate 110 includes regions RP and RN, in accordance with some embodiments. The region RP is used to form a P-channel metal-oxide-semiconductor field-effect transistor (PMOSFET), in accordance with some embodiments. The region RN is used to form an N-channel metal-oxide-semiconductor field-effect transistor (NMOSFET), in accordance with some embodiments.

The substrate 110 includes a semiconductor wafer (such as a silicon wafer) or a portion of a semiconductor wafer. In some embodiments, the substrate 110 is made of an elementary semiconductor material including silicon or germanium in a single crystal, polycrystal, or amorphous structure.

In some other embodiments, the substrate 110 is made of a compound semiconductor, such as silicon carbide, gallium arsenide, gallium phosphide, indium phosphide, indium arsenide, an alloy semiconductor, such as SiGe, or GaAsP, or combinations thereof. The substrate 110 may also include multi-layer semiconductors, semiconductor on insulator (SOI) (such as silicon on insulator or germanium on insulator), or combinations thereof. The substrate 110 is a P-type substrate, in accordance with some embodiments.

In addition, the substrate 110 may include structures such as doped regions, interlayer dielectric (ILD) layers, and/or conductive features. Furthermore, the substrate 110 may further include single or multiple material layers. For example, the material layers may include a silicon layer, a dielectric layer, and/or a doped polysilicon layer.

As shown in FIG. 1A, fin structures 115 are formed over the substrate 110, in accordance with some embodiments. The fin structures 115 include the fin structures 112 and 114, in accordance with some embodiments. The fin structures 112 are located over the region RP, in accordance with some embodiments. The fin structures 114 are located over the region RN, in accordance with some embodiments. The fin structures 112 and 114 are spaced apart from each other, in accordance with some embodiments. In some embodiments, the fin structures 112 and 114 are formed by patterning the substrate 110.

As shown in FIG. 1A, a dielectric layer 120 is formed over upper surfaces 112a of the fin structures 112 and upper surfaces 114a of the fin structures 114, in accordance with some embodiments. The dielectric layer 120 includes a dielectric material, in accordance with some embodiments. The dielectric material includes oxides, such as silicon oxide, in accordance with some embodiments.

As shown in FIG. 1A, a mask layer 130 is formed over the dielectric layer 120, in accordance with some embodiments. The mask layer 130 includes a dielectric material, in accordance with some embodiments. The dielectric material includes nitrides, such as silicon nitride, in accordance with some embodiments. The dielectric layer 120 and the mask layer 130 are made of different materials, in accordance with some embodiments.

In some embodiments, a thickness T2 of the mask layer 130 is greater than a thickness T1 of the dielectric layer 120. The thickness T1 ranges from about 1 nm to about 10 nm, in accordance with some embodiments. The thickness T2 ranges from about 10 nm to about 40 nm, in accordance with some embodiments.

As shown in FIG. 1B, a mask layer 140 is formed over the region RN of the substrate 110, in accordance with some embodiments. The mask layer 140 covers the fin structures 114, the dielectric layer 120 over the region RN, and the mask layer 130 over the region RN, in accordance with some embodiments. The mask layer 140 is configured to be an implantation mask in a subsequent implantation process, in accordance with some embodiments.

The mask layer 140 includes a photoresist material, in accordance with some embodiments. The mask layer 140 is formed by a coating process and a photolithography process, in accordance with some embodiments. The mask layer 140 includes an amorphous carbon material, which is able to sustain high temperatures from about 100° C. to about 500° C., in accordance with some embodiments. The mask layer 140 is formed by a deposition process, a photolithography process, and an etching process, in accordance with some embodiments.

As shown in FIG. 1B, an implantation process is performed on the substrate 110 exposed by the mask layers 130 and 140 to form doped regions 116 in the substrate 110, in accordance with some embodiments. The doped regions 116 are adjacent to the fin structures 112, in accordance with some embodiments. The implantation process includes an ion implantation process, in accordance with some embodiments.

The implantation process is performed using the mask layers 130 and 140 as an implantation mask, in accordance with some embodiments. The doped regions 116 are doped with N-type dopants, in accordance with some embodiments. The N-type dopants include phosphorus (P) and/or arsenic (As), in accordance with some embodiments.

The implantation process is performed at an energy of about 1 keV to about 10 keV, in accordance with some embodiments. The implantation energy and the thickness T2 of the mask layer 130 are adjustable to prevent the dopants from penetrating through the mask layer 130, in accordance with some embodiments. The implantation process is performed at a dose of about $1E13/cm^2$ to about $5E14/cm^2$, in accordance with some embodiments. The implantation process is performed at room temperature or a higher temperature, such as at about 100° C. to about 500° C., in accordance with some embodiments.

As shown in FIG. 1C, the mask layer 140 is removed, in accordance with some embodiments. The mask layer 140 is removed using a photolithography process, a wet etching process, or a dry etching process, in accordance with some embodiments. As shown in FIG. 1C, a mask layer 150 is formed over the region RP of the substrate 110, in accordance with some embodiments.

The mask layer 150 covers the fin structures 112, the dielectric layer 120 over the region RP, and the mask layer 130 over the region RP, in accordance with some embodiments. The mask layer 150 is configured to be an implantation mask in a subsequent implantation process, in accordance with some embodiments.

The mask layer 150 includes a photoresist material, in accordance with some embodiments. The mask layer 150 is formed by a coating process and a photolithography process, in accordance with some embodiments. The mask layer 150 includes an amorphous carbon material, which is able to sustain high temperatures from about 100° C. to about 500° C., in accordance with some embodiments. The mask layer 150 is formed by a deposition process, a photolithography process, and an etching process, in accordance with some embodiments.

As shown in FIG. 1C, an implantation process is performed on the substrate 110 exposed by the mask layers 130 and 150 to form doped regions 118 in the substrate 110, in accordance with some embodiments. The doped regions 118 are adjacent to the fin structures 114, in accordance with some embodiments. The implantation process includes an ion implantation process, in accordance with some embodiments.

The implantation process is performed using the mask layers 130 and 150 as an implantation mask, in accordance with some embodiments. The doped regions 118 are doped with P-type dopants, in accordance with some embodiments. The P-type dopants include boron (B) and/or boron fluoride ($BF_2$), in accordance with some embodiments.

The implantation process is performed at an energy of about 1 keV to about 10 keV, in accordance with some embodiments. The implantation energy and the thickness T2 of the mask layer 130 are adjustable to prevent the dopants from penetrating through the mask layer 130, in accordance with some embodiments. The implantation process is performed at a dose of about $1E13/cm^2$ to about $5E14/cm^2$, in accordance with some embodiments. The implantation process is performed at room temperature or a higher temperature, such as at about 100° C. to about 500° C., in accordance with some embodiments.

As shown in FIG. 1D, the mask layer 150 is removed, in accordance with some embodiments. The mask layer 150 is removed using a photolithography process, a wet etching process, or a dry etching process, in accordance with some embodiments. As shown in FIG. 1D, a portion of the substrate 110 is removed to define the regions RP and RN, in accordance with some embodiments. The removal process forms trenches 119 in the substrate 110, in accordance with some embodiments.

The trenches 119 surround the regions RP and RN and separate the region RP from the region RN, in accordance with some embodiments. The trenches 119 surround the fin structures 112 and the doped regions 116, in accordance with some embodiments. The trenches 119 surround the fin structures 114 and the doped regions 118, in accordance with some embodiments. The removal process may also remove a portion of the mask layer 130, in accordance with some embodiments. The removal process includes a photolithography process and an etching process, in accordance with some embodiments.

After the removal process, the substrate 110 has a lower portion 111 and upper portions 113a and 113b over the lower portions 111, in accordance with some embodiments. The upper portions 113a and 113b are separated from each other by the trenches 119, in accordance with some embodiments.

The doped regions 116 are formed in the upper portion 113a, in accordance with some embodiments. The doped regions 118 are formed in the upper portions 113b, in accordance with some embodiments. The width W1 of the upper portion 113a (or 113b) is less than the width W2 of the lower portion 111, in accordance with some embodiments.

As shown in FIG. 1E, an isolation layer 160 is formed over the substrate 110, in accordance with some embodiments. The isolation layer 160 covers the dielectric layer 120, the mask layer 130, the fin structures 112 and 114, and the substrate 110, in accordance with some embodiments. The isolation layer 160 fills the trenches 119, in accordance with some embodiments. The isolation layer 160 includes silicon oxide or another suitable dielectric material, in accordance with some embodiments.

The isolation layer 160 is formed by a chemical vapor deposition process, such as a flowable chemical vapor deposition process, in accordance with some embodiments. Thereafter, an annealing process is performed on the isolation layer 160, in accordance with some embodiments. The annealing process is performed at about 350° C. to about 600° C. for about 10 minutes to about 2 hours, in accordance with some embodiments.

As shown in FIG. 1F, a planarization process is performed to remove a portion of the isolation layer 160, in accordance with some embodiments. The mask layer 130 is exposed by the isolation layer 160, in accordance with some embodiments. The planarization process includes a chemical mechanical polishing (CMP) process, in accordance with some embodiments. Thereafter, an annealing process is performed on the isolation layer 160, in accordance with some embodiments. The annealing process is performed at about 350° C. to about 600° C. for about 10 minutes to about 2 hours, in accordance with some embodiments.

As shown in FIG. 1G, the mask layer 130 is removed, in accordance with some embodiments. The removal process includes a wet etching process, in accordance with some embodiments. As shown in FIG. 1G, a mask layer 170 is formed over the region RN to cover the fin structures 114 and the substrate 110 in the region RN, in accordance with some embodiments. The mask layer 170 includes a photoresist material, in accordance with some embodiments. The mask layer 170 is formed using a coating process and a photolithography process, in accordance with some embodiments.

As shown in FIG. 1G, a deep N-well DN is formed in the lower portion 111 in the region RP, in accordance with some embodiments. The deep N-well DN is formed using an ion implantation process, in accordance with some embodiments. The deep N-well DN is doped with N-type dopants, in accordance with some embodiments. The N-type dopants include phosphorus (P) and/or arsenic (As), in accordance with some embodiments.

As shown in FIG. 1H, the mask layer 170 and the dielectric layer 120 are removed, in accordance with some embodiments. The mask layer 170 is removed using a photolithography process, in accordance with some embodiments. The dielectric layer 120 is removed by a wet etching process or a dry etching process, in accordance with some embodiments. As shown in FIG. 1I, a dielectric layer 180 is formed over the fin structures 112 and 114, in accordance with some embodiments. The dielectric layer 180 is formed using a thermal oxidation process, in accordance with some embodiments.

As shown in FIG. 1I, a mask layer 190 is formed over the region RP to cover the fin structures 112 and the substrate 110 in the region RP, in accordance with some embodiments. The mask layer 190 includes a photoresist material, in accordance with some embodiments. The mask layer 190 is formed using a coating process and a photolithography process, in accordance with some embodiments.

As shown in FIG. 1I, a P-well 117P is formed in the substrate 110 in the region RN, in accordance with some embodiments. The P-well 117P is also referred to as a P-type doped well. The P-well 117P is formed using an ion implantation process, in accordance with some embodiments. The P-well 117P is doped with P-type dopants, in accordance with some embodiments. The P-type dopants include boron (B) and/or boron fluoride ($BF_2$), in accordance with some embodiments.

As shown in FIG. 1J, the mask layer 190 is removed, in accordance with some embodiments. The removal process includes a photolithography process, in accordance with some embodiments. As shown in FIG. 1J, a mask layer 210 is formed over the region RN to cover the fin structures 114 and the substrate 110 in the region RN, in accordance with some embodiments. The mask layer 210 includes a photoresist material, in accordance with some embodiments. The mask layer 210 is formed using a coating process and a photolithography process, in accordance with some embodiments.

As shown in FIG. 1J, an N-well 117N is formed in the substrate 110 in the region RP, in accordance with some embodiments. The N-well 117N is also referred to as a N-type doped well. The N-well 117N is formed using an ion implantation process, in accordance with some embodiments. The N-well 117N is doped with N-type dopants, in accordance with some embodiments. The N-type dopants include phosphorus (P) and/or arsenic (As), in accordance with some embodiments.

As shown in FIG. 1K, the mask layer 210 is removed, in accordance with some embodiments. The removal process includes a photolithography process, in accordance with some embodiments. Thereafter, an annealing process is performed to enlarge the doped regions 116 and 118, in accordance with some embodiments. After the annealing process, the doped regions 116 are merged into a merged doped region 116a, and the doped regions 118 are merged into a merged doped region 118a, in accordance with some embodiments.

The merged doped region 116a is formed in the upper portion 113a, in accordance with some embodiments. The merged doped region 116a is positioned adjacent to an upper surface P1 and sidewalls S1 of the upper portion 113a, in accordance with some embodiments. The merged doped region 116a is configured to be an anti-punch through region, in accordance with some embodiments.

The merged doped region 118a is formed in the upper portion 113b, in accordance with some embodiments. The merged doped region 118a is positioned adjacent to an upper surface P2 and sidewalls S2 of the upper portion 113b, in accordance with some embodiments. The merged doped region 118a is configured to be an anti-punch through region, in accordance with some embodiments. In some embodiments, an average dopant concentration of the merged doped region 116a or 118a ranges from about 1E18 $cm^{-3}$ to about $1E19^{-3}$.

In the merged doped region 116a, since the merged doped region 116a is formed from the doped regions 116, the dopants remaining in the substrate 110 exposed by the fin structures 112 (i.e. the position of the doped regions 116) are greater in number than the dopants diffusing into the substrate 110 covered by the fin structures 112.

Therefore, a dopant concentration of the merged doped region 116a exposed by the fin structures 112 is greater than a dopant concentration of the merged doped region 116a covered by the fin structures 112, in accordance with some embodiments. Similarly, a dopant concentration of the merged doped region 118a exposed by the fin structures 114 is greater than a dopant concentration of the merged doped region 118a covered by the fin structures 114, in accordance with some embodiments.

The fin structures 112 have channel regions C1 over the merged doped region 116a, in accordance with some embodiments. The fin structures 114 have channel regions C2 over the merged doped region 118a, in accordance with some embodiments.

During the implantation process, since the embodiments form the mask layer 130 over the fin structures 112 and 114, the mask layer 130 may protect the channel regions C1 and C2 from being doped and from damage. Therefore, the mask layer 130 may reduce the dopant concentration of the channel regions C1 and C2, which improves carrier mobility in the channel regions C1 and C2. Since the damage resulting from the implantation process is prevented or reduced, the current leakage is reduced. In some embodiments, an average dopant concentration of the fin structures 112 or 114 ranges from about 1E16 $cm^{-3}$ to about 1E17 $cm^{-3}$.

The N-well 117N is located under the merged doped region 116a, in accordance with some embodiments. The N-well 117N has a dopant concentration less than the average dopant concentration of the merged doped region 116a, in accordance with some embodiments. The N-well 117N has a dopant concentration less than the dopant concentration of the merged doped region 116a covered by the fin structures 112, in accordance with some embodiments.

The P-well 117P is located under the merged doped region 118a, in accordance with some embodiments. The P-well 117P has a dopant concentration less than the average dopant concentration of the merged doped region 118a, in accordance with some embodiments. The P-well 117P has a dopant concentration less than the dopant concentration of the merged doped region 118a covered by the fin structures 114, in accordance with some embodiments.

As shown in FIG. 1L, the dielectric layer 180 and an upper portion of the isolation layer 160 are removed, in accordance with some embodiments. The sidewalls 112b of the fin structures 112 and the sidewalls 114b of the fin structures 114 are partially exposed by the isolation layer 160, in accordance with some embodiments. The isolation layer 160 surrounds the fin structures 112 and 114, in accordance with some embodiments.

The isolation layer 160 covers the upper surfaces P1, P2, and P3 of the upper portions 113a and 113b and the lower portion 111 and the sidewalls S1 and S2 of the upper portions 113a and 113b, in accordance with some embodiments. The removal process includes a dry etching process and/or a wet etching process, in accordance with some embodiments.

As shown in FIG. 1M, a dummy gate dielectric layer 220 is formed over the fin structures 112 and 114 and the isolation layer 160, in accordance with some embodiments. The dummy gate dielectric layer 220 is made of silicon oxide, in accordance with some embodiments. As shown in FIG. 1M, a dummy gate material layer 230 is formed over the dummy gate dielectric layer 220, in accordance with some embodiments. The dummy gate material layer 230 is made of polysilicon, in accordance with some embodiments.

Figure 2A:
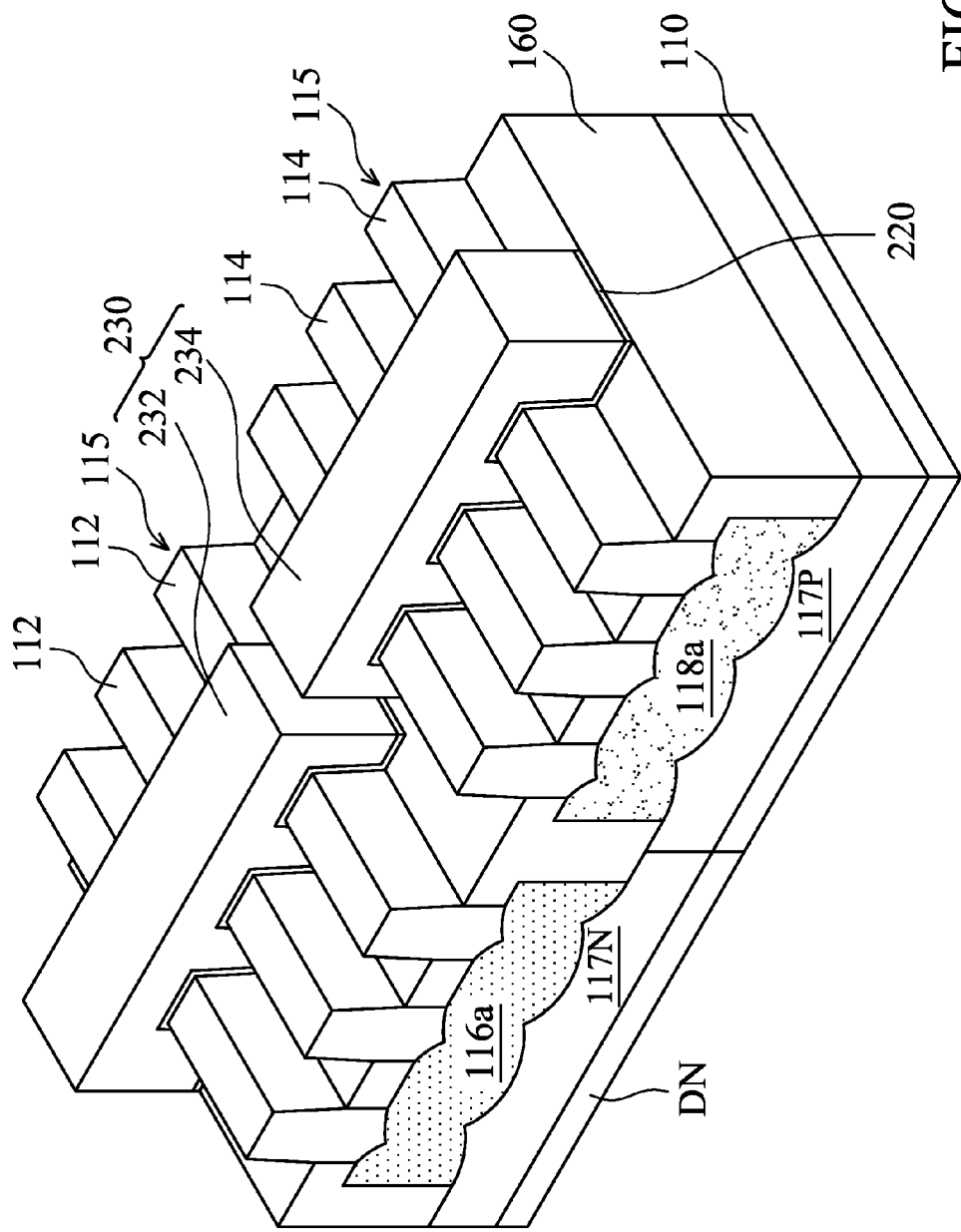
FIG. 2A is a perspective view of the semiconductor device structure of FIG. 1N, in accordance with some embodiments.
Figure 2B:
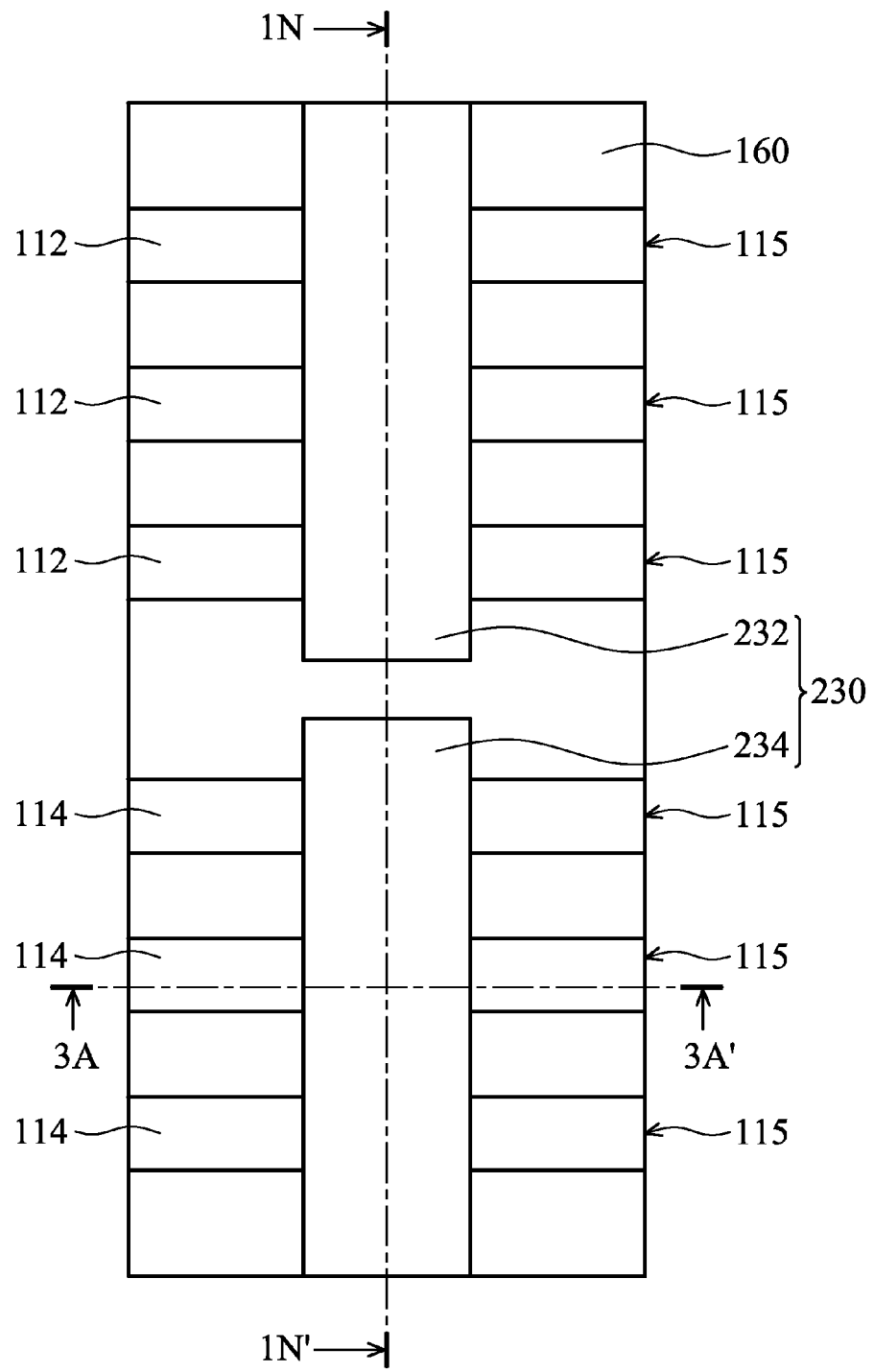
FIG. 2B is a top view of the semiconductor device structure of FIG. 1N, in accordance with some embodiments.
Figure 3A:
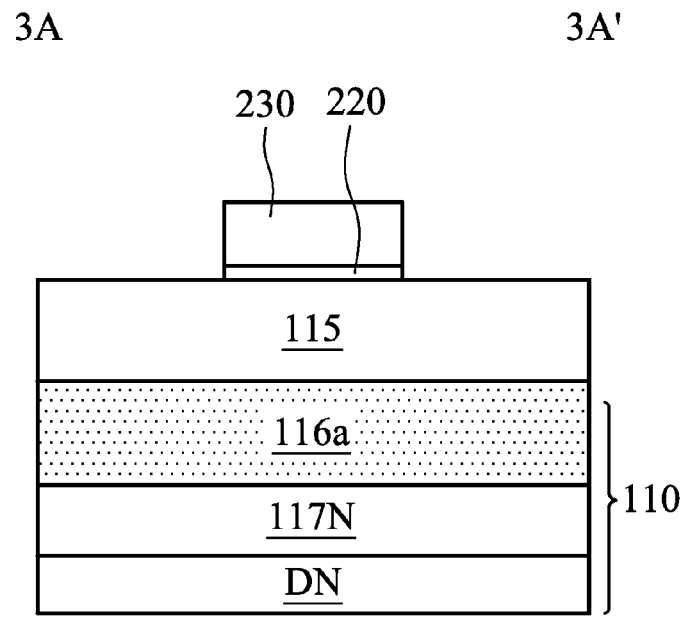
FIGS. 3A-3H are cross-sectional views of various stages of a process for forming a semiconductor device structure, in accordance with some embodiments.

FIG. 2A is a perspective view of the semiconductor device structure of FIG. 1N, in accordance with some embodiments. FIG. 2B is a top view of the semiconductor device structure of FIG. 1N, in accordance with some embodiments. FIG. 1N is a cross-sectional view illustrating the semiconductor device structure along a sectional line 1N-1N' in FIG. 2B, in accordance with some embodiments. FIG. 3A is a cross-sectional view illustrating the semiconductor device structure along a sectional line 3A-3A' in FIG. 2B, in accordance with some embodiments.

As shown in FIGS. 1N, 2A, 2B, and 3A, portions of the dummy gate dielectric layer 220 and the dummy gate material layer 230 are removed, in accordance with some embodiments. After the removal process, the dummy gate material layer 230 includes dummy gates 232 and 234, in accordance with some embodiments. The dummy gate 232 is over the fin structures 112, in accordance with some embodiments. The dummy gate 234 is over the fin structures 114, in accordance with some embodiments. The removal process includes a photolithography process and an etching process, in accordance with some embodiments.

Figure 3B:
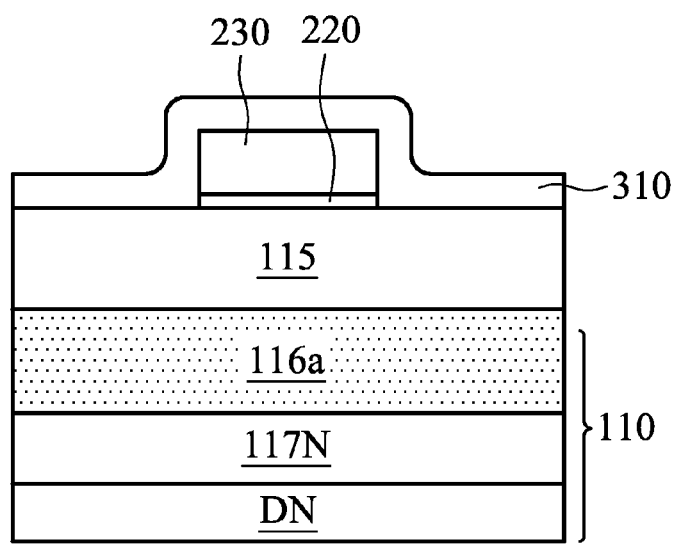

FIGS. 3A-3H are cross-sectional views of various stages of a process for forming a semiconductor device structure, in accordance with some embodiments. After the stage of FIG. 3A, a spacer layer 310 is deposited over the isolation layer 160 to cover the dummy gate dielectric layer 220 and the dummy gate material layer 230, as shown in FIG. 3B, in accordance with some embodiments. The spacer layer 310 includes an insulating material, such as silicon oxide or silicon nitride. The spacer layer 310 is formed using a chemical vapor deposition process, in accordance with some embodiments.

Figure 3C:
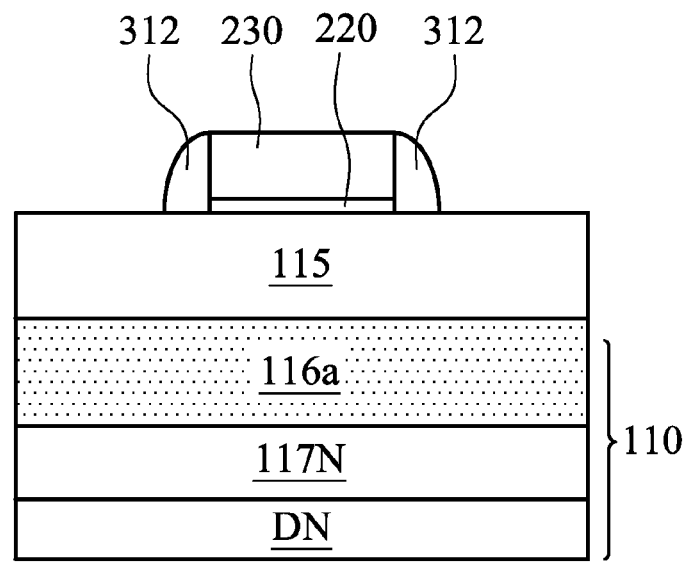

As shown in FIGS. 3B and 3C, an anisotropic etching process is performed to remove a portion of the spacer layer 310, in accordance with some embodiments. The spacer layer 310 remaining over the sidewalls of the dummy gate material layer 230 and the dummy gate dielectric layer 220 forms spacers 312, in accordance with some embodiments. The spacers 312 are configured to electrically isolate a gate formed subsequently from other devices, in accordance with some embodiments. The anisotropic etching process includes a dry etching process, in accordance with some embodiments.

Figure 3D:
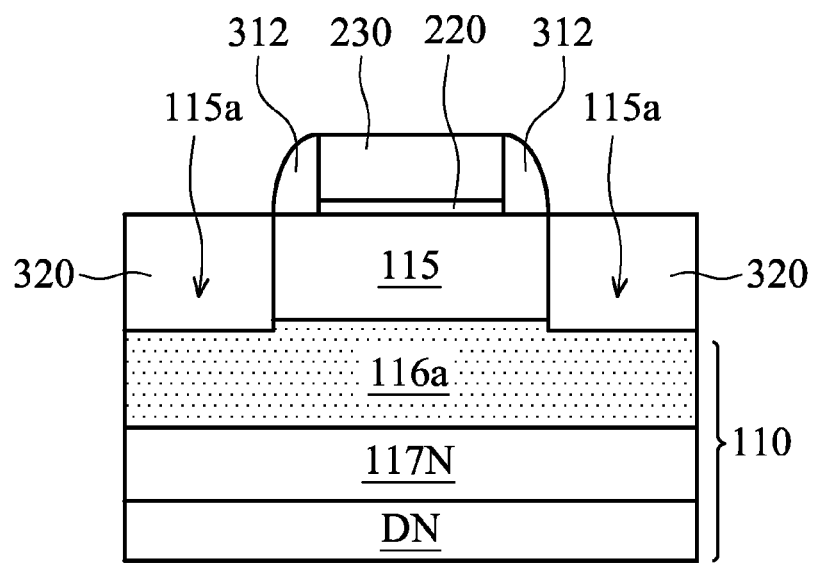

As shown in FIG. 3D, portions of the fin structures 115 are removed, in accordance with some embodiments. After the removal process, recesses 115a are formed at two opposite sides of the dummy gate material layer 230, in accordance with some embodiments. The removal process includes a photolithography process and an etching process, in accordance with some embodiments.

As shown in FIG. 3D, doped structures 320 are formed in the recesses 115a, in accordance with some embodiments. The doped structures 320 over the same fin structure 115 include a source structure and a drain structure, in accordance with some embodiments. The doped structures 320 include SiGe or SiC, in accordance with some embodiments. The doped structures 320 are formed using a selective epitaxial growth (SEG) process, in accordance with some embodiments.

The doped structures 320 over the fin structure 112 are doped with dopants of an opposite conduction type to the conduction type of the dopants in the merged doped region 116a, in accordance with some embodiments. That is, the doped structures 320 over the fin structure 112 are doped with P-type dopants, such as boron (B) and/or boron fluoride (BF$_2$), in accordance with some embodiments.

The doped structures 320 over the fin structure 114 are doped with dopants of an opposite conduction type to the conduction type of the dopants, which are doped in the merged doped region 118a, in accordance with some embodiments. That is, the doped structures 320 over the fin structure 114 are doped with N-type dopants, such as boron (B) and/or boron fluoride (BF$_2$), in accordance with some embodiments.

In some embodiments, the dopant concentration of the doped structures 320 is greater than the average dopant concentration of the merged doped region 116a or 118a. In some embodiments, the dopant concentration of the doped structures 320 is greater than the dopant concentration of the merged doped region 116a exposed by the fin structures 112 (as shown in FIG. 1N). In some embodiments, the dopant concentration of the doped structures 320 is greater than the dopant concentration of the merged doped region 118a exposed by the fin structures 114 (as shown in FIG. 1N).

In some other embodiments (not shown), the recesses 115a and the doped structures 320 are not formed. In some other embodiments (not shown), heavy doped regions are formed in the fin structures 115 and at two opposite sides of the dummy gate material layer 230 to serve as source structures and drain structures.

Afterwards, in some embodiments (not shown), a contact etch stop layer is formed over the substrate 110 to cover the doped structures 320, in accordance with some embodiments. The contact etch stop layer includes a dielectric material, in accordance with some embodiments. The contact etch stop layer includes silicon nitride, in accordance with some embodiments. It should be noted that, for the sake of simplicity, FIG. 3D does not show the contact etch stop layer.

Figure 3E:
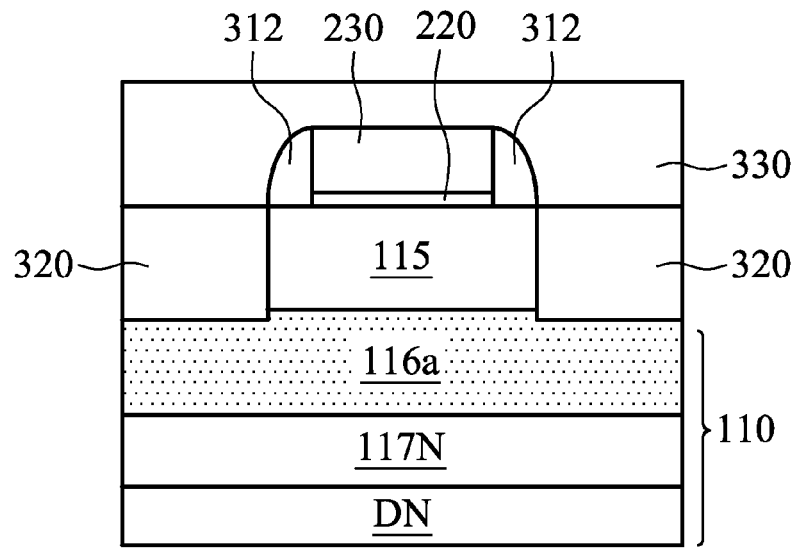

As shown in FIG. 3E, a dielectric layer 330 is deposited over the substrate 110, in accordance with some embodiments. The dielectric layer 330 covers the isolation layer 160 (as shown in FIG. 2B), the fin structures 115, the dummy gate material layer 230, and the spacers 312, in accordance with some embodiments.

The dielectric layer 330 includes silicon oxide, silicon oxynitride, borosilicate glass (BSG), phosphoric silicate glass (PSG), borophosphosilicate glass (BPSG), fluorinated silicate glass (FSG), low-k material, porous dielectric material, or combinations thereof, in accordance with some embodiments. The dielectric layer 330 is deposited using a CVD process, a HDPCVD process, a spin-on process, a sputtering process, or a combination thereof, in accordance with some embodiments.

Figure 3F:
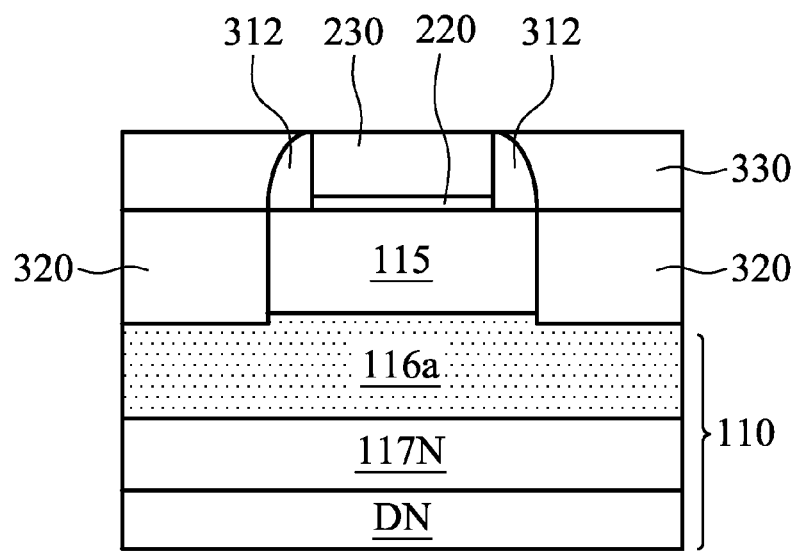

Afterwards, as shown in FIG. 3F, a planarization process is performed on the dielectric layer 330 until the top surface of the dummy gate material layer 230 is exposed, in accordance with some embodiments. The planarization process includes a chemical mechanical polishing (CMP) process, in accordance with some embodiments. After the planarization process is performed, the dielectric layer 330 has a substantially planar surface to facilitate subsequent process steps.

Figure 3G:
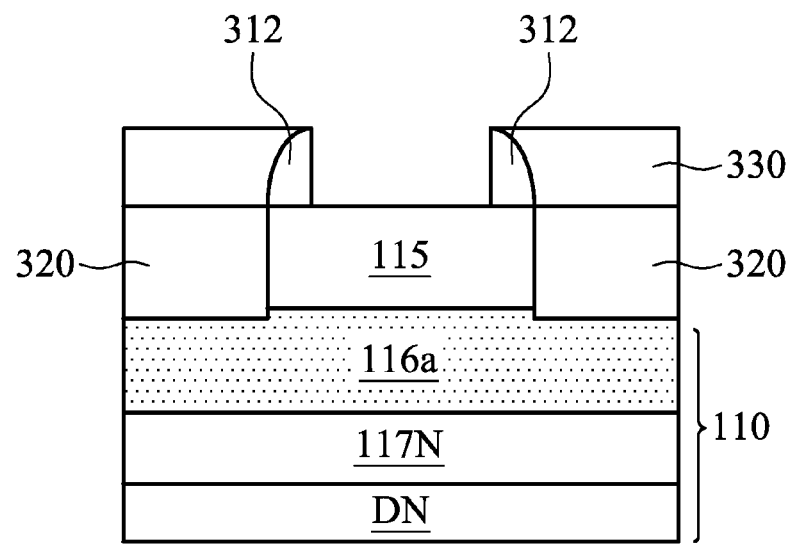

As shown in FIG. 3G, the dummy gate material layer 230 is removed, in accordance with some embodiments. The removal process for removing the dummy gate material layer 230 includes a wet etching process, a dry etching process, or a combination thereof, in accordance with some embodiments. In some embodiments, the dummy gate dielectric layer 220 is also removed. After the dummy gate material layer 230 and the dummy gate dielectric layer 220 are removed, trenches are formed between the spacers 312, in accordance with some embodiments.

Figure 3H:
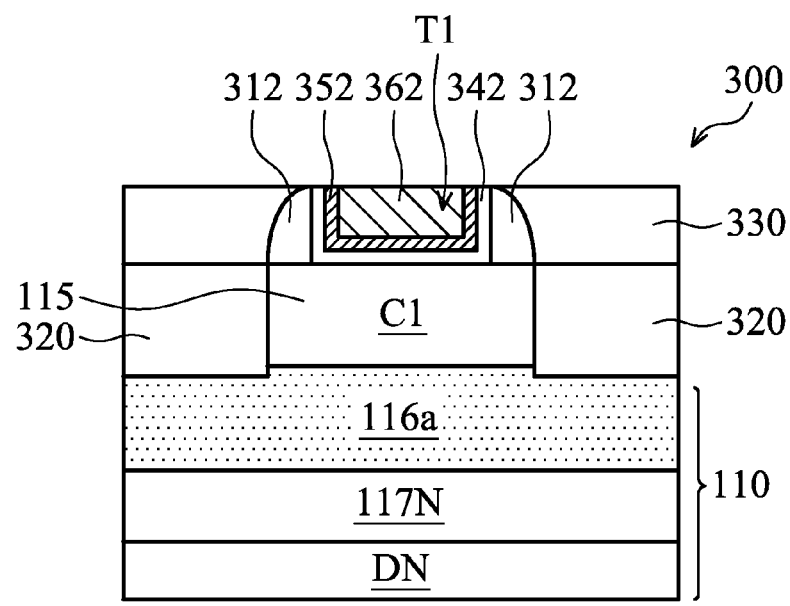
Figure 4A:
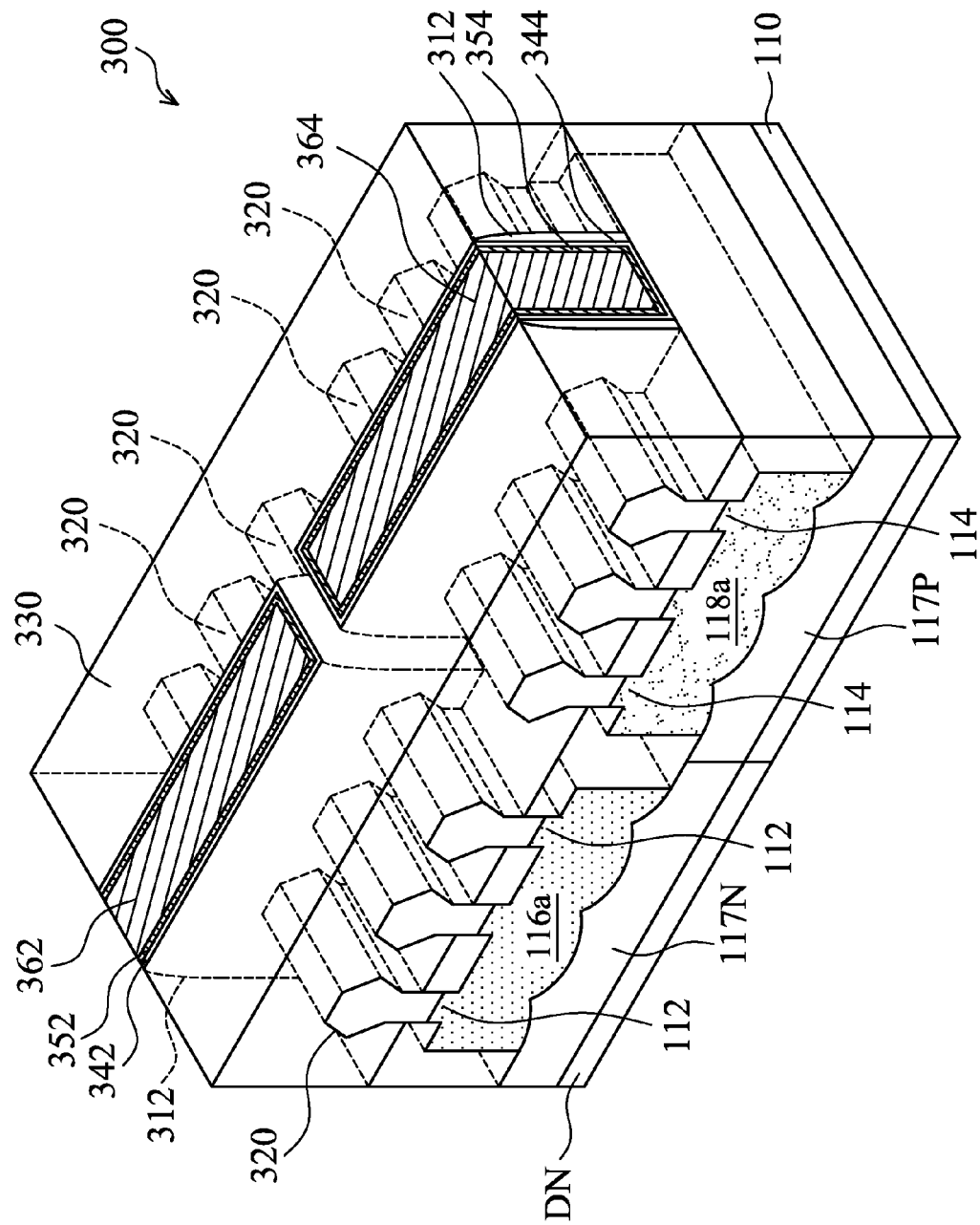
FIG. 4A is a perspective view of the semiconductor device structure of FIG. 3H, in accordance with some embodiments.
Figure 4B:
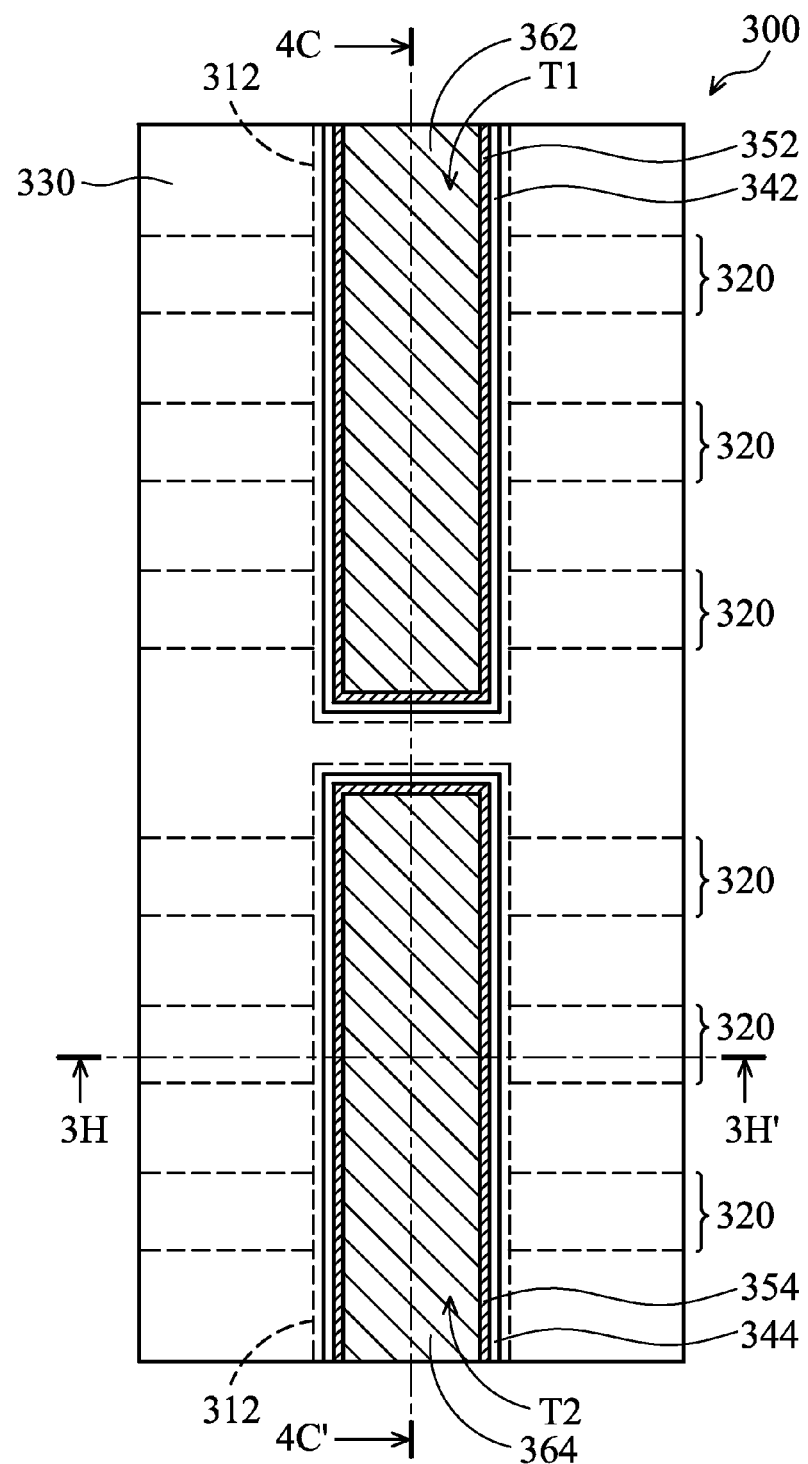
FIG. 4B is a top view of the semiconductor device structure of FIG. 3H, in accordance with some embodiments.
Figure 4C:
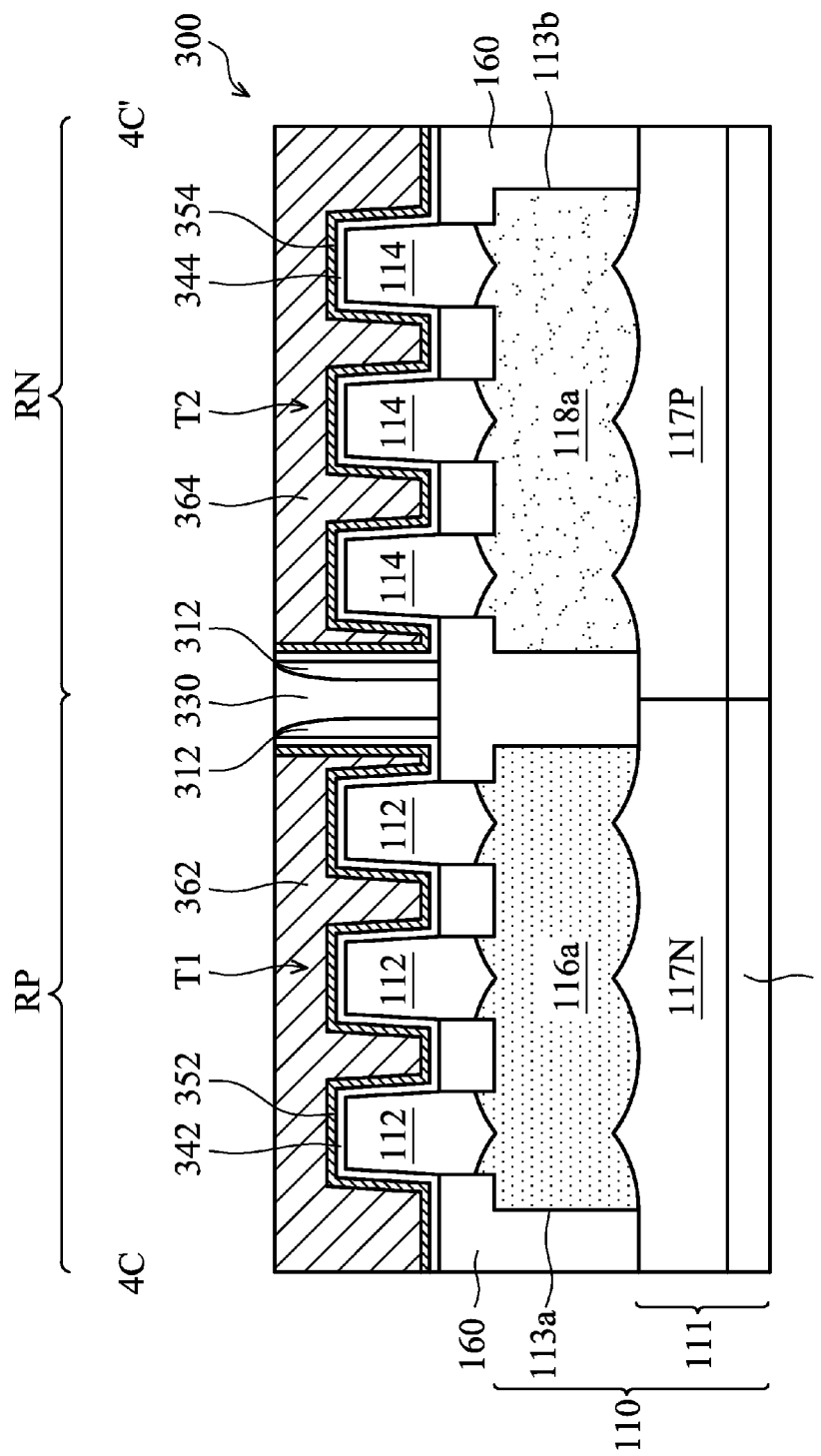
FIG. 4C is a cross-sectional view of the semiconductor device structure along a sectional line 4C-4C' in FIG. 4B, in accordance with some embodiments.

FIG. 4A is a perspective view of the semiconductor device structure 300 of FIG. 3H, in accordance with some embodiments. FIG. 4B is a top view of the semiconductor device structure 300 of FIG. 3H, in accordance with some embodiments. FIG. 3H is a cross-sectional view of the semiconductor device structure 300 along a sectional line 3H-3H' in FIG. 4B, in accordance with some embodiments. FIG. 4C is a cross-sectional view of the semiconductor device structure 300 along a sectional line 4C-4C' in FIG. 4B, in accordance with some embodiments.

As shown in FIGS. 3H, 4A, 4B, and 4C, the trenches include trenches T1 and T2, in accordance with some embodiments. The trench T1 exposes the fin structures 112, and the trench T2 exposes the fin structures 114, in accordance with some embodiments. In some embodiments, a gate dielectric layer 342 is formed to cover the bottom of the trench T1, in accordance with some embodiments. The gate dielectric layer 342 further covers the inner wall of the trench T1, in accordance with some embodiments.

The gate dielectric layer 342 includes a dielectric material, such as a high dielectric constant (high-k) material. The high-k material includes hafnium oxide (HfO$_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), other suitable high-k dielectric materials, or combinations thereof.

The high-k material is made of metal oxides, metal nitrides, metal silicates, transition metal-oxides, transition metal-nitrides, transition metal-silicates, oxynitrides of metals, aluminum oxide, hafnium dioxide-alumina (HfO$_2$—Al$_2$O$_3$) alloy, other suitable materials, or a combination thereof, in accordance with some embodiments.

The gate dielectric layer 342 is formed using a deposition process and a planarization process, in accordance with some embodiments. The deposition process includes an atomic layer deposition (ALD) process, a chemical vapor deposition (CVD) process, a physical vapor deposition (PVD) process, a sputtering process, a plating process, another suitable process, or a combination thereof, in accordance with some embodiments. In some embodiments, the gate dielectric layer 342 needs to be annealed.

An intermediate dielectric layer (not shown) may be formed over the fin structures 112 before the gate dielectric layer 342 is formed. The intermediate dielectric layer includes a suitable dielectric material, such as silicon oxide, hafnium silicate, silicon oxynitride, or combinations thereof.

In some embodiments, a work function layer 352 is formed over the gate dielectric layer 342, in accordance with some embodiments. The work function layer 352 provides a desired work function for transistors to enhance device performance including improved threshold voltage.

In the embodiments of forming a P-type FinFET, the work function layer 352 can be a p-type metal capable of providing a work function value suitable for the device, such as equal to or greater than about 4.8 eV. The p-type metal includes metal, metal carbide, metal nitride, other suitable materials, or a combination thereof, in accordance with some embodiments. For example, the p-type metal is made of titanium, titanium nitride, other suitable materials, or combinations thereof.

In some embodiments, a gate 362 (also called a metal gate) is formed over the work function layer 352 to fill the trench T1, in accordance with some embodiments. The gate 362 covers the fin structures 112, in accordance with some embodiments. The gate 362 includes a suitable metal material, such as aluminum, tungsten, gold, platinum, cobalt, another suitable metal, an alloy thereof, or combinations thereof, in accordance with some embodiments.

The gate 362 is formed using a deposition process and a planarization process, in accordance with some embodiments. The deposition process includes an atomic layer deposition (ALD) process and a chemical vapor deposition (CVD) process, in accordance with some embodiments. In some other embodiments, the gate 362 is deposited using a PVD process, a plating process, or the like, or a combination thereof.

As shown in FIGS. 3H, 4A, 4B, and 4C, a gate dielectric layer 344 is formed to cover the bottom of the trench T2, in accordance with some embodiments. The gate dielectric layer 344 further covers the inner wall of the trench T2, in accordance with some embodiments. The gate dielectric layers 344 and 342 are made of the same material, in accordance with some embodiments.

In some embodiments, a work function layer 354 is formed over the gate dielectric layer 344, in accordance with some embodiments. The work function layer 354 provides a desired work function for transistors to enhance device performance including improved threshold voltage.

In the embodiments of forming an N-type FinFET, the work function layer 354 can be an n-type metal capable of providing a work function value suitable for the device, such as equal to or less than about 4.5 eV. The n-type metal includes metal, metal carbide, metal nitride, or combinations thereof, in accordance with some embodiments. For example, the n-type metal is made of tantalum, tantalum nitride, or combinations thereof.

In some embodiments, a gate 364 (also called a metal gate material layer) is formed over the work function layer 354 to fill the trench T2, in accordance with some embodiments. The gate 364 covers the fin structures 114, in accordance with some embodiments. The gate 364 includes a suitable metal material, such as aluminum, tungsten, gold, platinum, cobalt, another suitable metal, an alloy thereof, or combinations thereof, in accordance with some embodiments.

The gate 364 is formed using a deposition process and a planarization process, in accordance with some embodiments. The deposition process includes an atomic layer deposition (ALD) process and a chemical vapor deposition (CVD) process, in accordance with some embodiments. In some other embodiments, the gate 364 is deposited using a PVD process, a plating process, or the like, or a combination thereof.

Figure 5A:
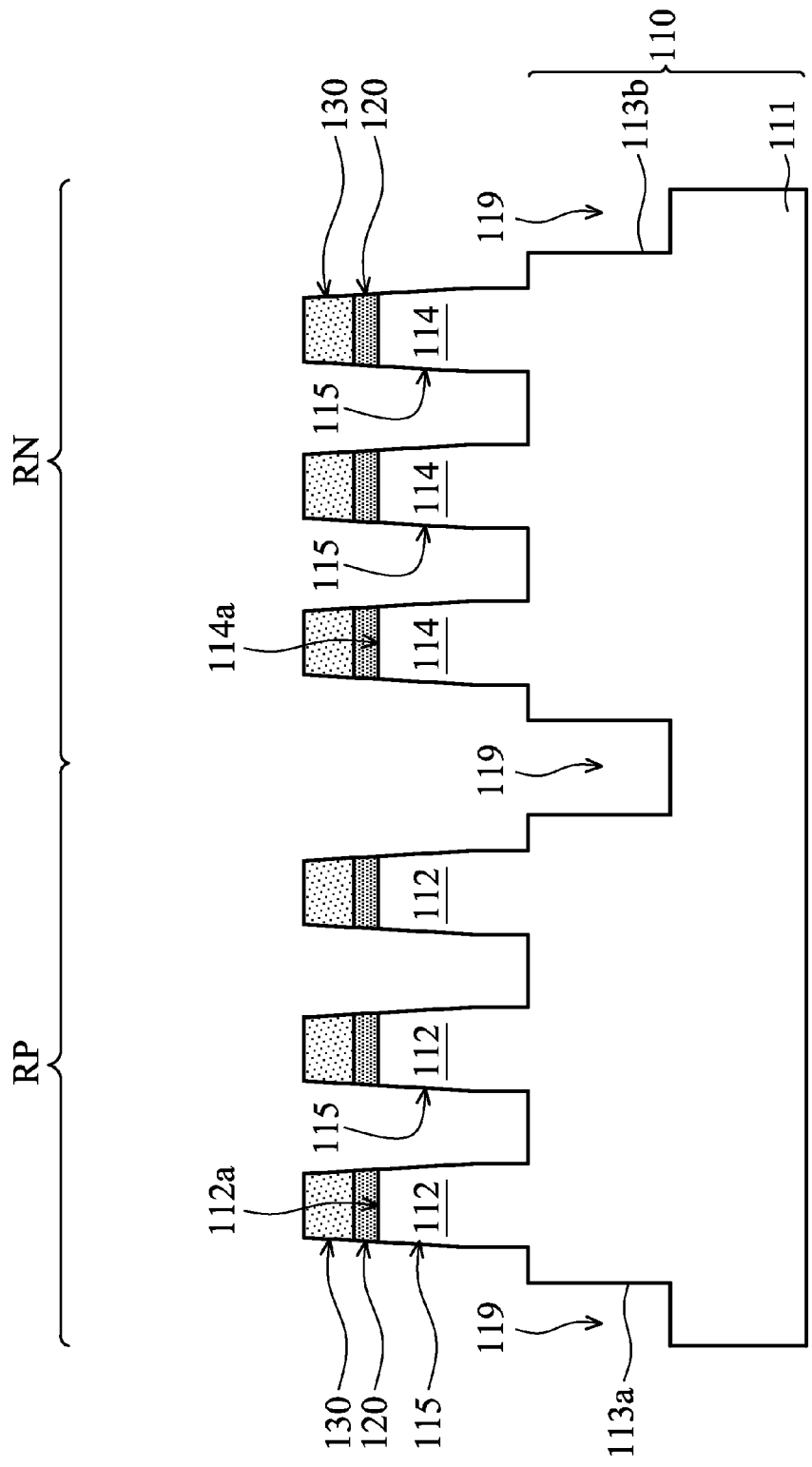
FIGS. 5A-5Q are cross-sectional views of various stages of a process for forming a semiconductor device structure, in accordance with some embodiments.
Figure 5B:
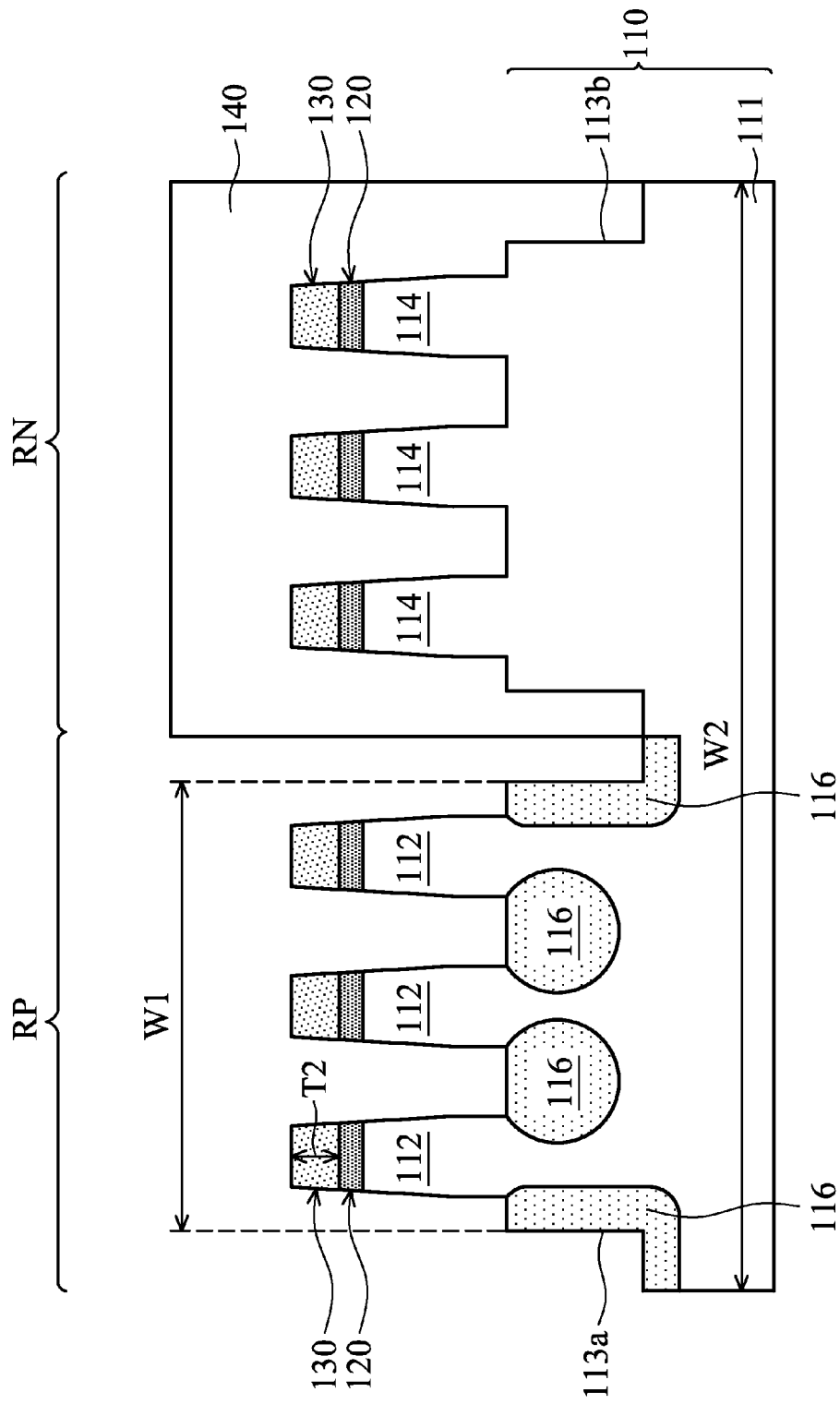
Figure 5C:
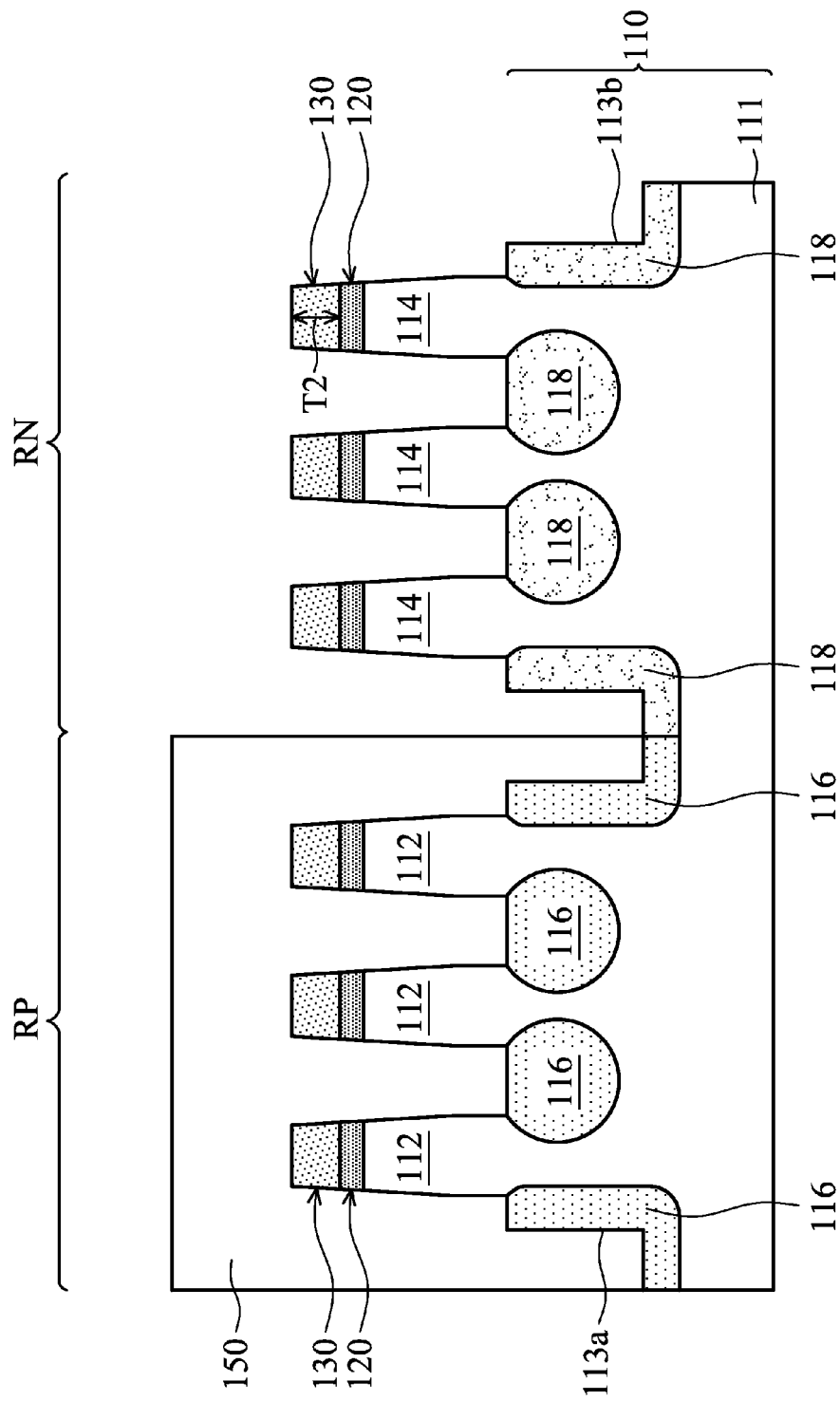
Figure 5D:
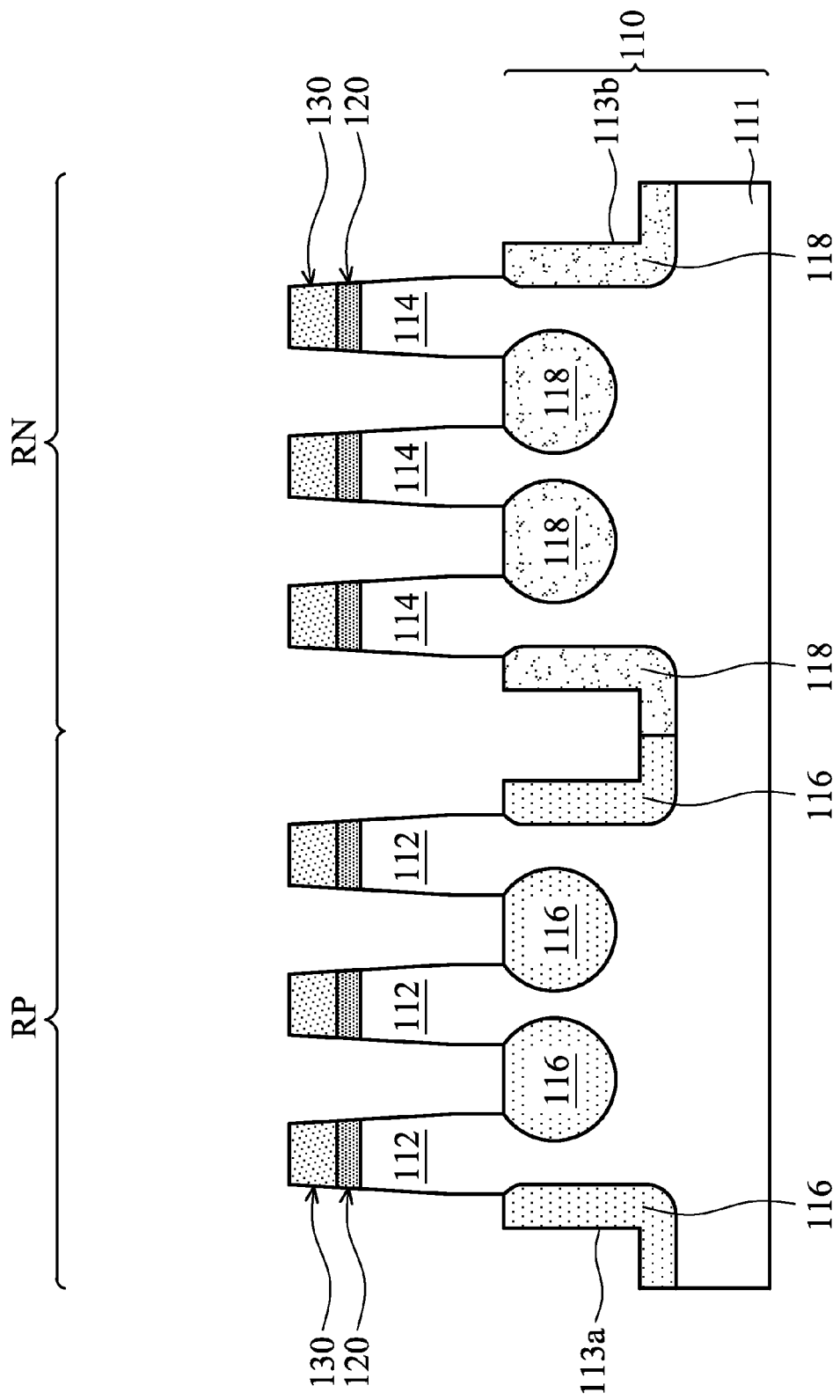
Figure 5E:
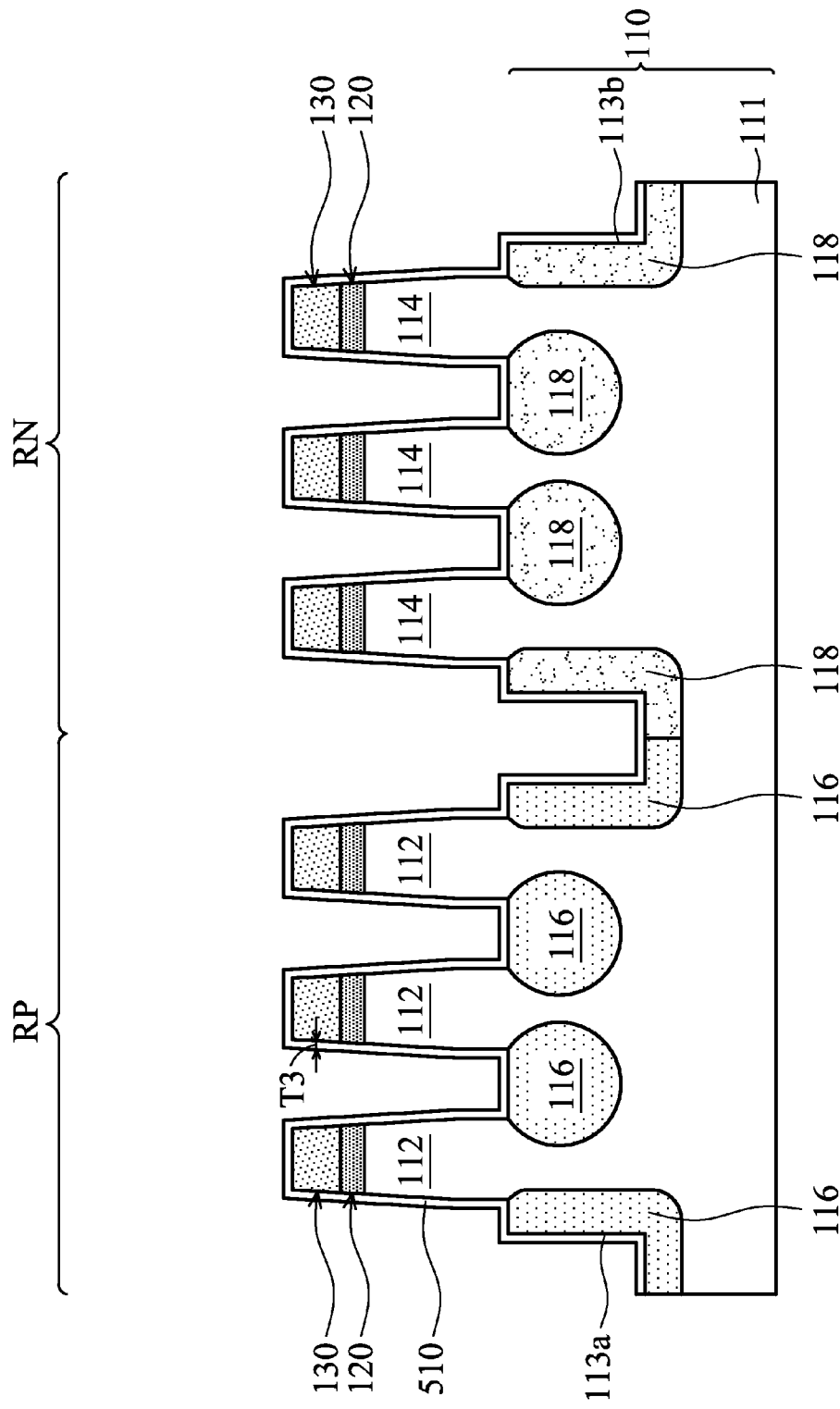
Figure 5F:
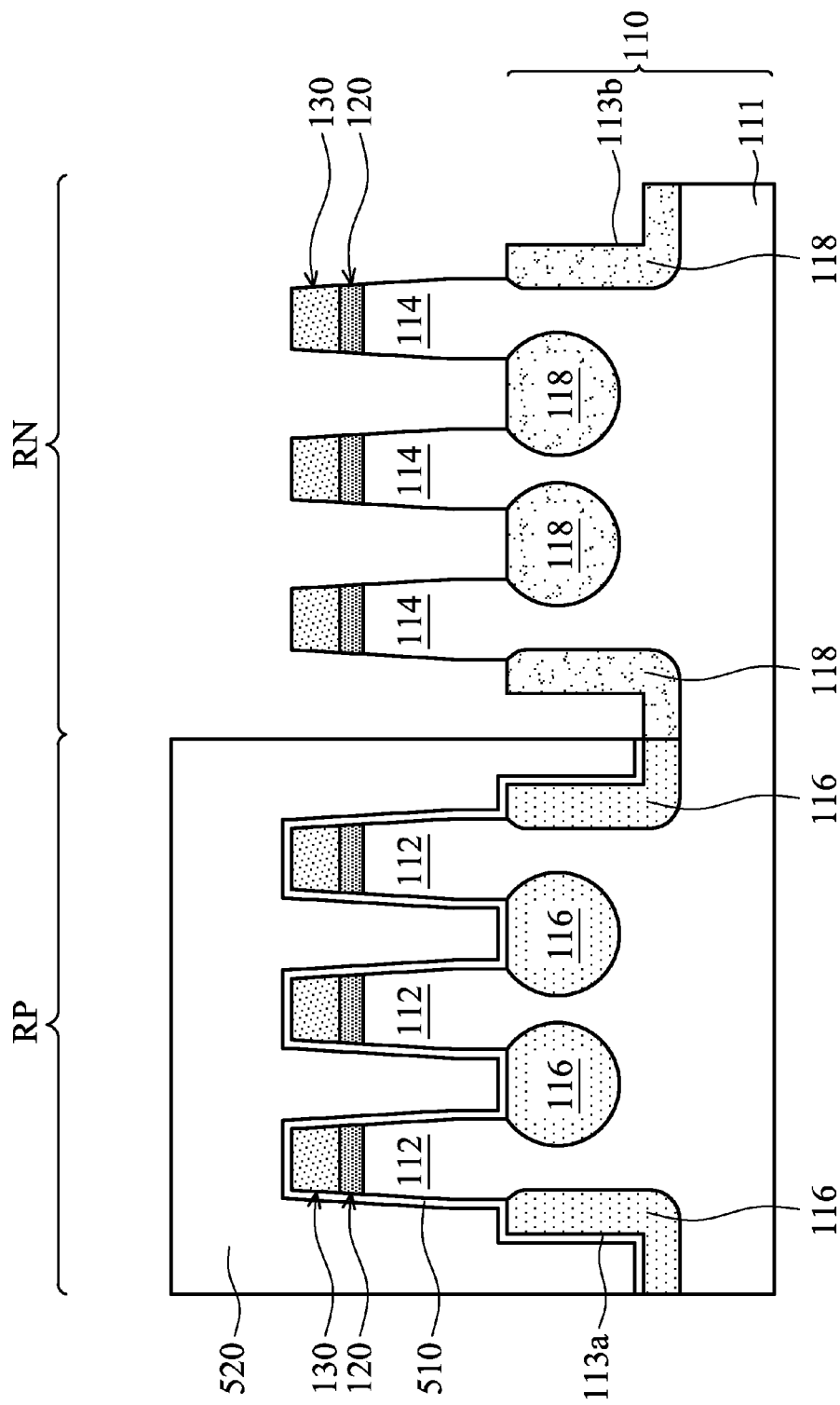
Figure 5G:
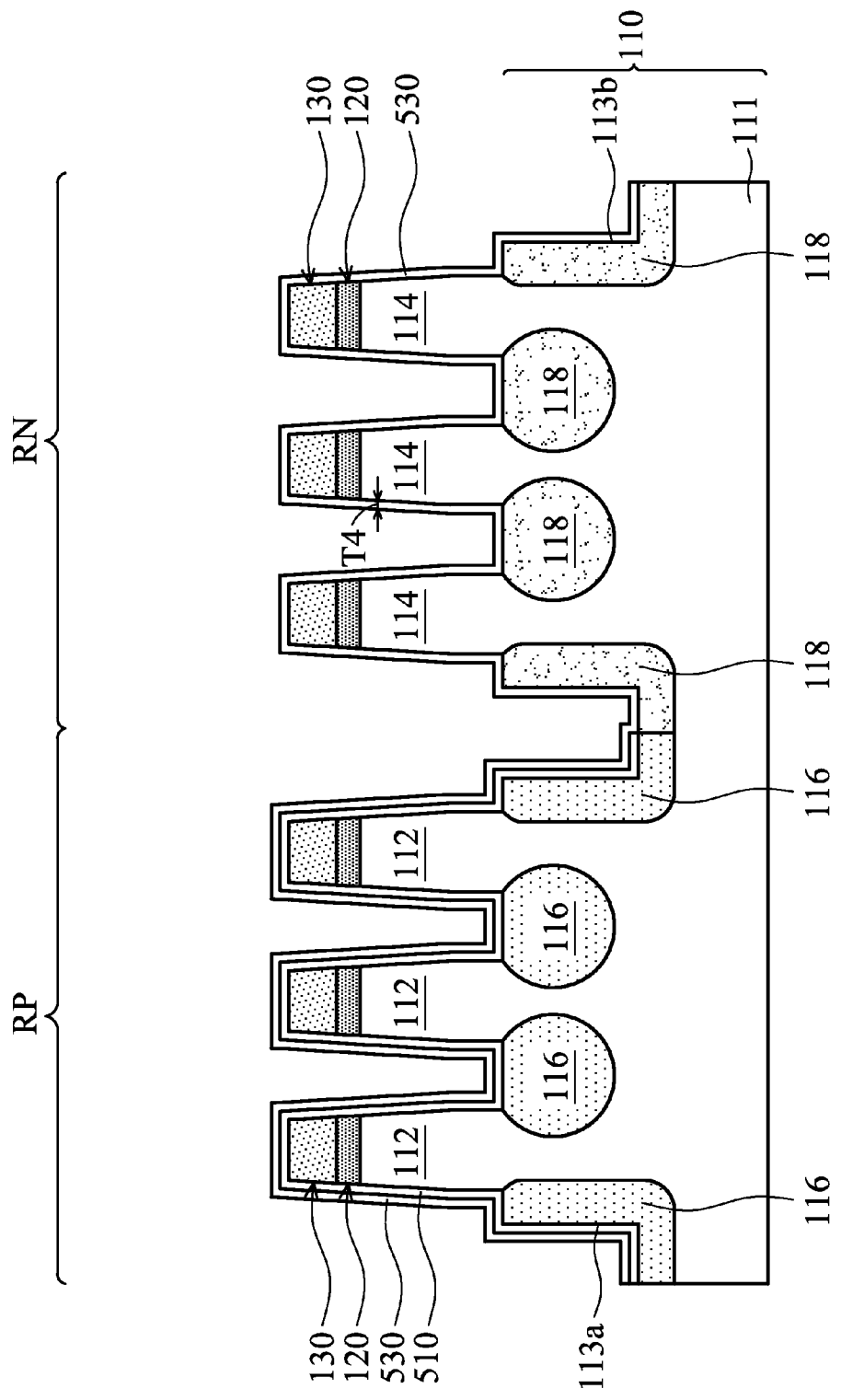
Figure 5H:
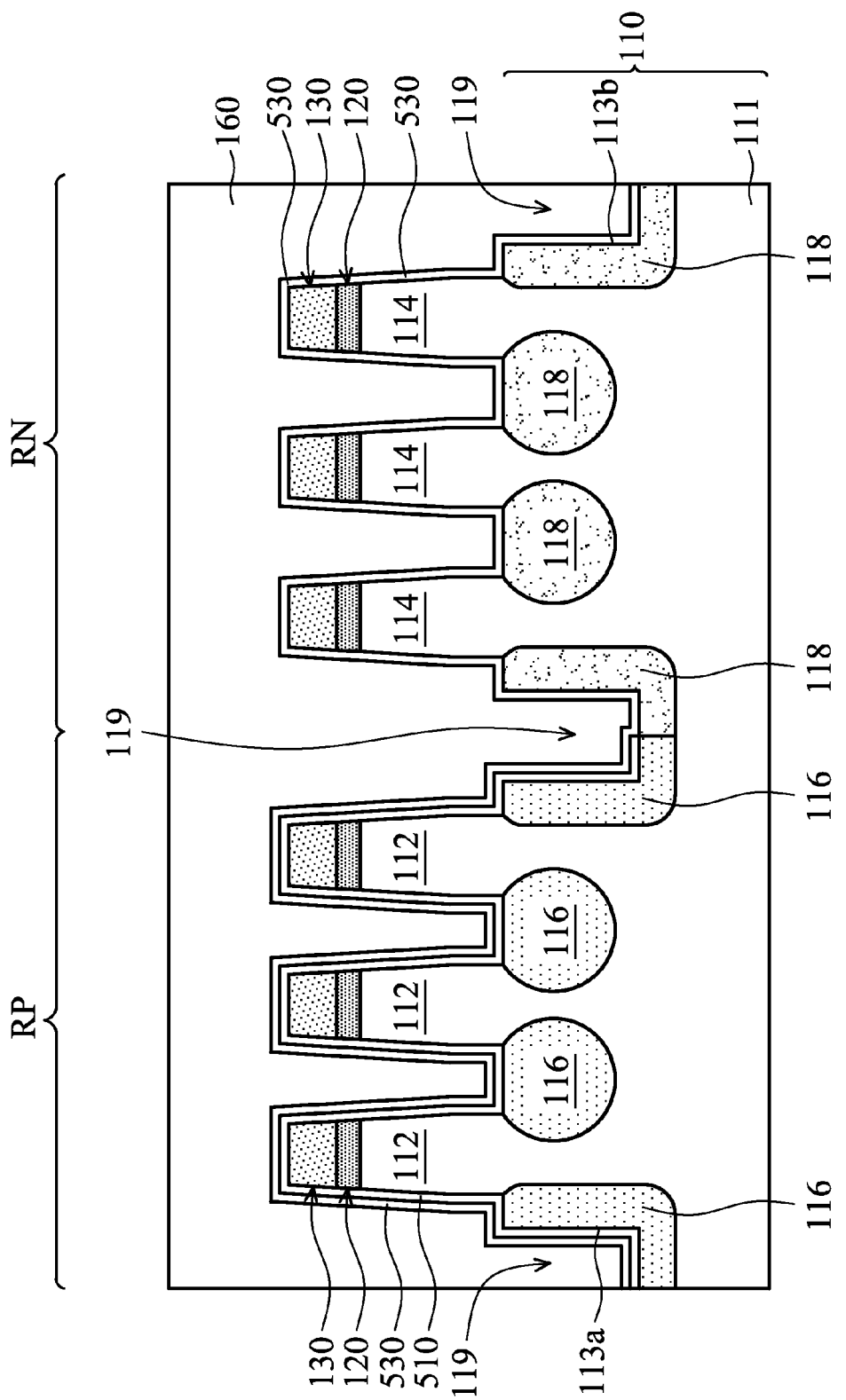
Figure 5I:
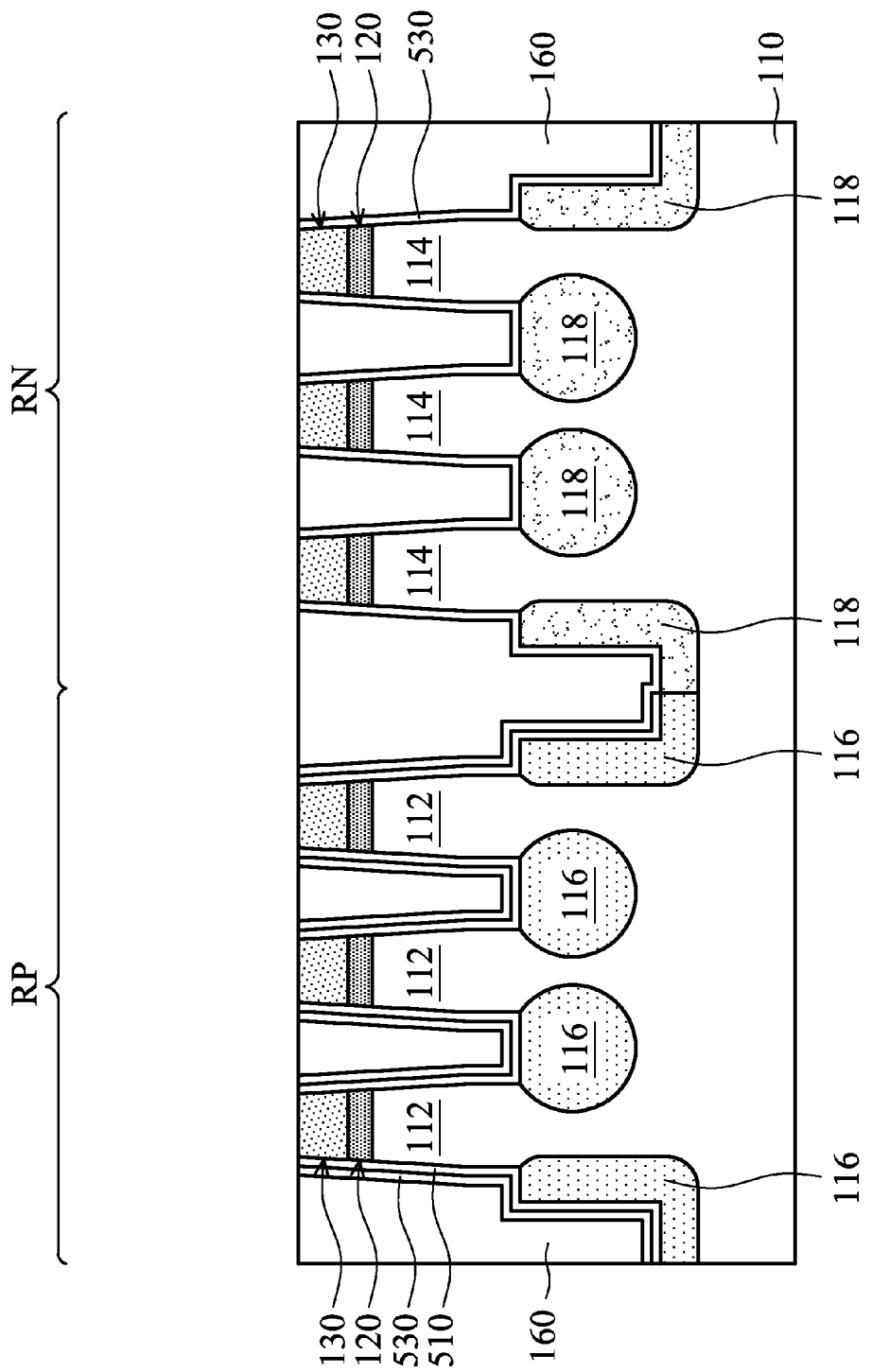
Figure 5J:
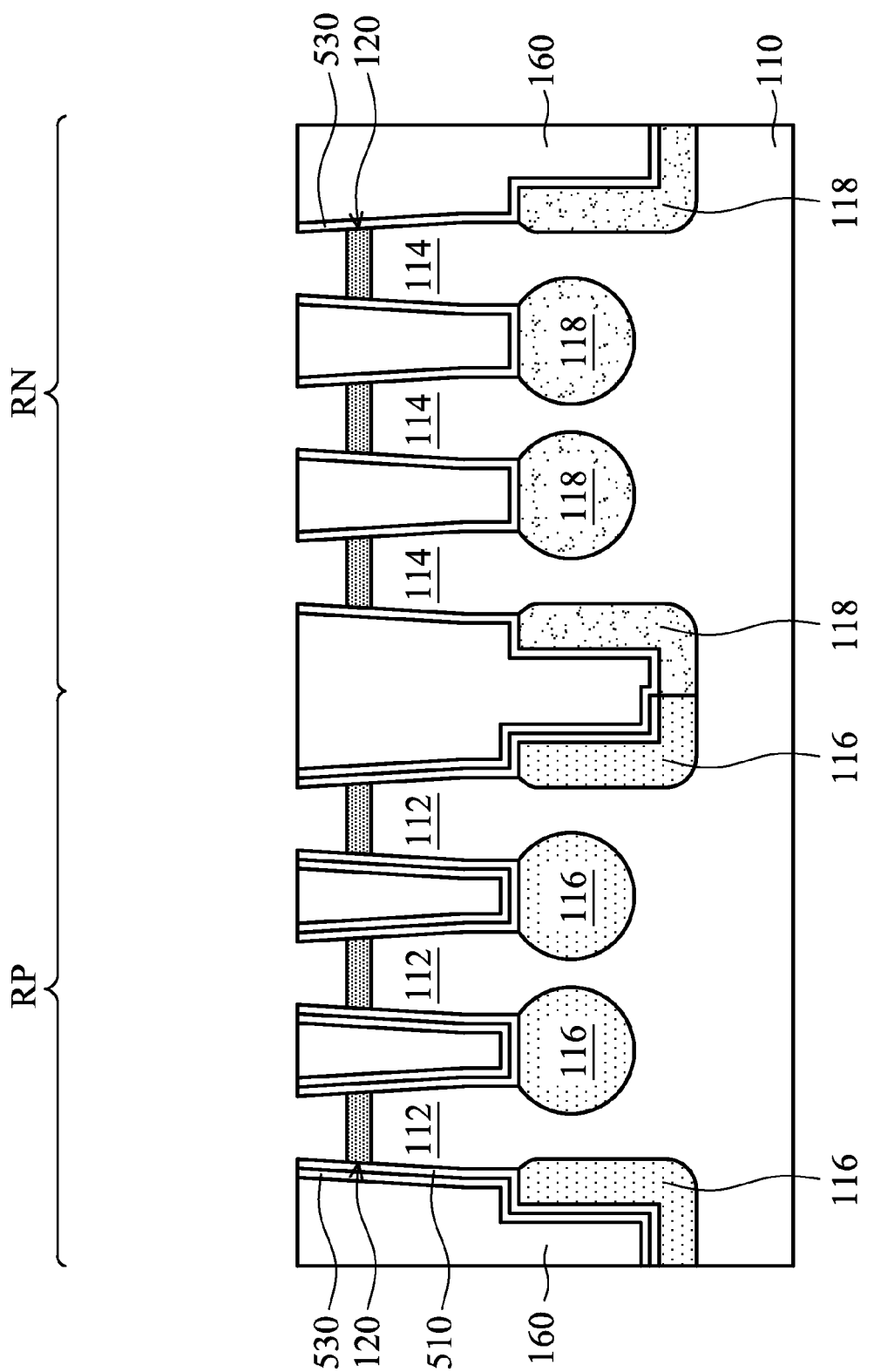
Figure 5K:
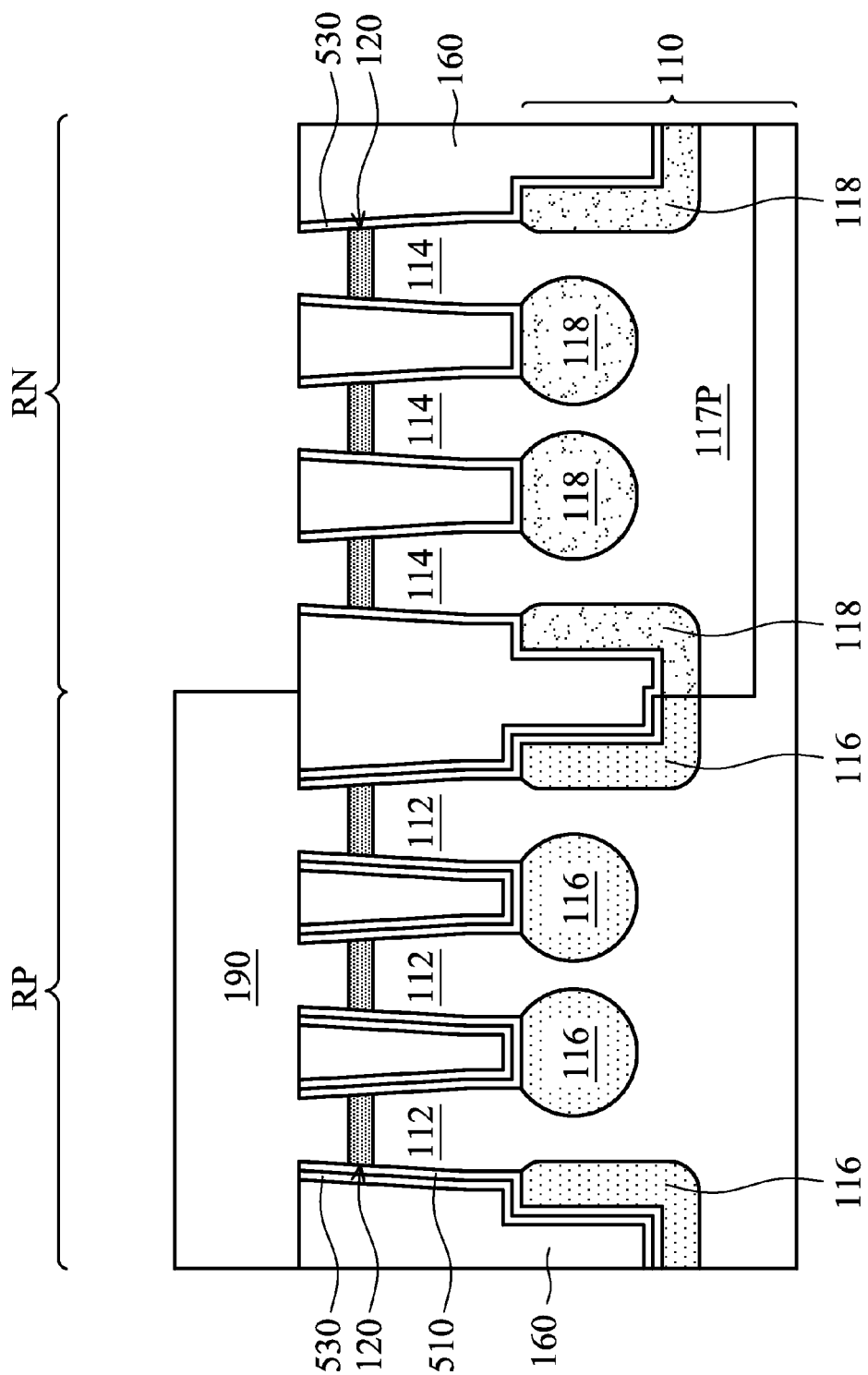
Figure 5L:
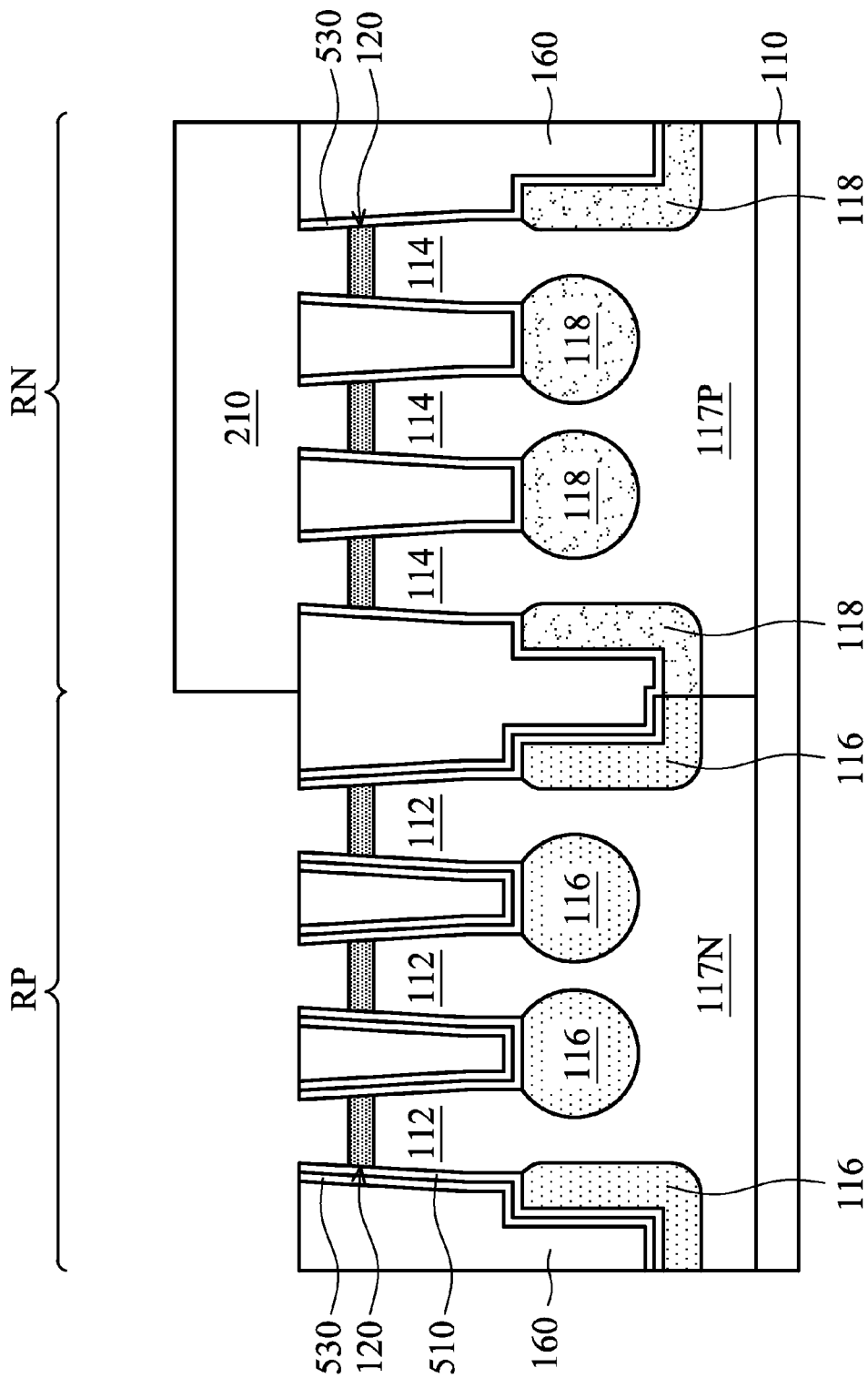
Figure 5M:
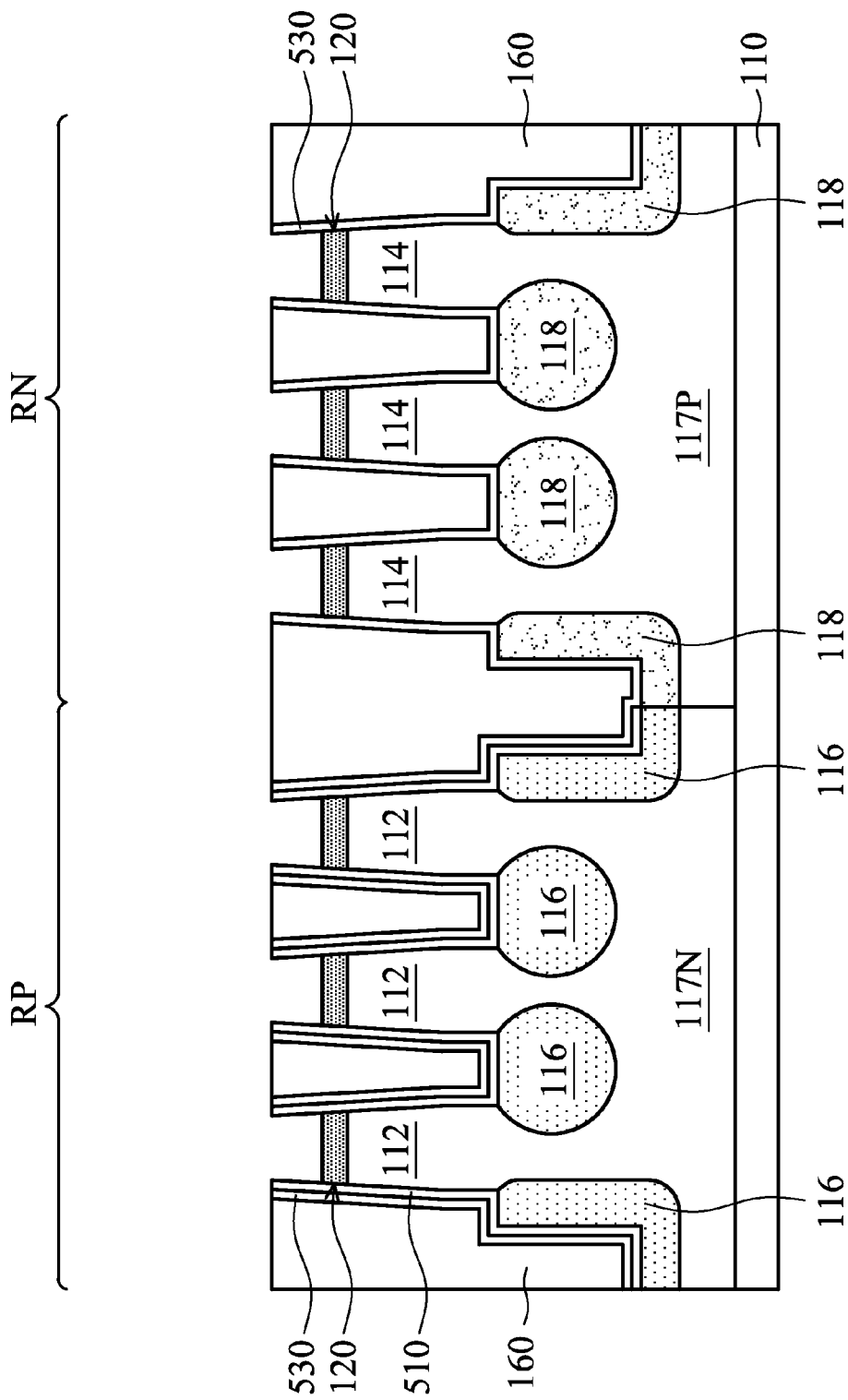
Figure 5N:
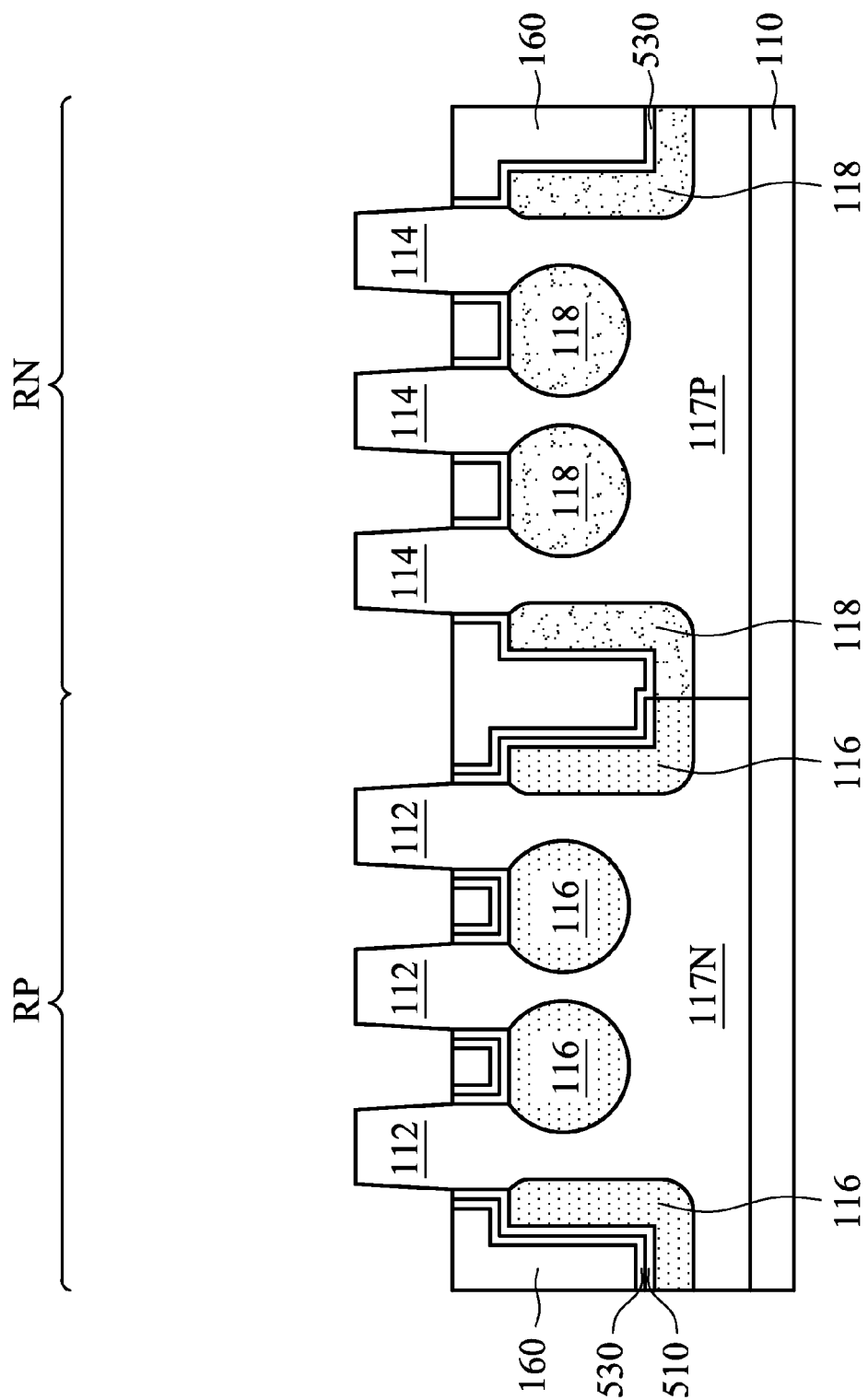
Figure 50:
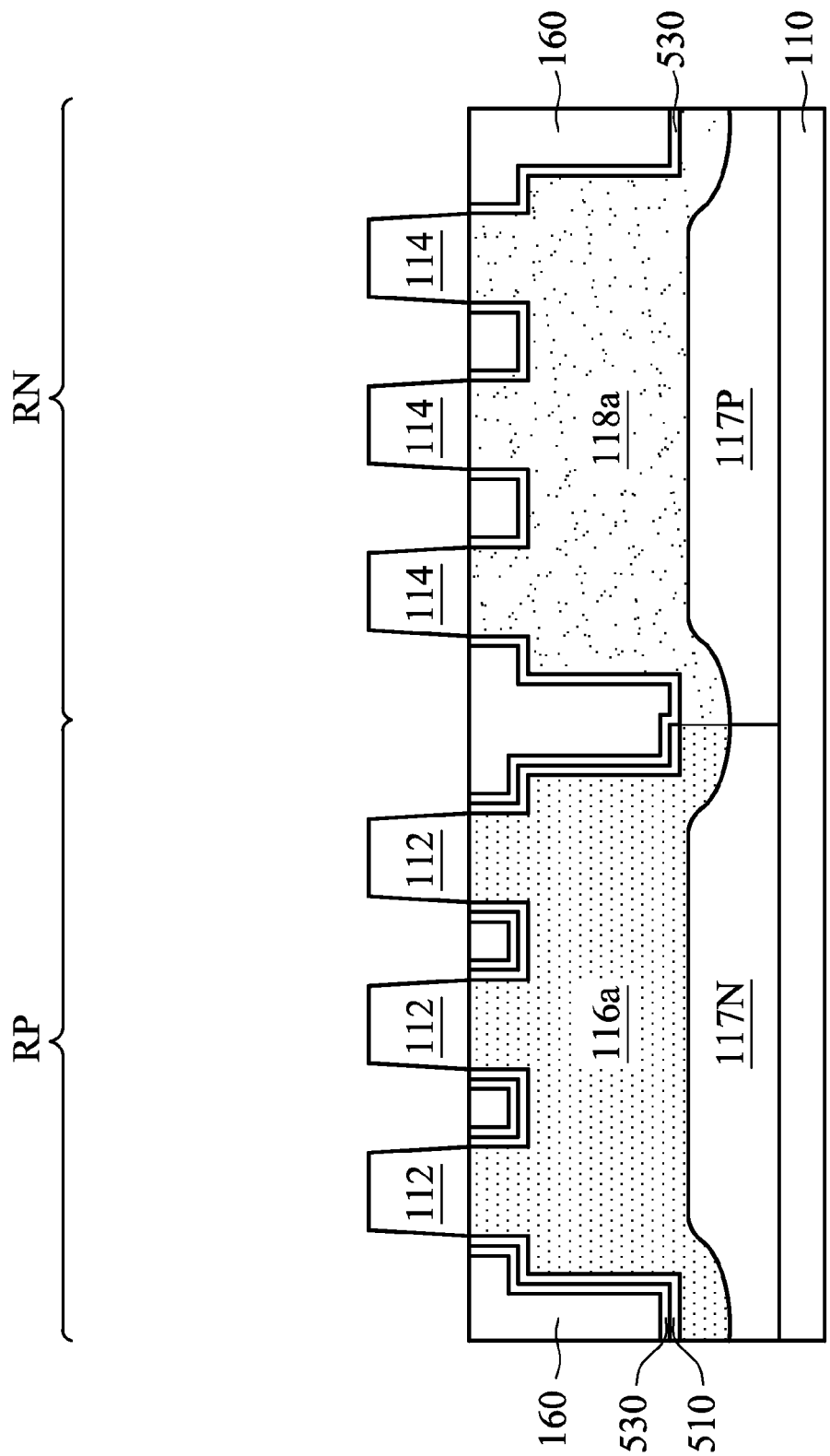
Figure 5P:
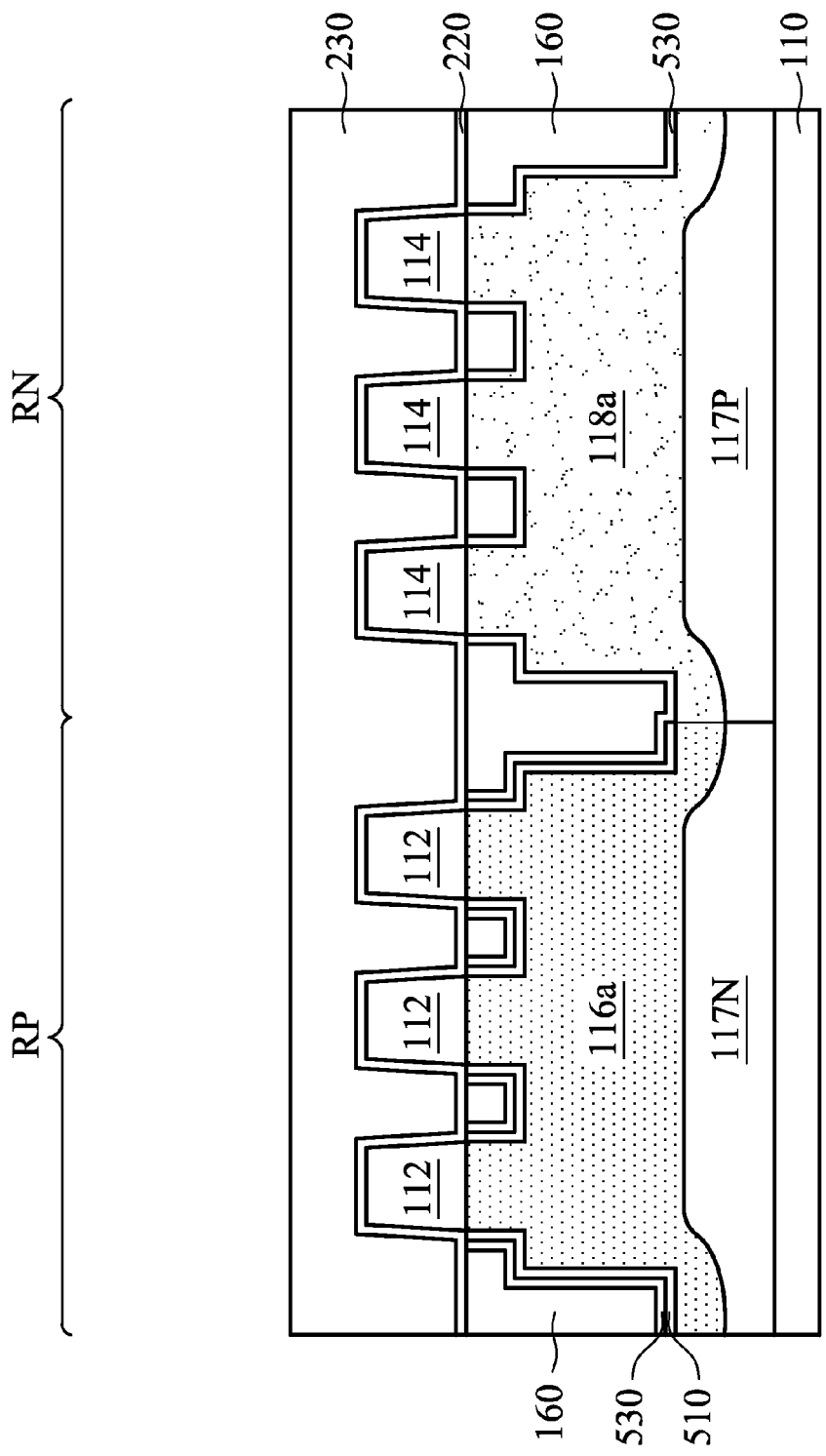
Figure 5Q:
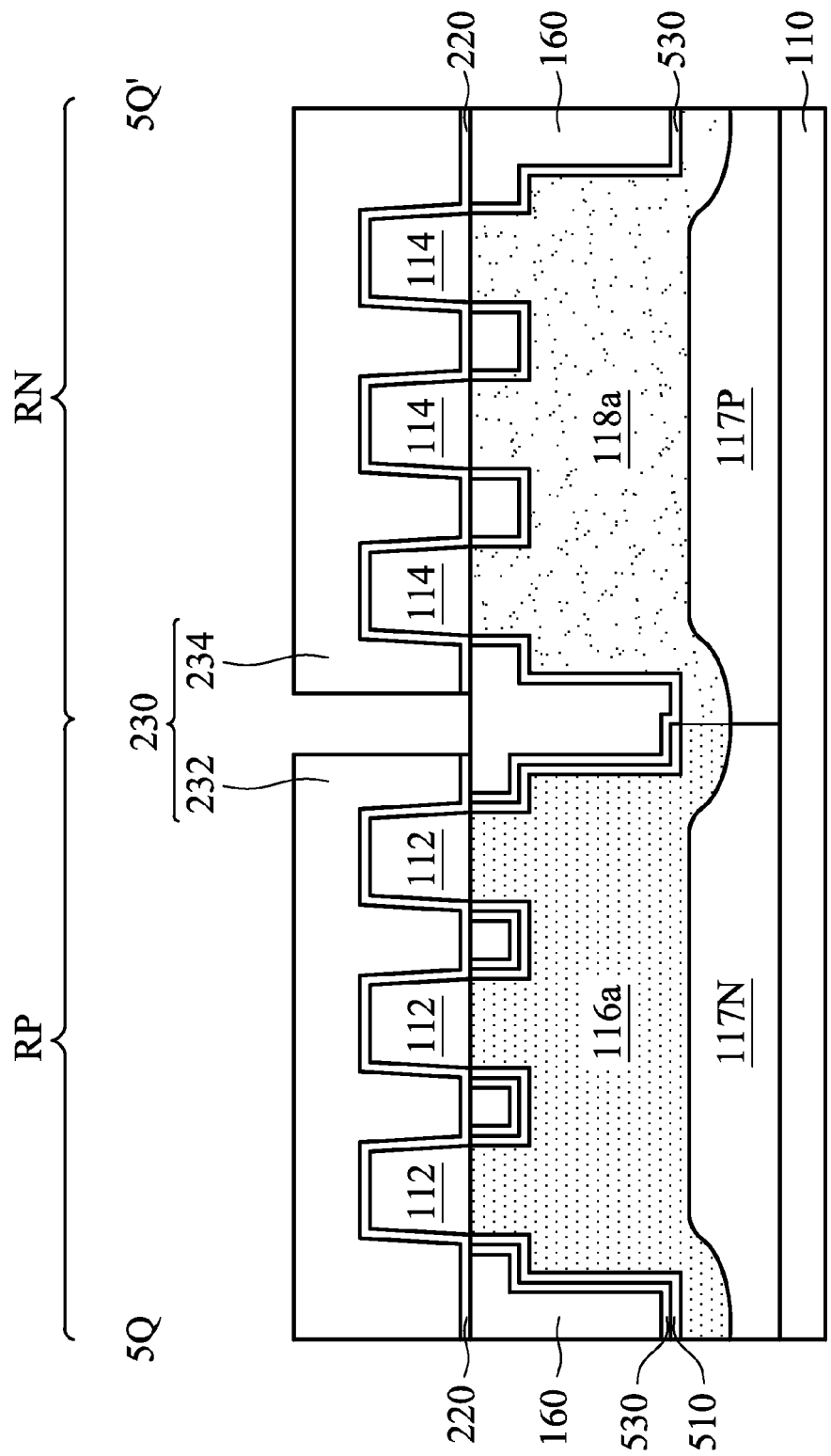

FIGS. 5A-5Q are cross-sectional views of various stages of a process for forming a semiconductor device structure, in accordance with some embodiments. As shown in FIG. 5A, a substrate 110 is provided, in accordance with some embodiments. The substrate 110 includes regions RP and RN, in accordance with some embodiments. The region RP is used to form a P-channel metal-oxide-semiconductor field-effect transistor (PMOSFET), in accordance with some embodiments. The region RN is used to form an N-channel metal-oxide-semiconductor field-effect transistor (NMOSFET), in accordance with some embodiments.

The substrate 110 has trenches 119, in accordance with some embodiments. The trenches 119 surround the regions RP and RN, in accordance with some embodiments. The substrate 110 has a lower portion 111 and upper portions 113a and 113b over the lower portions 111, in accordance with some embodiments. The upper portions 113a and 113b are located in the regions RP and RN, respectively, in accordance with some embodiments. The upper portions 113a and 113b are separated from each other by the trenches 119, in accordance with some embodiments.

As shown in FIG. 5A, fin structures 115 are formed over the substrate 110, in accordance with some embodiments. The fin structures 115 include the fin structures 112 and 114, in accordance with some embodiments. The fin structures 112 are located over the upper portion 113a, in accordance with some embodiments. The fin structures 114 are located over the upper portion 113b, in accordance with some embodiments. The fin structures 112 and 114 are spaced apart from each other, in accordance with some embodiments. In some embodiments, the fin structures 112 and 114 are formed by patterning the substrate 110.

As shown in FIG. 5A, a dielectric layer 120 is formed over upper surfaces 112a of the fin structures 112 and upper surfaces 114a of the fin structures 114, in accordance with some embodiments. The dielectric layer 120 includes a dielectric material, in accordance with some embodiments. The dielectric material includes oxides, such as silicon oxide, in accordance with some embodiments.

As shown in FIG. 5A, a mask layer 130 is formed over the dielectric layer 120, in accordance with some embodiments. The mask layer 130 includes a dielectric material, in accordance with some embodiments. The dielectric material includes nitrides, such as silicon nitride, in accordance with some embodiments. The dielectric layer 120 and the mask layer 130 are made of different materials, in accordance with some embodiments.

As shown in FIG. 5B, a mask layer 140 is formed over the region RN of the substrate 110, in accordance with some embodiments. The mask layer 140 covers the fin structures 114, the dielectric layer 120 and the mask layer 130 over the region RN, and the upper portion 113b, in accordance with some embodiments. The mask layer 140 is configured to be an implantation mask in a subsequent implantation process, in accordance with some embodiments.

As shown in FIG. 5B, an implantation process is performed on the substrate 110 exposed by the mask layers 130 and 140 to form doped regions 116 in the substrate 110, in accordance with some embodiments. The doped regions 116 are adjacent to the fin structures 112, in accordance with some embodiments. The doped regions 116 are formed in the upper portion 113a, in accordance with some embodiments. A portion of the doped regions 116 are formed in the lower portion 111, in accordance with some embodiments.

The width W1 of the upper portion 113a (or 113b) is less than the width W2 of the lower portion 111, in accordance with some embodiments. The implantation process includes an ion implantation process, in accordance with some embodiments. The implantation process is performed using the mask layers 130 and 140 as an implantation mask, in accordance with some embodiments. The doped regions 116 are doped with N-type dopants, in accordance with some embodiments. The N-type dopants include phosphorus (P) and/or arsenic (As), in accordance with some embodiments.

The implantation process is performed at an energy of about 1 keV to about 13 keV, in accordance with some embodiments. The implantation energy and the thickness T2 of the mask layer 130 are adjustable to prevent the dopants from penetrating through the mask layer 130, in accordance with some embodiments. The implantation process is performed at a dose of about $1E13/cm^2$ to about $5E14/cm^2$, in accordance with some embodiments. The implantation process is performed at room temperature or a higher temperature, such as at about 100° C. to about 500° C., in accordance with some embodiments.

As shown in FIG. 5C, the mask layer 140 is removed, in accordance with some embodiments. The mask layer 140 is removed using a photolithography process, a wet etching process, or a dry etching process, in accordance with some embodiments. As shown in FIG. 5C, a mask layer 150 is formed over the region RP of the substrate 110, in accordance with some embodiments.

The mask layer 150 covers the fin structures 112 and the dielectric layer 120 and the mask layer 130 over the region RP, in accordance with some embodiments. The mask layer 150 is configured to be an implantation mask in a subsequent implantation process, in accordance with some embodiments.

The mask layer 150 includes a photoresist material, in accordance with some embodiments. The mask layer 150 is formed by a coating process and a photolithography process, in accordance with some embodiments. The mask layer 150 includes an amorphous carbon material, which is able to sustain high temperatures from about 100° C. to about 500° C., in accordance with some embodiments. The mask layer 150 is formed by a deposition process, a photolithography process, and an etching process, in accordance with some embodiments.

As shown in FIG. 5C, an implantation process is performed on the substrate 110 exposed by the mask layers 130 and 150 to form doped regions 118 in the substrate 110, in accordance with some embodiments. The doped regions 118 are adjacent to the fin structures 114, in accordance with some embodiments. The doped regions 118 are formed in the upper portions 113b, in accordance with some embodiments.

A portion of the doped regions 118 are formed in the lower 111, in accordance with some embodiments. The implantation process includes an ion implantation process, in accordance with some embodiments. The implantation process is performed using the mask layers 130 and 150 as an implantation mask, in accordance with some embodiments. The doped regions 118 are doped with P-type dopants, in accordance with some embodiments. The P-type dopants include boron (B) and/or boron fluoride ($BF_2$), in accordance with some embodiments.

The implantation process is performed at an energy of about 1 keV to about 7 keV, in accordance with some embodiments. The implantation energy and the thickness T2 of the mask layer 130 are adjustable to prevent the dopants from penetrating through the mask layer 130, in accordance with some embodiments. The implantation process is performed at a dose of about $1E13/cm^2$ to about $5E14/cm^2$, in accordance with some embodiments. The implantation process is performed at room temperature or a higher temperature, such as at about 100° C. to about 500° C., in accordance with some embodiments.

As shown in FIG. 5D, the mask layer 150 is removed, in accordance with some embodiments. The mask layer 150 is removed using a photolithography process, a wet etching process, or a dry etching process, in accordance with some embodiments. As shown in FIG. 5E, a diffusion layer 510 is formed over the substrate 110 to cover the substrate 110 exposed by the fin structures 112, in accordance with some embodiments.

The diffusion layer 510 covers the dielectric layer 120, the mask layer 130, the fin structures 112 and 114, and the substrate 110, in accordance with some embodiments. The diffusion layer 510 conformally covers the sidewalls 112b of the fin structures 112, the upper surface P1 and the sidewalls S1 of the upper portion 113a, and the upper surface P3 of the lower portion 111, in accordance with some embodiments. The diffusion layer 510 is in direct contact with the substrate 110 and the fin structure 112, in accordance with some embodiments.

The diffusion layer 510 is configured to be a solid phase diffusion source, in accordance with some embodiments. The diffusion layer 510 includes a phosphor-silicate glass (PSG) layer or another suitable material layer with N-type dopants, in accordance with some embodiments. The diffusion layer 510 has a thickness T3 ranging from about 1 nm to about 5 nm, in accordance with some embodiments.

The diffusion layer 510 is formed using a chemical vapor deposition process, in accordance with some embodiments. In some embodiments, before the formation of the diffusion layer 510, a cleaning process is performed to remove the native oxide layer over the substrate 110 and the fin structures 112 and 114.

As shown in FIG. 5F, a mask layer 520 is formed over the region RP to cover the diffusion layer 510, in accordance with some embodiments. The mask layer 520 includes a photoresist material, in accordance with some embodiments. The mask layer 520 is formed using a coating process and a photolithography process, in accordance with some embodiments. As shown in FIG. 5F, the diffusion layer 510 over the region RN is removed, in accordance with some embodiments. The removal process includes a dry etching process, a wet etching process, or another suitable process.

As shown in FIG. 5G, the mask layer 520 is removed, in accordance with some embodiments. As shown in FIG. 5G, a diffusion layer 530 is formed over the substrate 110 to cover the substrate 110 exposed by the fin structures 114, in accordance with some embodiments. The diffusion layer 530 covers the dielectric layer 120, the mask layer 130, the diffusion layer 510, the fin structures 114, and the substrate 110, in accordance with some embodiments.

The diffusion layer 530 conformally covers the sidewalls 114b of the fin structures 114, the upper surface P2 and the sidewalls S2 of the upper portion 113b, and the upper surface P3 of the lower portion 111, in accordance with some embodiments. The diffusion layer 530 is in direct contact with the substrate 110 and the fin structure 114, in accordance with some embodiments.

The diffusion layer 530 is configured to be a solid phase diffusion source, in accordance with some embodiments. The diffusion layer 530 includes a borosilicate glass (BSG)

layer or another suitable material layer with P-type dopants, in accordance with some embodiments. The diffusion layer 530 has a thickness T4 ranging from about 1 nm to about 5 nm, in accordance with some embodiments. The diffusion layer 530 is formed using a chemical vapor deposition process, in accordance with some embodiments.

As shown in FIG. 5H, an isolation layer 160 is formed over the diffusion layer 530, in accordance with some embodiments. The isolation layer 160 covers the dielectric layer 120, the mask layer 130, the fin structures 112 and 114, and the substrate 110, in accordance with some embodiments. The isolation layer 160 fills the trenches 119, in accordance with some embodiments. The isolation layer 160 includes silicon oxide or another suitable dielectric material, in accordance with some embodiments.

The isolation layer 160 is formed by a chemical vapor deposition process, such as a flowable chemical vapor deposition process, in accordance with some embodiments. Thereafter, an annealing process is performed on the isolation layer 160, in accordance with some embodiments. The annealing process is performed at about 350° C. to about 600° C. for about 10 minutes to about 2 hours, in accordance with some embodiments.

As shown in FIG. 5I, a planarization process is performed to remove a portion of the isolation layer 160 and portions of the diffusion layers 510 and 530, in accordance with some embodiments. The mask layer 130 is exposed by the isolation layer 160, in accordance with some embodiments.

The planarization process includes a chemical mechanical polishing (CMP) process, in accordance with some embodiments. Thereafter, an annealing process is performed on the isolation layer 160, in accordance with some embodiments. The annealing process is performed at about 350° C. to about 600° C. for about 10 minutes to about 2 hours, in accordance with some embodiments.

As shown in FIG. 5J, the mask layer 130 is removed, in accordance with some embodiments. The removal process includes a wet etching process, in accordance with some embodiments. As shown in FIG. 5K, a mask layer 190 is formed over the region RP to cover the fin structures 112 and the substrate 110 in the region RP, in accordance with some embodiments. The mask layer 190 includes a photoresist material, in accordance with some embodiments. The mask layer 190 is formed using a coating process and a photolithography process, in accordance with some embodiments.

As shown in FIG. 5K, a P-well 117P is formed in the substrate 110 in the region RN, in accordance with some embodiments. The P-well 117P is formed using an ion implantation process, in accordance with some embodiments. The P-well 117P is doped with P-type dopants, in accordance with some embodiments. The P-type dopants include boron (B) and/or boron fluoride ($BF_2$), in accordance with some embodiments.

As shown in FIG. 5L, the mask layer 190 is removed, in accordance with some embodiments. The removal process includes a photolithography process, in accordance with some embodiments. As shown in FIG. 5L, a mask layer 210 is formed over the region RN to cover the fin structures 114 and the substrate 110 in the region RN, in accordance with some embodiments. The mask layer 210 includes a photoresist material, in accordance with some embodiments. The mask layer 210 is formed using a coating process and a photolithography process, in accordance with some embodiments.

As shown in FIG. 5L, an N-well 117N is formed in the substrate 110 in the region RP, in accordance with some embodiments. The N-well 117N is formed using an ion implantation process, in accordance with some embodiments. The N-well 117N is doped with N-type dopants, in accordance with some embodiments. The N-type dopants include phosphorus (P) and/or arsenic (As), in accordance with some embodiments.

As shown in FIG. 5M, the mask layer 210 is removed, in accordance with some embodiments. The removal process includes a photolithography process, in accordance with some embodiments. As shown in FIG. 5N, the dielectric layer 120, an upper portion of the isolation layer 160, and upper portions of the diffusion layers 510 and 530 are removed, in accordance with some embodiments. The removal process includes a dry etching process and/or a wet etching process, in accordance with some embodiments.

As shown in FIG. 5O, an annealing process is performed to enlarge the doped regions 116 and 118, in accordance with some embodiments. The annealing process is performed at from about 1000° C. to about 1100° C. for about 1 second to about 10 seconds, in accordance with some embodiments.

After the annealing process, the doped regions 116 are merged into a merged doped region 116a, and the doped regions 118 are merged into a merged doped region 118a, in accordance with some embodiments. In some embodiments, an average dopant concentration of the merged doped region 116a or 118a ranges from about $1E18$ cm$^{-3}$ to about $1E19^{-3}$.

In the merged doped region 116a, since the merged doped region 116a is formed from the doped regions 116, the dopants remaining in the substrate 110 exposed by the fin structures 112 (i.e. the position of the doped regions 116) are greater in number than the dopants diffusing into the substrate 110 covered by the fin structures 112.

Therefore, a dopant concentration of the merged doped region 116a exposed by the fin structures 112 is greater than a dopant concentration of the merged doped region 116a covered by the fin structures 112, in accordance with some embodiments. Similarly, a dopant concentration of the merged doped region 118a exposed by the fin structures 114 is greater than a dopant concentration of the merged doped region 118a covered by the fin structures 114, in accordance with some embodiments.

In the annealing process, a portion of the dopants in the diffusion layer 510 may diffuse into the merged doped region 116a to increase the dopant concentration of the merged doped region 116a, in accordance with some embodiments. Similarly, in the annealing process, a portion of the dopants in the diffusion layer 530 may diffuse into the merged doped region 118a to increase the dopant concentration of the merged doped region 118a, in accordance with some embodiments. In some embodiments, an average dopant concentration of the fin structures 112 or 114 ranges from about $1E16$ cm$^{-3}$ to about $1E17^{-3}$.

As shown in FIG. 5P, a dummy gate dielectric layer 220 is formed over the fin structures 112 and 114 and the isolation layer 160, in accordance with some embodiments. The dummy gate dielectric layer 220 is made of silicon oxide, in accordance with some embodiments. As shown in FIG. 5P, a dummy gate material layer 230 is formed over the dummy gate dielectric layer 220, in accordance with some embodiments. The dummy gate material layer 230 is made of polysilicon, in accordance with some embodiments.

Figure 6A:
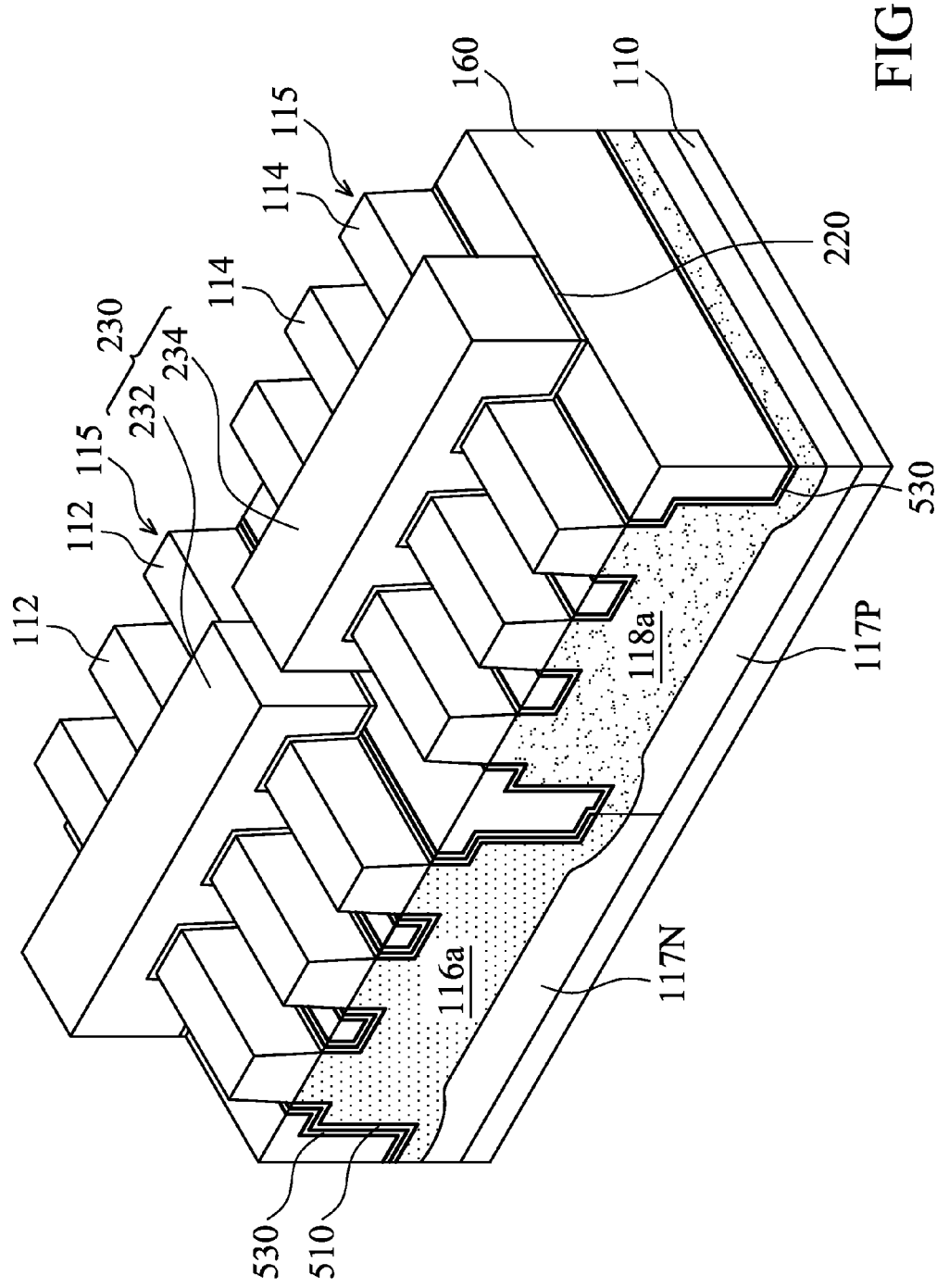
FIG. 6A is a perspective view of the semiconductor device structure of FIG. 5Q, in accordance with some embodiments.
Figure 6B:
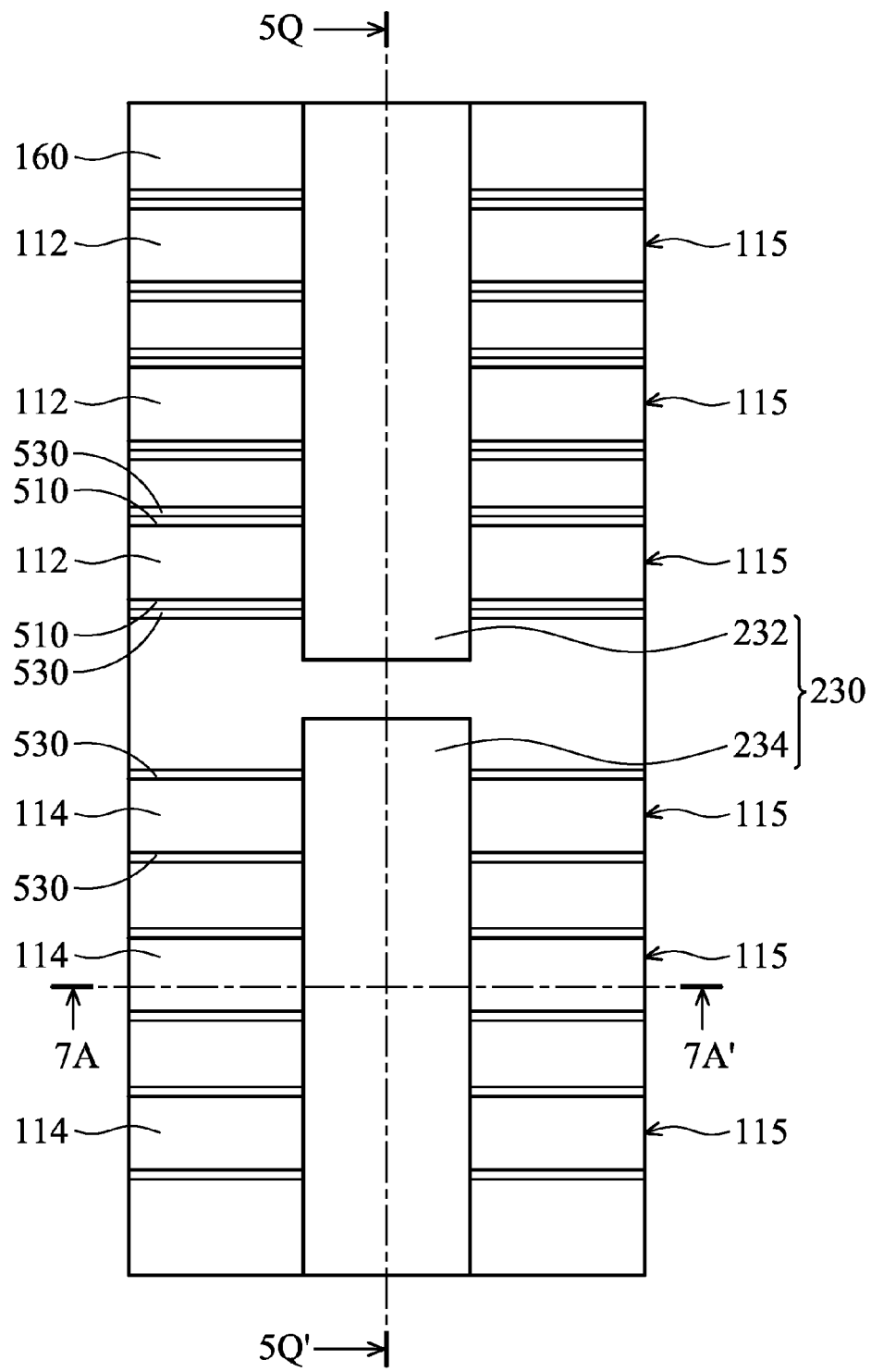
FIG. 6B is a top view of the semiconductor device structure of FIG. 5Q, in accordance with some embodiments.

FIG. 6A is a perspective view of the semiconductor device structure of FIG. 5Q, in accordance with some embodiments. FIG. 6B is a top view of the semiconductor device structure of FIG. 5Q, in accordance with some embodiments. FIG. 5Q is a cross-sectional view illustrating the semiconductor device structure along a sectional line 5Q-5Q' in FIG. 6B, in accordance with some embodiments.

Figure 7A:
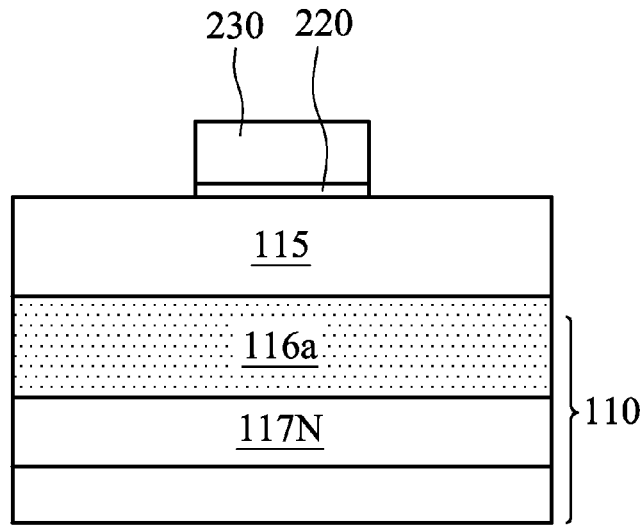
FIGS. 7A-7B are cross-sectional views of various stages of a process for forming a semiconductor device structure, in accordance with some embodiments.

FIG. 7A is a cross-sectional view illustrating the semiconductor device structure along a sectional line 7A-7A' in FIG. 6B, in accordance with some embodiments.

As shown in FIGS. 5Q, 6A, 6B, and 7A, portions of the dummy gate dielectric layer 220 and the dummy gate material layer 230 are removed, in accordance with some embodiments. After the removal process, the dummy gate material layer 230 includes dummy gates 232 and 234, in accordance with some embodiments. The dummy gate 232 is over the fin structures 112, in accordance with some embodiments. The dummy gate 234 is over the fin structures 114, in accordance with some embodiments. The removal process includes a photolithography process and an etching process, in accordance with some embodiments.

Figure 7B:
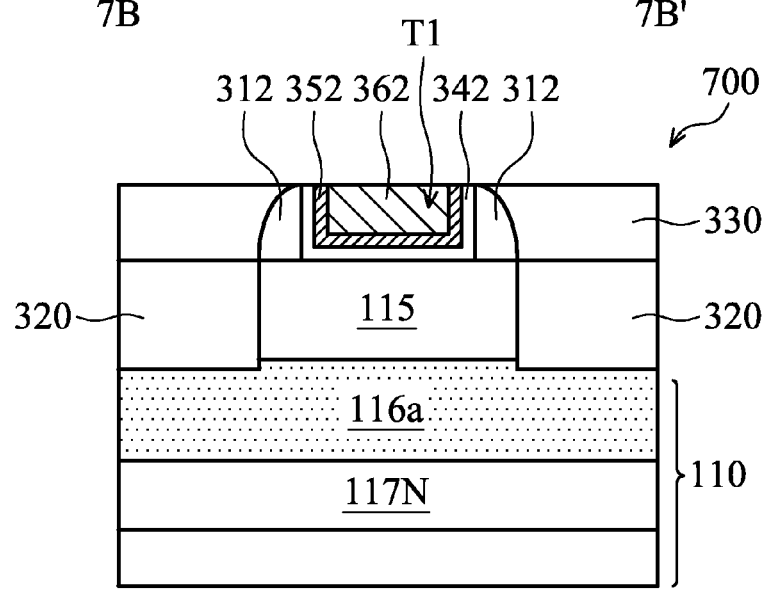
Figure 8A:
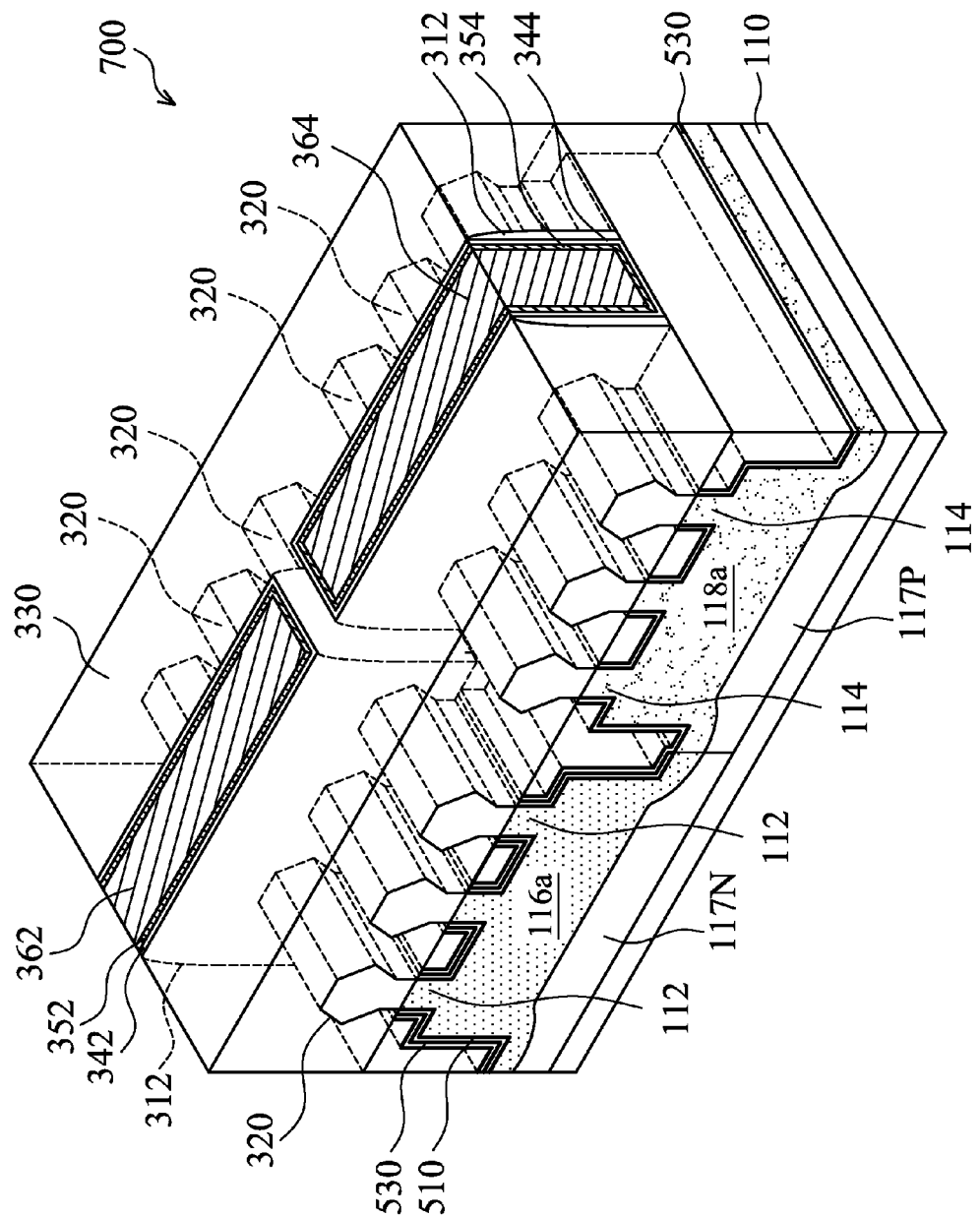
FIG. 8A is a perspective view of the semiconductor device structure of FIG. 7B, in accordance with some embodiments.
Figure 8B:
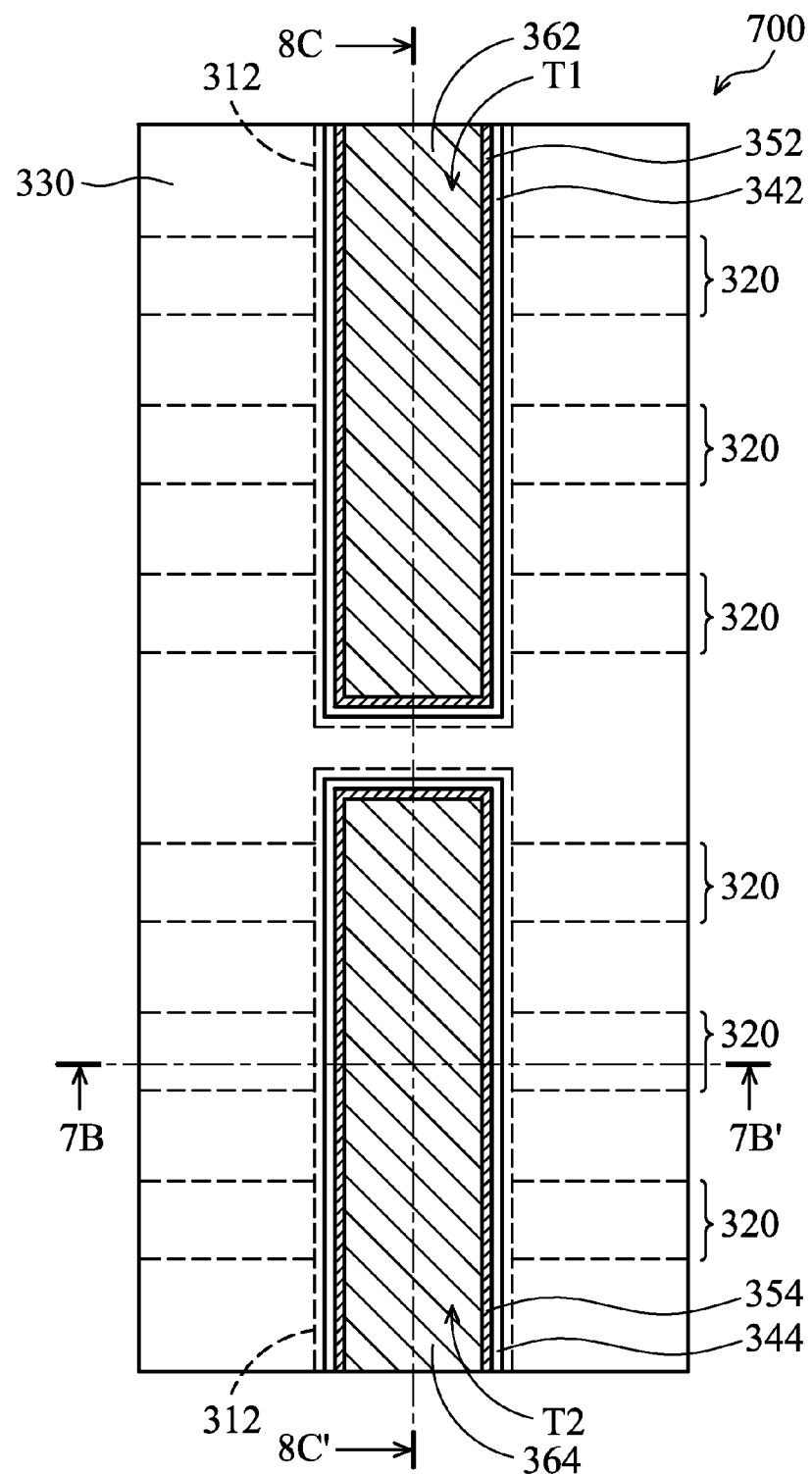
FIG. 8B is a top view of the semiconductor device structure of FIG. 7B, in accordance with some embodiments.
Figure 8C:
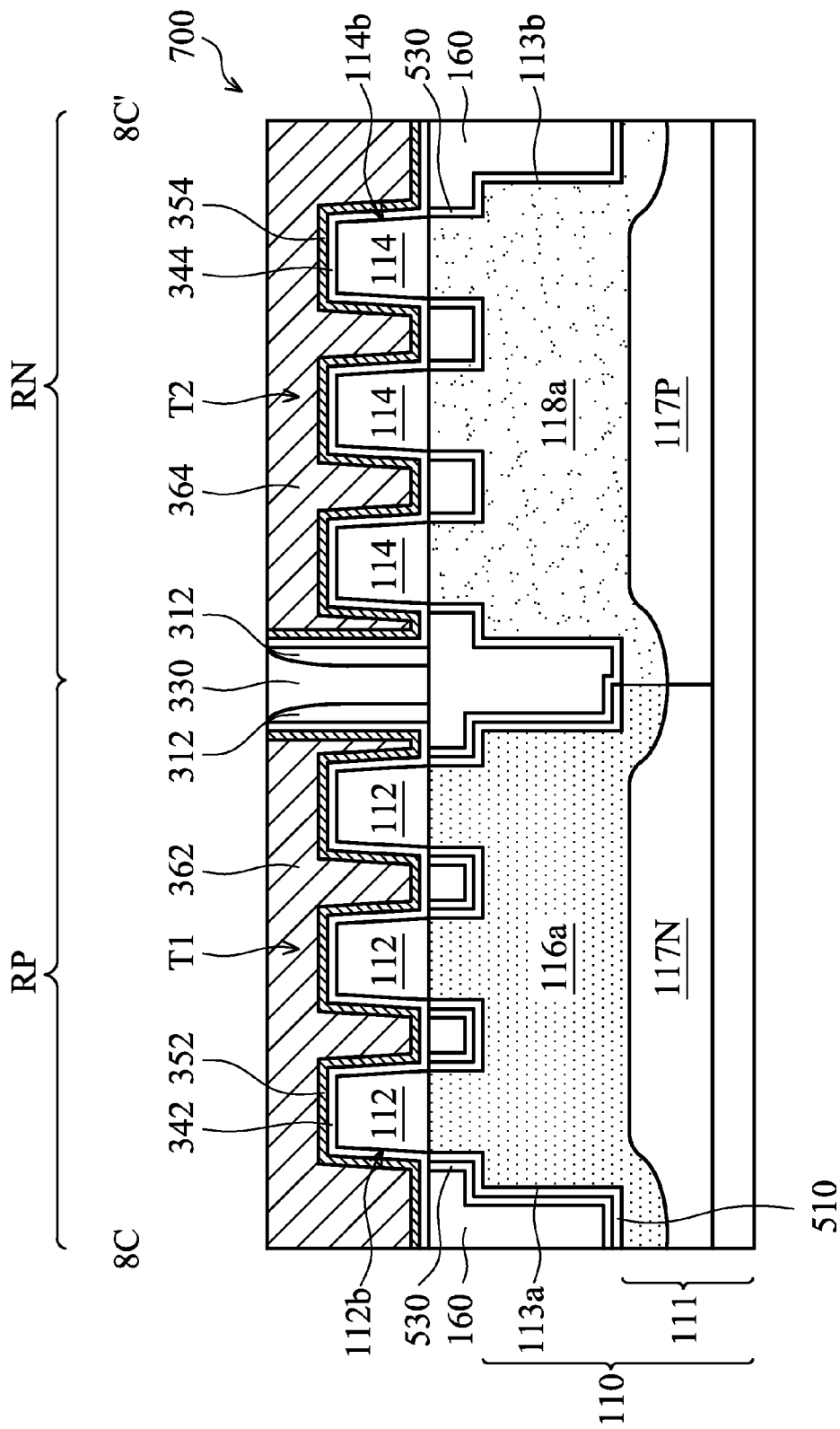
FIG. 8C is a cross-sectional view of the semiconductor device structure along a sectional line 8C-8C' in FIG. 8B, in accordance with some embodiments.

FIGS. 7A-7B are cross-sectional views of various stages of a process for forming a semiconductor device structure, in accordance with some embodiments. FIG. 8A is a perspective view of the semiconductor device structure 700 of FIG. 7B, in accordance with some embodiments. FIG. 8B is a top view of the semiconductor device structure 700 of FIG. 7B, in accordance with some embodiments. FIG. 7B is a cross-sectional view of the semiconductor device structure 700 along a sectional line 7B-7B' in FIG. 8B, in accordance with some embodiments. FIG. 8C is a cross-sectional view of the semiconductor device structure 700 along a sectional line 8C-8C' in FIG. 8B, in accordance with some embodiments.

As shown in FIGS. 7B, 8A, 8B, and 8C, after the stage of FIG. 7A, stages similar to (or the same as) the stages of FIGS. 3B-3H are performed and a semiconductor device structure 700 is formed, in accordance with some embodiments. The semiconductor device structure 700 is substantially similar to the semiconductor device structure 300 (as shown in FIGS. 3H and 4A-4C), except that the semiconductor device structure 700 further includes the diffusion layers 510 and 530, in accordance with some embodiments.

The diffusion layer 510 is positioned over the substrate 110 and lower portions of the sidewalls 112b of the fin structures 112, in accordance with some embodiments. The diffusion layer 510 surrounds the fin structures 112, in accordance with some embodiments. The diffusion layer 510 includes dopants, and the dopants of the diffusion layer 510 and the dopants of the merged doped region 116a are made of the same material (such as N-type materials), in accordance with some embodiments.

The diffusion layer 530 is positioned over the substrate 110 and lower portions of the sidewalls 114b of the fin structures 114, in accordance with some embodiments. The diffusion layer 530 surrounds the fin structures 114, in accordance with some embodiments. The diffusion layer 530 further surrounds the fin structures 112 and the diffusion layer 510, in accordance with some embodiments. The diffusion layer 530 includes dopants, and the dopants of the diffusion layer 530 and the dopants of the merged doped region 118a are made of the same material (such as P-type materials), in accordance with some embodiments.

In accordance with some embodiments, semiconductor device structures and methods for forming the same are provided. The methods (for forming the semiconductor device structure) form a mask layer over fin structures before the implantation process to protect channel regions of the fin structures from being doped and from damage during the implantation process. Therefore, the mask layer reduces the dopant concentration of the channel regions, which improves carrier mobility in the channel regions. Since the damage resulting from the implantation process is prevented or reduced, the current leakage is reduced.

In accordance with some embodiments, a semiconductor device structure is provided. The semiconductor device structure includes a substrate having a doped region in an upper portion of the substrate. The doped region is doped with first dopants of a first conduction type. The semiconductor device structure includes one fin structure over the substrate. A first dopant concentration of the doped region exposed by the fin structure is greater than a second dopant concentration of the doped region covered by the fin structure. The semiconductor device structure includes an isolation layer over the substrate and at two opposite sides of the fin structure. The semiconductor device structure includes a gate over the isolation layer and the fin structure.

In accordance with some embodiments, a semiconductor device structure is provided. The semiconductor device structure includes a substrate having a doped region in an upper portion of the substrate. The doped region is doped with first dopants of a first conduction type. The semiconductor device structure includes at least one fin structure over the substrate. The semiconductor device structure includes a first diffusion layer over the substrate and a first lower portion of a first sidewall of the fin structure. The first diffusion layer includes second dopants, and the second dopants and the first dopants are made of a same material. The semiconductor device structure includes an isolation layer over the first diffusion layer. The semiconductor device structure includes a gate over the isolation layer and the fin structure.

In accordance with some embodiments, a method for forming a semiconductor device structure is provided. The method includes providing a substrate, a fin structure, a dielectric layer, and a mask layer. The fin structure is over the substrate, the dielectric layer is over the fin structure, and the mask layer is over the dielectric layer. The method includes performing an implantation process on the substrate exposed by the mask layer to form doped regions in the substrate. The method includes forming an isolation layer over the substrate. The method includes removing the dielectric layer and the mask layer. The method includes performing an annealing process on the substrate to enlarge the doped regions so as to merge the doped regions into a merged doped region. The method includes form a gate over the fin structure and the isolation layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device structure, comprising:
   a substrate having a doped region in an upper portion of the substrate, wherein the doped region is doped with first dopants of a first conduction type;
   at least one fin structure over the substrate, wherein a first dopant concentration of the doped region exposed by the fin structure is greater than a second dopant concentration of the doped region covered by the fin structure;

an isolation layer over the substrate and surrounding the fin structure;

a gate over the isolation layer and the fin structure; and a source structure and a drain structure over the fin structure and at two opposite sides of the gate, wherein the source structure and the drain structure are doped with second dopants of a second conduction type, and the second conduction type is opposite to the first conduction type.

2. The semiconductor device structure as claimed in claim 1, wherein a third dopant concentration of the source structure or the drain structure is greater than the first dopant concentration.

3. The semiconductor device structure as claimed in claim 1, wherein the substrate has a doped well doped with third dopants, the doped well is under the doped region, the first dopants and the third dopants are made of a same material, and the doped well has a third dopant concentration, which is less than the second dopant concentration.

4. The semiconductor device structure as claimed in claim 1, wherein the substrate comprises a lower portion and the upper portion over the lower portion, and a first width of the upper portion is less than a second width of the lower portion.

5. The semiconductor device structure as claimed in claim 1, wherein the doped region is adjacent to a first upper surface and a sidewall of the upper portion.

6. The semiconductor device structure as claimed in claim 5, wherein the isolation layer covers the first upper surface and the sidewall of the upper portion and a second upper surface of the lower portion.

7. A semiconductor device structure, comprising:

a substrate having a doped region in an upper portion of the substrate, wherein the doped region is doped with first dopants of a first conduction type, the substrate comprises a lower portion, the upper portion is over the lower portion, and a first width of the upper portion is less than a second width of the lower portion;

at least one fin structure over the substrate;

a first diffusion layer over the substrate and a first lower portion of a first sidewall of the fin structure, wherein the first diffusion layer comprises second dopants, and the second dopants and the first dopants are made of a same material;

an isolation layer over the first diffusion layer; and a gate over the isolation layer and the fin structure.

8. The semiconductor device structure as claimed in claim 7, wherein a first dopant concentration of the doped region exposed by the fin structure is greater than a second dopant concentration of the doped region covered by the fin structure.

9. The semiconductor device structure as claimed in claim 7, wherein a first dopant concentration of the first diffusion layer is greater than a second dopant concentration of the doped region.

10. The semiconductor device structure as claimed in claim 7, wherein the first diffusion layer surrounds the fin structure.

11. The semiconductor device structure as claimed in claim 7, further comprising:

a second diffusion layer over the first diffusion layer, wherein the second diffusion layer comprises third dopants of a second conduction type, and the second conduction type is opposite to the first conduction type.

12. The semiconductor device structure as claimed in claim 7, wherein the first diffusion layer conformally covers the first sidewall of the fin structure, a first upper surface and a second sidewall of the upper portion, and a second upper surface of the lower portion.

13. The semiconductor device structure as claimed in claim 7, wherein the first diffusion layer is in direct contact with the substrate and the fin structure.

14. A method for forming a semiconductor device structure, comprising:

providing a substrate, a fin structure, a dielectric layer, and a mask layer, wherein the fin structure is over the substrate, the dielectric layer is over the fin structure, and the mask layer is over the dielectric layer;

performing an implantation process on the substrate exposed by the mask layer to form doped regions in the substrate;

forming an isolation layer over the substrate;

removing the dielectric layer and the mask layer;

performing an annealing process on the substrate to enlarge the doped regions so as to merge the doped regions into a merged doped region; and form a gate over the fin structure and the isolation layer.

15. The method for forming a semiconductor device structure as claimed in claim 14, further comprising:

after the implantation process and before the annealing process, removing a portion of the substrate to form a trench in the substrate, wherein the trench surrounds the fin structure and the doped regions.

16. The method for forming a semiconductor device structure as claimed in claim 14, wherein the mask layer comprises nitride.

17. The method for forming a semiconductor device structure as claimed in claim 14, wherein the doped regions are doped with first dopants of a first conduction type, and the method further comprises:

after the implantation process and before the formation of the isolation layer, forming a first diffusion layer over the substrate and a lower portion of a sidewall of the fin structure, wherein the first diffusion layer comprises second dopants, the first dopants and the second dopants are made of a same material, and the isolation layer is formed over the first diffusion layer.

18. The method for forming a semiconductor device structure as claimed in claim 17, further comprising:

after the formation of the first diffusion layer and before the formation of the isolation layer, forming a second diffusion layer over the first diffusion layer, wherein the second diffusion layer comprises third dopants of a second conduction type, the second conduction type is opposite to the first conduction type, and the isolation layer is formed over the second diffusion layer.

\* \* \* \* \*